(12) United States Patent  
Weingarten et al.

(10) Patent No.: US 8,627,188 B2  
(45) Date of Patent: Jan. 7, 2014

(54) FLASH MEMORY APPARATUS AND METHODS USING A PLURALITY OF DECODING STAGES INCLUDING OPTIONAL USE OF CONCATENATED BCH CODES AND/OR DESIGNATION OF "FIRST BELOW" CELLS

(71) Applicants: Hanan Weingarten, Herzelia (IL); Shmuel Levy, Qiryat Tivon (IL); Michael Katz, Haifa (IL)

(72) Inventors: Hanan Weingarten, Herzelia (IL); Shmuel Levy, Qiryat Tivon (IL); Michael Katz, Haifa (IL)

(73) Assignee: Densbits Technologies Ltd., Haifa (IL)

( * ) Notice: Subject to any disclaimer, the term of this patent is extended or adjusted under 35 U.S.C. 154(b) by 0 days.

(21) Appl. No.: 13/708,432

(22) Filed: Dec. 7, 2012

(65) Prior Publication Data

US 2013/0104005 A1   Apr. 25, 2013

Related U.S. Application Data

(63) Continuation of application No. 12/667,386, filed as application No. PCT/IL2008/001233 on Sep. 17, 2008, now Pat. No. 8,335,977.

(60) Provisional application No. 60/996,782, filed on Dec. 5, 2007, provisional application No. 61/006,120, filed on Dec. 19, 2007, provisional application No. 61/006,805, filed on Jan. 31, 2008, provisional application No. 61/064,853, filed on Mar. 31, 2008, provisional application No. 61/071,465, filed on Apr. 30, 2008, provisional application No. 61/071,464, filed on Apr. 30, 2008, provisional application No. 61/129,608, filed on Jul. 8, 2008.

(51) Int. Cl.  
*H03M 13/03* (2006.01)

(52) U.S. Cl.  
USPC .................................... 714/794; 365/185.09

(58) Field of Classification Search  
USPC .................................................. 365/185.09  
See application file for complete search history.

(56) References Cited

U.S. PATENT DOCUMENTS

| | | | |
|---|---|---|---|
| 4,463,375 A | 7/1984 | Macovski | |
| 4,584,686 A | 4/1986 | Fritze | |
| 4,589,084 A | 5/1986 | Fling et al. | |
| 4,866,716 A | 9/1989 | Weng | |
| 5,077,737 A | 12/1991 | Leger et al. | |
| 5,297,153 A | 3/1994 | Baggen et al. | |
| 5,657,332 A | 8/1997 | Auclair et al. | |

(Continued)

OTHER PUBLICATIONS

Search Report of PCT Patent Application WO 2009/118720 A3.

(Continued)

*Primary Examiner* — Yolanda L Wilson  
(74) *Attorney, Agent, or Firm* — Dentons US LLP

(57) ABSTRACT

A method for decoding a plurality of flash memory cells which are error correction-coded, the method may include: comparing physical values residing in the plurality of flash memory cells to a first set of decision thresholds thereby to provide a first item of comparison information for each of the plurality of cells; comparing physical values residing the plurality of flash memory cells to a second set of decision thresholds, thereby to provide a second item of comparison information for each of the plurality of cells, wherein neither of the first and second sets of decision thresholds is a subset of the other; and determining logical values for the plurality of flash memory cells by combining said first and second items of comparison information.

20 Claims, 34 Drawing Sheets

(56) References Cited

U.S. PATENT DOCUMENTS

| | | |
|---|---|---|
| 5,729,490 A | 3/1998 | Calligaro et al. |
| 5,793,774 A | 8/1998 | Usui et al. |
| 5,926,409 A | 7/1999 | Engh et al. |
| 5,956,268 A | 9/1999 | Lee |
| 5,982,659 A | 11/1999 | Irrinki et al. |
| 6,038,634 A | 3/2000 | Ji et al. |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,290,203 B2 | 10/2007 | Emma et al. |
| 7,292,365 B2 | 11/2007 | Knox |
| 7,301,928 B2 | 11/2007 | Nakabayashi et al. |
| 7,441,067 B2 | 10/2008 | Gorobets et al. |
| 7,466,575 B2 | 12/2008 | Shalvi et al. |
| 7,533,328 B2 | 5/2009 | Alrod et al. |
| 7,558,109 B2 * | 7/2009 | Brandman et al. ....... 365/185.03 |
| 7,593,263 B2 | 9/2009 | Sokolov et al. |
| 7,697,326 B2 | 4/2010 | Sommer et al. |
| 7,706,182 B2 | 4/2010 | Shalvi et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,904,783 B2 * | 3/2011 | Brandman et al. ............ 714/755 |
| 7,961,797 B1 | 6/2011 | Yang et al. |
| 8,020,073 B2 | 9/2011 | Emma et al. |
| 8,122,328 B2 | 2/2012 | Liu et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2003/0065876 A1 | 4/2003 | Lasser |
| 2003/0101404 A1 | 5/2003 | Zhao et al. |
| 2003/0105620 A1 | 6/2003 | Bowen |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0153722 A1 | 8/2004 | Lee |
| 2004/0153817 A1 | 8/2004 | Norman et al. |
| 2004/0181735 A1 | 9/2004 | Xin |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2006/0059406 A1 | 3/2006 | Micheloni et al. |
| 2006/0059409 A1 | 3/2006 | Lee |
| 2006/0064537 A1 | 3/2006 | Oshima |
| 2006/0101193 A1 | 5/2006 | Murin |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2008/0010581 A1 | 1/2008 | Alrod et al. |
| 2008/0028014 A1 | 1/2008 | Hilt et al. |
| 2008/0055989 A1 | 3/2008 | Lee et al. |
| 2008/0082897 A1 | 4/2008 | Brandman et al. |
| 2008/0092026 A1 * | 4/2008 | Brandman et al. ............ 714/793 |
| 2008/0104309 A1 | 5/2008 | Cheon et al. |
| 2008/0116509 A1 | 5/2008 | Harari et al. |
| 2008/0123420 A1 * | 5/2008 | Brandman et al. ....... 365/185.09 |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0148115 A1 | 6/2008 | Sokolov et al. |
| 2008/0151617 A1 * | 6/2008 | Alrod et al. ................ 365/185.2 |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0219050 A1 | 9/2008 | Shalvi et al. |
| 2008/0225599 A1 | 9/2008 | Chae |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0043951 A1 | 2/2009 | Shalvi et al. |

(56) References Cited

U.S. PATENT DOCUMENTS

| | | |
|---|---|---|
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0144600 A1 | 6/2009 | Perlmutter et al. |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2010/0005270 A1 | 1/2010 | Jiang |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0293321 A1 | 11/2010 | Weingarten |
| 2011/0051521 A1 | 3/2011 | Levy et al. |
| 2011/0055461 A1 | 3/2011 | Steiner et al. |
| 2011/0096612 A1 | 4/2011 | Steiner et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |

OTHER PUBLICATIONS

Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-72 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips. com), Oct. 2005.
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI—Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1, Feb. 2005.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, Data retention prediction for modern floating gate non-volatile memories, Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26, Dec. 2007.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.

(56) References Cited

OTHER PUBLICATIONS

Daneshbeh, "Bit Serial Systolic Architectures for Multiplicative Inversion and Division over GF (2)", A thesis presented to the University of Waterloo, Ontario, Canada, 2005, pp. 1-118.

Chen, Formulas for the solutions of Quadratic Equations over GF (2), IEEE Trans. Inform. Theory, vol. IT-28, No. 5, Sep. 1982, pp. 792-794.

Berlekamp et al., "On the Solution of Algebraic Equations over Finite Fields", Inform. Cont. 10, Oct. 1967, pp. 553-564.

* cited by examiner

|    | Threshold | Label |
|----|-----------|-------|
| 1  | 0.2       | 011   |
| 2  | 0.3       | 010   |
| 3  | 0.4       | 001   |
| 4  | 0.5       | 000   |
| 5  | 0.6       | 101   |
| 6  | 0.7       | 110   |
| 7  | 0.8       | 111   |
| 8  | 2.2       | 111   |
| 9  | 2.3       | 110   |
| 10 | 2.4       | 101   |
| 11 | 2.5       | 000   |
| 12 | 2.6       | 001   |
| 13 | 2.7       | 010   |
| 14 | 2.8       | 011   |
| 15 | 4.2       | 011   |
| 16 | 4.3       | 010   |
| 17 | 4.4       | 001   |
| 18 | 4.5       | 000   |
| 19 | 4.6       | 101   |
| 20 | 4.7       | 110   |
| 21 | 4.8       | 111   |
| 22 | 6.2       | 111   |
| 23 | 6.3       | 110   |
| 24 | 6.4       | 101   |
| 25 | 6.5       | 000   |
| 26 | 6.6       | 001   |
| 27 | 6.7       | 010   |
| 28 | 6.8       | 011   |
| 29 |           | 011   |

Figure 17

| Bit Index | Bit | Detected Bits | Reliability Score | Associated Syndrome |
|---|---|---|---|---|
| 1 | 1 | 1 | 50 | b10010 |
| 2 | 1 | 1 | 50 | b01001 |
| 3 | 1 | 1 | 50 | b10110 |
| 4 | 1 | 1 | 20 | b01011 |
| 5 | 1 | 1 | 50 | b10111 |
| 6 | 0 | 0 | 50 | b11001 |
| 7 | 0 | 0 | 50 | b11110 |
| 8 | 0 | 0 | 50 | b01111 |
| 9 | 1 | 1 | 50 | b10101 |
| 10 | 0 | 1 | 2 | b11000 |
| 11 | 0 | 0 | 50 | b01100 |
| 12 | 0 | 0 | 50 | b00110 |
| 13 | 0 | 0 | 50 | b00011 |
| 14 | 1 | 1 | 50 | b10011 |
| 15 | 1 | 0 | 1 | b11011 |
| 16 | 1 | 1 | 50 | b11111 |
| 17 | 1 | 1 | 50 | b11101 |
| 18 | 1 | 1 | 50 | b11100 |
| 19 | 1 | 1 | 50 | b01110 |
| 20 | 1 | 1 | 30 | b00111 |
| 21 | 1 | 1 | 50 | b10001 |
| 22 | 1 | 1 | 50 | b11010 |
| 23 | 0 | 0 | 50 | b01101 |
| 24 | 0 | 0 | 40 | b10100 |
| 25 | 0 | 0 | 50 | b01010 |
| 26 | 1 | 1 | 50 | b00101 |
| 27 | 1 | 1 | 50 | b10000 |
| 28 | 0 | 0 | 50 | b01000 |
| 29 | 1 | 1 | 50 | b00100 |
| 30 | 0 | 0 | 50 | b00010 |
| 31 | 1 | 1 | 50 | b00001 |

Figure 27

| Sorted Associated Syndromes | Respective Indexes |
|---|---|
| b00001 | 31 |
| b00010 | 30 |
| b00011 | 13 |
| b00100 | 29 |
| b00101 | 26 |
| b00110 | 12 |
| b00111 | 20 |
| b01000 | 28 |
| b01001 | 2 |
| b01010 | 25 |
| b01011 | 4 |
| b01100 | 11 |
| b01101 | 23 |
| b01110 | 19 |
| b01111 | 8 |
| b10000 | 27 |
| b10001 | 21 |
| b10010 | 1 |
| b10011 | 14 |
| b10100 | 24 |
| b10101 | 9 |
| b10110 | 3 |
| b10111 | 5 |
| b11000 | 10 |
| b11001 | 6 |
| b11010 | 22 |
| b11011 | 15 |
| b11100 | 18 |
| b11101 | 17 |
| b11110 | 7 |
| b11111 | 16 |

Figure 28 ns

FLASH MEMORY APPARATUS AND METHODS USING A PLURALITY OF DECODING STAGES INCLUDING OPTIONAL USE OF CONCATENATED BCH CODES AND/OR DESIGNATION OF "FIRST BELOW" CELLS

CROSS-REFERENCE TO CO PENDING RELATED APPLICATIONS

This application claims priority to U.S. Nonprovisional application Ser. No. 12/667,386, filed on Dec. 31, 2009 and entitled "Flash Memory Apparatus and Methods Using a Plurality of Decoding Stages Including Optional Use of Concatenated BCH Codes And/Or Designation of 'First Below' Cells", which in turn claims priority to a PCT International Application No. PCT/IL2008/001233, with International Filing Date of Sep. 17, 2008, published on Jun. 11, 2009 as International Publication No. WO 2009/072103, which in turn claims priority from U.S. Provisional Patent Application No. 61/006,120, filed Dec. 19, 2007 and entitled "Systems and Methods for Coping with Multi Stage Decoding in Flash Devices", U.S. Provisional Patent Application No. 61/071,464, filed Apr. 30, 2008 and entitled "A Decoder Operative to Effect A Plurality of Decoding Stages Upon Flash Memory Data and Methods Useful in Conjunction Therewith", U.S. Provisional Patent Application No. 60/996,782, filed Dec. 5, 2007 and entitled "Systems and Methods for Using a Training Sequence in Flash Memory", U.S. Provisional Patent Application No. 61/064,853, filed Mar. 31, 2008 and entitled "Flash Memory Device with Physical Cell Value Deterioration Accommodation and Methods Useful in Conjunction Therewith", U.S. Provisional Patent Application No. 61/006,805, filed Jan. 31, 2008 and entitled "A Method for Extending the Life of Flash Devices", U.S. Provisional Patent Application No. 61/071,465, filed Apr. 30, 2008 and entitled "Systems and Methods for Temporarily Retiring Memory Portions" and US Provisional Patent Application No. 61/129,608, filed Jul. 8, 2008 and entitled "A Method for Acquiring and Tracking Detection Thresholds in Flash Devices", all of which are incorporated herein by reference in their entirety.

Other co-pending applications include: U.S. Provisional Application No. 60/960,207, filed Sep. 20, 2007 and entitled "Systems and Methods for Coupling Detection in Flash Memory", U.S. Provisional Application No. 61/071,467, filed Apr. 30, 2008 and entitled "Improved Systems and Methods for Determining Logical Values of Coupled Flash Memory Cells", U.S. Provisional Application No. 60/960,943, filed Oct. 22, 2007 and entitled "Systems and methods to reduce errors in Solid State Disks and Large Flash Devices" and U.S. Provisional Application No. 61/071,469, filed Apr. 30, 2008 and entitled "Systems and Methods for Averaging Error Rates in Non-Volatile Devices and Storage Systems", U.S. Provisional Application No. 60/996,027, filed Oct. 25, 2007 and entitled "Systems and Methods for Coping with Variable Bit Error Rates in Flash Devices", U.S. Provisional Application No. 61/071,466, filed Apr. 30, 2008 and entitled "Systems and Methods for Multiple Coding Rates in Flash Devices", U.S. Provisional Application No. 61/006,385, filed Jan. 10, 2008 and entitled "A System for Error Correction Encoder and Decoder Using the Lee Metric and Adapted to Work on Multi-Level Physical Media", U.S. Provisional Application No. 61/064,995, filed Apr. 8, 2008 and entitled "Systems and Methods for Error Correction and Decoding on Multi-Level Physical Media", U.S. Provisional Application No. 60/996,948, filed Dec. 12, 2007 and entitled "Low Power BCH/RS Decoding: a Low Power Chien-Search Implementation", U.S. Provisional Application No. 61/071,487, filed May 1, 2008 and entitled "Chien-Search System Employing a Clock-Gating Scheme to Save Power for Error Correction Decoder and other Applications", U.S. Provisional Application No. 61/071,468, filed Apr. 30, 2008 and entitled "A Low Power Chien-Search Based BCH/RS Recoding System for Flash Memory, Mobile Communications Devices and Other Applications", U.S. Provisional Application No. 61/006,806, filed Jan. 31, 2008 and entitled "Systems and Methods for using a Erasure Coding in Flash memory", U.S. Provisional Application No. 61/071,486, filed May 1, 2008 and entitled "Systems and Methods for Handling Immediate Data Errors in Flash Memory", U.S. Provisional Application No. 61/006,078, filed Dec. 18, 2007 and entitled "Systems and Methods for Multi Rate Coding in Multi Level Flash Devices", U.S. Provisional Application No. 61/064,923, filed Apr. 30, 2008 and entitled "Apparatus For Coding At A Plurality Of Rates In Multi-Level Flash Memory Systems, And Methods Useful In Conjunction Therewith", U.S. Provisional Application No. 61/064,760, filed Mar. 25, 2008 and entitled "Hardware efficient implementation of rounding in fixed-point arithmetic", U.S. Provisional Application No. 61/071,404, filed Apr. 28, 2008 and entitled "Apparatus and Methods for Hardware-Efficient Unbiased Rounding", U.S. Provisional Application No. 61/136,234, filed Aug. 20, 2008 and entitled "A Method Of Reprogramming A Non-Volatile Memory Device Without Performing An Erase Operation", U.S. Provisional Application No. 61/129,414, filed Jun. 25, 2008 and entitled "Improved Programming Speed in Flash Devices Using Adaptive Programming", and several other co-pending patent applications being filed concurrently (same day).

FIELD OF THE INVENTION

The present invention relates generally to flash memory and more particularly to encoding and decoding data stored in a flash memory device.

BACKGROUND OF THE INVENTION

The state of the art is believed to be represented by the following references inter alia:

[1] "Interleaving policies for flash memory", United States Published Patent Application 20070168625

[2] "Minimization of FG-FG coupling in flash memory", U.S. Pat. No. 6,996,004

[3] CharnKeitKong, P. Yamaguchi, K. Imai, H. "New Constructions of k/(k+1) Rate-Variable Punctured Convolutional Codes", Proceedings. 1993 IEEE International Symposium on Information Theory, January 1993, page(s): 138-138

[4] Construction of Rate (n−1)/n Punctured Convolutional Code with Minimum Required SNR Criterion, Pil J. Lee, IEEE Trans. On Comm. Vol. 36, NO. 10, October 1988

[5] "Introduction to Coding Theory", Ron M. Roth, Cambridge University Press, 2006

[6] "Principles of Digital Communication and Coding", A. J. Viterbi and J. K. Omura, McGraw-Hill 1979

[7] "Low Density Parity Check Codes", Robert G. Gallager, 1963?, Ph.D. Thesis, Cambridge, Mass.

[8] "Modern Coding Theory", Richardson, T.; Urbanke, R., Cambridge University Press, 2005.

[9] "Bit-Interleaved Coded Modulation", Giuseppe Caire, Giorgio Taricco, and Ezio Biglieri, IEEE Transactions On Information Theory, Vol. 44, No. 3, May 1998

[10] R. E. Blahut, Theory and Practice of Error Control Codes. Reading, Mass.: Addison-Wesley, 1983.

[11] G. D. Formey Jr, "Generalized minimum distance decoding," IEEE Trans. Inf. Theory, vol. IT-12, pp. 125-131, April 1966.
[12] D. Chase. "A class of algorithms for decoding block codes with channel measurement information," IEEE Trans. Inform. Theory, vol. IT-I 8, pp. 170-182, January 1972.
[13] R. Koetter, A. Vardy, "Algebraic Soft-Decision Decoding of Reed-Solomon Codes", IEEE Transactions On Information Theory, Vol. 49, No. 11, November 2003
[14] B. Hassibi and B. M. Hochwald, "How much training is needed in a multiple-antenna wireless link?", IEEE Transactions on Information Theory, vol. 49, no. 10, April 2003, pages 951-964.
[15] U.S. Pat. Nos. 5,729,490 to Calligaro et al; 5,926,409 to Engh et al, 6,952,365 to Gonzalez et al, and 7,068,539 and 7,317,364, both to Guterman et al.
[16] *Algebraic Codes for Data Transmission*, Richard E. Blahut, distributed by Amazon whose website is available at amazon.com.
[17] "Efficient Maximum Likelihood Decoding of Linear Block Codes Using a Trellis", Jack K. Wolf, IEEE Transactions on Information Theory, Vol. IT-24, No. 1, January 1978
[18] "A Class of Algorithms for Decoding Block Codes With Channel Measurement Information", David Chase, IEEE Transactions on Information Theory, Vol. IT-18, No. 1, January 1972

Conventional flash memory technology is described in the following publications inter alia:

Paulo Cappelletti, Clara Golla, Piero Olivo, Enrico Zanoni, "Flash Memories", Kluwer Academic Publishers, 1999

G. Campardo, R. Micheloni, D. Novosel, "CLSI-Design of Non-Volatile Memories", Springer Berlin Heidelberg New York, 2005

The disclosures of all publications and patent documents mentioned in the specification, and of the publications and patent documents cited therein directly or indirectly, are hereby incorporated by reference.

SUMMARY OF THE INVENTION

The following terms may be construed either in accordance with any definition thereof appearing in the prior art literature or in accordance with the specification, or as follows:

Bit error rate (BER)=a parameter that a flash memory device manufacturer commits to vis a vis its customers, expressing the maximum proportion of wrongly read bits (wrongly read bits/total number of bits) that users of the flash memory device need to expect at any time during the stipulated lifetime of the flash memory device e.g. 10 years.

Block=a set of flash memory device cells which must, due to physical limitations of the flash memory device, be erased together. Also termed erase sector, erase block.

Cell: A component of flash memory that stores one bit of information (in single-level cell devices) or n bits of information (in a multi-level device having 2 exp n levels). Typically, each cell comprises a floating-gate transistor. n may or may not be an integer. "Multi-level" means that the physical levels in the cell are, to an acceptable level of certainty, statistically partitionable into multiple distinguishable regions, plus a region corresponding to zero, such that digital values each comprising multiple bits can be represented by the cell. In contrast, in single-level cells, the physical levels in the cell are assumed to be statistically partitionable into only two regions, one corresponding to zero and one other, non-zero region, such that only one bit can be represented by a single-level cell.

Charge level: the measured voltage of a cell which reflects its electric charge.

Cycling: Repeatedly writing new data into flash memory cells and repeatedly erasing the cells between each two writing operations.

Decision regions: Regions extending between adjacent decision levels, e.g. if decision levels are 0, 2 and 4 volts respectively, the decision regions are under 0 V, 0 V-2 V, 2V-4 V, and over 4 V.

Demapping: basic cell-level reading function in which a digital n-tuple originally received from an outside application is derived from a physical value representing a physical state in the cell having a predetermined correspondence to the digital n-tuple.

Digital value or "logical value": n-tuple of bits represented by a cell in flash memory capable of generating 2 exp n distinguishable levels of a typically continuous physical value such as charge, where n may or may not be an integer.

Erase cycle: The relatively slow process of erasing a block of cells (erase sector), each block typically comprising more than one page, or, in certain non-flash memory devices, of erasing a single cell or the duration of so doing. An advantage of erasing cells collectively in blocks as in flash memory, rather than individually, is enhanced programming speed: Many cells and typically even many pages of cells are erased in a single erase cycle.

Erase-write cycle: The process of erasing a block of cells (erase sector), each block typically comprising a plurality of pages, and subsequently writing new data into at least some of them. The terms "program" and "write" are used herein generally interchangeably.

Flash memory: Non-volatile computer memory including cells that are erased block by block, each block typically comprising more than one page, but are written into and read from, page by page. Includes NOR-type flash memory, NAND-type flash memory, and PRAM, e.g. Samsung PRAM, inter alia, and flash memory devices with any suitable number of levels per cell, such as but not limited to 2, 4, or 8.

Mapping: basic cell-level writing function in which incoming digital n-tuple is mapped to a program level by inducing a program level in the cell, having a predetermined correspondence to the incoming logical value.

Page=A portion, typically 512 or 2048 or 4096 bytes in size, of a flash memory e.g. a NAND or NOR flash memory device. Writing can be performed page by page, as opposed to erasing which can be performed only erase sector by erase sector. A few bytes, typically 16-32 for every 512 data bytes are associated with each page (typically 16, 64 or 128 per page), for storage of error correction information. A typical block may include 32 512-byte pages or 64 2048-byte pages.

Present level, Charge level: The amount of charge in the cell. The Amount of charge currently existing in a cell, at the present time, as opposed to "program level", the amount of charge originally induced in the cell (i.e. at the end of programming).

Program: same as "write".

Program level (programmed level, programming level): amount of charge originally induced in a cell to represent a given logical value, as opposed to "present level".

Reprogrammability (Np): An aspect of flash memory quality. This is typically operationalized by a reprogrammability parameter, also termed herein "Np", denoting the number of times that a flash memory can be re-programmed (number of erase-write cycles that the device can withstand) before the level of errors is so high as to make an unacceptably high proportion of those errors irrecoverable given a predetermined amount of memory devoted to redundancy. Typically recoverability is investigated following a conventional aging simulation process which simulates or approximates the data degradation effect that a predetermined time period e.g. a 10 year period has on the flash memory device, in an attempt to accommodate for a period of up to 10 years between writing of data in flash memory and reading of the data therefrom.

Resolution: Number of levels in each cell, which in turn determines the number of bits the cell can store; typically a cell with $2^n$ levels stores n bits. Low resolution (partitioning the window, W, of physical values a cell can assume into a small rather than large number of levels per cell) provides high reliability.

Retention: of original physical levels induced in the cells; retention is typically below 100% resulting in deterioration of original physical levels into present levels.

Retention time: The amount of time that data has been stored in a flash device, typically without, or substantially without, voltage having been supplied to the flash device i.e. the time which elapses between programming of a page and reading of the same page.

Symbol: Logical value

Threshold level, VT (threshold voltage): the voltage (e.g.) against which the charge level of a cell (e.g. the flash cell's gate voltage, at which the gate begins to conduct) is measured. For example, a cell may be said to store a particular digital n-tuple D if the charge level or other physical level of the cell falls between two threshold values T.

Soft decoding: A decoding process of a physical value yielding not only a logical value, from among various possible logical values, which the physical value is assumed to represent, but also a confidence indicator indicative of the degree of confidence that the correct logical value has been selected, from among the various possible logical values, as that which the physical value represents.

Hard decoding: A decoding process of a physical value yielding only a logical value, from among various possible logical values, which the physical value is assumed to represent, without a confidence indicator (in contrast to soft decoding).

Today's Flash memory devices store information with high density on Flash cells with ever smaller dimensions. In addition, Multi-Level Cells (MLCs) store several bits per cell by setting the amount of charge in the cell. The amount of charge is then quantified by a detector, e.g. by measuring a threshold voltage of the transistor gate denoted by VT. Due to inaccuracies during the programming procedure and charge loss due to time and temperature (also known as retention), the measured levels during a Read operation suffer from detection errors. The small dimensions of the Flash cells result in cells that can store very small amounts of charge, enhancing the effects of inaccuracies due to programming and retention. Thus, new single level cells (SLCs) and MLC devices have significantly increased bit error rate (BER), decreasing the reliability of the device.

Flash devices are organized into (physical) pages. Each page typically contains a section allocated for data (512 bytes-4 Kbytes) and a small amount of bytes (16-32 bytes for every 512 data bytes) containing redundancy and back pointers. The redundancy bytes are used to store error correcting information, for correcting errors which may have occurred during the page Read. Each Read and Program operation is performed on an entire page. A number of pages are grouped together to form an Erase Block (EB). A page cannot be erased unless the entire EB which contains it is erased.

One measure of a Flash device quality is the number of times (Np) it may be reprogrammed and the period that the device can store data before irrecoverable errors occur (usually 10 years). The higher the number of program-erase cycles, the higher the BER. Thus, today's MLC devices can perform around Np=1000 cycles for 10 years retention before the allocation of 16-32 bytes of redundancy per 512 bytes of data bytes becomes insufficient to correct errors. SLC devices usually perform better but obtain a much lower density and hence their prices are much higher. Note that following Np program-erase cycles the device is still operational but the BER is higher. Furthermore, in many devices (e.g. NROM Flash devices), this behavior is predictable and it can be shown that the number of redundancy bytes used to correct these errors does not jump rapidly.

During a Read operation, most devices decide on the programmed level of the Flash cell by comparing the measured physical level (also termed "cell's charge level") to a number of threshold levels which divide the range of voltage values into bins. The programmed level is then defined according to the bin in which the cell's charge level lies. It is well known in the literature, e.g. as described in "Principles of Digital Communication and Coding", A. J. Viterbi and J. K. Omura, McGraw-Hill 1979, that in the presence of coded information, reliability may be significantly improved if more refined, i.e. more accurate information on the cell's charge level is extracted. For instance, if the charge level lies near to an edge of the bin, the measurement is less reliable and is more likely to be a result of an error, e.g. due to retention. More refined information is equivalent to dividing the range of voltage values to more bins than the number of possible programmed levels. Information from this more refined binning, in which the number of bins exceeds the number of programmed levels, is known as soft information. Information obtained from a binning process employing a number of bins which is equal to the number of program levels is referred to as hard information.

Conventional extraction of soft information adversely affects device performance. For example, a read operation which divides the range of voltage values into 16 bins may take approximately twice as long as dividing the same range into only 8 levels.

Certain embodiments of the present invention seek to provide multi stage decoding with different read accuracies at different stages, so as to boost the average performance while enjoying the benefits of soft information. According to need, at each stage more accurate information, or even same-accuracy additional information, on the threshold voltage value of each cell is extracted and the decoding method is adapted to process the more accurate information.

According to certain embodiments of the present invention, in the first stage stored bits are read in hard decision mode. This process maintains the high performance of hard decision output but has degraded reliability. If the codeword is found to be decodable or some other criterion is passed, the codeword is declared to be successfully decoded and no further decoding occurs. Otherwise, a second stage of reading is performed, typically with higher precision (soft), and decoding is performed with the soft information. This increases reliability in that more errors are corrected per page but degrades the read time and power performance.

According to one embodiment of the present invention, termed herein the "nearly-hard" Strategy, the average performance, even after cycling and retention, is maintained close to that of hard decisions while gaining some of the benefits of soft decision decoding. In general this is effected by ensuring that following retention and cycling, only a small percentage (say 1%) of the codewords (pages) are deciphered using soft decoding. This in turn ensures that hard decision decoding will decipher most pages correctly such that the added time used to read soft decision outputs for those rare pages which were not deciphered correctly at the hard stage, increases the average decoding time and power consumption only slightly. An example of the "nearly-hard" Strategy is described below with reference to FIGS. 8 and 9.

According to another embodiment of the present invention, termed herein the "maintain-performance-when-young, reliability-when-old" Strategy, a good Read performance is provided during the device's "youth" (before much cycling has been performed and before the device has undergone much retention) and good reliability is provided toward the device's end of life (following cycling and retention), at the expense of the performance. Although this strategy sacrifices performance at the end of the device's life, reliability is typically better than that provided by the previous embodiment. An example of the "maintain-performance-when-young, reliability-when-old" Strategy is described below with reference to FIG. 10.

Examples of codes which may be decoded using hard and soft outputs in accordance with certain embodiments of the present invention are described herein and are not intended to be limiting.

There is thus provided, in accordance with certain embodiments of the present invention, a method for decoding a plurality of flash memory cells which are error-correction-coded as a unit, the method comprising providing a hard-decoding success indication indicating whether or not hard-decoding is at least likely to be successful; and soft-decoding the plurality of flash memory cells at a first resolution only if the hard-decoding success indication indicates that the hard-decoding is not at least likely to be successful.

Further in accordance with at least one embodiment of the present invention, the method also comprises hard-decoding the plurality of flash memory cells before the providing; the hard-decoding success indication indicates whether or not the hard-decoding was successful; and the soft-decoding is performed only if the hard-decoding success indication indicates that the hard-decoding was not successful.

Still further in accordance with at least one embodiment of the present invention, the method comprises using at least one of the following error correction codes to encode the plurality of flash memory cells: convolutional coding; LDPC; BCH; and Reed-Solomon.

Further in accordance with at least one embodiment of the present invention, the method also comprises using an error correction code to encode the plurality of flash memory cells such that the plurality of flash memory cells is partitioned into a first subset of cells storing data and a second, smaller subset of cells storing redundancy; and selecting a size of the smaller subset large enough to ensure that an acceptable proportion of units undergoing soft decoding from among a total number of units decoded, is not exceeded, large enough to ensure that an acceptable rate of failure to decode is not exceeded and smaller than is required to ensure the same acceptable rate of failure to hard-decode.

Further in accordance with at least one embodiment of the present invention, the method also comprises providing a soft-decoding success indication indicating whether or not the soft-decoding was successful; and soft-decoding the plurality of flash memory cells at a second resolution finer than the first resolution only if the soft-decoding success indication indicates that the soft-decoding was not successful.

Still further in accordance with at least one embodiment of the present invention, the hard-decoding success indication comprises an a priori indication of whether or not hard-decoding, yet to be performed, is at least likely to be successful.

Additionally in accordance with at least one embodiment of the present invention, the a priori indication is based on at least one indication of the quality of the flash memory cells.

Further in accordance with at least one embodiment of the present invention, the indication of the quality of the flash memory cells is based at least partly on the number of program/erase cycles the flash memory cells have undergone.

Still further in accordance with at least one embodiment of the present invention, the indication of the quality of the flash memory cells is based at least partly on the amount of time the flash memory cells have spent in a state of retention.

Additionally in accordance with at least one embodiment of the present invention, the hard-decoding comprises a first iteration of an LDPC decoding procedure yielding a bit error rate parameter and wherein the hard-decoding success indication is based on the bit error rate parameter.

Also provided, in accordance with at least one embodiment of the present invention, is a method for decoding a plurality of flash memory cells which are error-correction-coded as a unit, the method comprising comparing physical values residing in the plurality of flash memory cells to a first set of decision thresholds thereby to provide a first item of comparison information for each of the plurality of cells; comparing physical values residing in the plurality of flash memory cells to a second set of decision thresholds, thereby to provide a second item of comparison information for each of the plurality of cells, wherein neither of the first and second sets of decision thresholds is a subset of the other; and determining logical values for the plurality of flash memory cells by combining the first and second items of comparison information.

Further in accordance with at least one embodiment of the present invention, the first and second sets of decision thresholds are disjoint.

Still further in accordance with at least one embodiment of the present invention, the indication of the quality of the flash memory cells is based at least partly on a comparison of at least a statistic representing the current state of a sample of the plurality of flash memory cells with a reliably stored indication of a previous state of the sample.

Additionally in accordance with at least one embodiment of the present invention, the statistic comprises a mean of the current physical values of the sample and the indication of a previous state comprises a mean of previous physical values of the sample.

Further in accordance with at least one embodiment of the present invention, the statistic comprises an indication of the distribution width of the current physical values of the sample and the indication of a previous state comprises an indication of the distribution width of previous physical values of the sample.

Additionally in accordance with at least one embodiment of the present invention, the combining comprises identifying a pair of decision thresholds closest to the physical values from among a set of decision thresholds comprising a union of the first and second sets of decision thresholds.

Also provided, in accordance with at least one embodiment of the present invention, is an apparatus for decoding a plurality of flash memory cells which are error-correction-coded as a unit, the apparatus comprising a first comparison unit comparing physical values residing in the plurality of flash memory cells to a first set of decision thresholds thereby to provide a first item of comparison information for each of the plurality of cells; a second comparison unit comparing physical values residing in the plurality of flash memory cells to a second set of decision thresholds, thereby to provide a second item of comparison information for each of the plurality of cells, wherein neither of the first and second sets of decision thresholds is a subset of the other; and a logical value generator determining logical values for the plurality of flash memory cells by combining the first and second items of comparison information.

Also provided, in accordance with yet a further embodiment of the present invention is an apparatus for decoding a plurality of flash memory cells which are error-correction-coded as a unit, the apparatus comprising a success indicator providing a hard-decoding success indication indicating whether or not hard-decoding is at least likely to be successful; and a conditionally operated soft decoder operative to soft-decode the plurality of flash memory cells at a first resolution only if the hard-decoding success indication indicates that the hard-decoding is not at least likely to be successful.

Further in accordance with at least one embodiment of the present invention, the method also comprises decoding the plurality of flash memory cells at least once in addition to the soft-decoding, wherein the soft-decoding comprises comparing physical values residing in the plurality of flash memory cells to a first set of decision thresholds thereby to provide a first item of comparison information for each of the plurality of cells, and wherein the decoding at least once in addition comprises comparing physical values residing in the plurality of flash memory cells to a second set of decision thresholds, thereby to provide a second item of comparison information for each of the plurality of cells, wherein neither of the first and second sets of decision thresholds is a subset of the other; and wherein the method also comprises determining logical values for the plurality of flash memory cells by combining the first and second items of comparison information.

Still further in accordance with at least one embodiment of the present invention, the soft-coding comprises a plurality of decoding stages including at least one pair of adjacent stages including a first stage and a second stage, the method also comprising determining thresholds of the second stage based on at least one result of the first stage.

Also provided, in accordance with certain embodiments of the present invention, is a method for reading Flash memory apparatus having c cells using an increasing sequence of B−1 thresholds defining a sequence of B bins, the method comprising providing at least one buffer operative to store information indicating whether or not each individual cell from among the c cells is "done" and indicating an individual one of the B bins which is associated with each individual cell from among the c cells; and, for each individual threshold, in order, in the increasing sequence of B−1 thresholds, comparing all cells in a c-cell flash memory physical page to the individual threshold in the sequence thereby to obtain an "above" or "below" value for each cell; and for each "first below" cell, defined as a cell which yields a "below" value and is "not done", modifying the at least one buffer to indicate that the "first below" cell is "done" and to indicate that the "first below" cell is associated with a bin in the sequence of bins which is just below the individual threshold.

The flash memory apparatus may for example include a physical page or more typically a first multiplicity of such, each physical page including a second multiplicity of cells such as 32,000 cells. Typically, the at least one buffer is not modified for cells which are "done", or for cells which are "not done" but found to be above a current threshold.

Further in accordance with certain embodiments of the present invention, the at least one buffer comprises a label buffer array storing c labels, each label indicating an individual state from among B+1 states which is associated with an individual cell from among the c cells, the B+1 states including B states indicating that the individual cell is "done" and respectively indicating an individual one of the B bins which is associated with the individual cell and a (B+1)th state indicating that the individual cell is "not done", the label buffer array being initialized to the (B+1)th state.

Typically the label buffer array includes $\log_2(B)$ label buffers each of which stores a single bit of the total ID of an individual bin.

Still further in accordance with certain embodiments of the present invention, the modifying comprises, for each "first below" cell which yields a "below" value and has a "not done" value in the "done" buffer, modifying the "done" buffer to indicate that the "first below" cell is "done" and modifying the label buffer array to indicate that the "first below" cell is associated with a bin in the sequence of bins which is just below the individual threshold.

Further in accordance with certain embodiments of the present invention, the method also comprises modifying the label buffer array to indicate that all remaining cells, if any, therewithin, are associated with the last bin in the sequence of bins, the remaining cells being defined as cells which do not yield a "below" value when the last threshold in the increasing sequence of B−1 thresholds is used in the comparing.

Further in accordance with certain embodiments of the present invention, the at least one buffer comprises a "done" buffer storing c "done" bits indicating whether an individual cell c is "done" or "not done", the buffer initially being set entirely to "not done".

Still further in accordance with certain embodiments of the present invention, the at least one buffer also comprises a label buffer array storing c N-bit labels, each label indicating an individual one of the B bins which is associated with an individual cell from among the c cells, the label buffer array being initialized to values which differ from all labels of the first B−1 bins in the sequence of bins.

Additionally in accordance with certain embodiments of the present invention, the modifying comprises, for each "first below" cell which yields a "below" value and has a "not done" value in the "done" buffer, modifying the "done" buffer to indicate that the "first below" cell is "done"; and modifying the label buffer array to indicate that the "first below" cell is associated with a bin in the sequence of bins which is just below the individual threshold.

Further in accordance with certain embodiments of the present invention, each of the cells stores L bits comprising one bit each from L logical pages (L>1).

Still further in accordance with certain embodiments of the present invention, the modifying comprises, for each "first below" cell, defined as a cell which yields a "below" value and is "not done", modifying the at least one buffer to indicate an ID of the bin in the sequence of bins which is just below the individual threshold.

Further provided, in accordance with certain embodiments of the present invention, is a system for reading Flash memory apparatus having c cells using an increasing sequence of B−1 thresholds defining a sequence of B bins, the system comprising at least one buffer operative to store information indicating whether or not each individual cell from among the c cells is "done" and indicating an individual one of the B bins which is associated with each individual cell from among the c cells; and "first below" cell based buffer updating apparatus operative, for each individual threshold, in order, in the increasing sequence of B−1 thresholds, to compare all cells in a c-cell flash memory physical page to the individual threshold in the sequence thereby to obtain an "above" or "below" value for each the cell; and for each "first below" cell, defined as a cell which yields a "below" value and is "not done", to modify the at least one buffer to indicate that the "first below" cell is "done" and to indicate that the "first below" cell is associated with a bin in the sequence of bins which is just below the individual threshold.

Further in accordance with certain embodiments of the present invention, the at least one buffer comprises a label buffer array storing c labels, each label indicating an individual state from among B+1 states which is associated with an individual cell from among the c cells, the B+1 states including B states indicating that the individual cell is "done" and respectively indicating an individual one of the B bins which is associated with the individual cell and a (B+1)th state indicating that the individual cell is "not done", the label buffer array being initialized to the (B+1)th state.

Still further in accordance with certain embodiments of the present invention, the at least one buffer comprises a "done" buffer storing c "done" bits indicating whether an individual cell c is "done" or "not done", the buffer initially being set entirely to "not done"; and a label buffer array storing c N-bit labels, each label indicating an individual one of the B bins which is associated with an individual cell from among the c cells, the label buffer array being initialized to values which differ from all labels of the first B−1 bins in the sequence of bins.

N may for example be 3. Generally N=log 2(B+1) or log 2(B) depending on the embodiment.

A particular advantage of the embodiment shown and described above is that the number of buffers employed depends on the number of labels rather than on the number of thresholds thereby saving memory.

Another advantage of the embodiment shown and described above is that hard decisions become easy to make in that each hard decision reduces to accessing one of the N bits of all labels in the label buffer array. To do this, labels are selected appropriately e.g. such that a predetermined one of the bits such as the MSB or LSB contains hard decision information categorizing a cell to which the label belongs as either a "1" logical value or a "0" logical value within a logical page.

It is appreciated that the order defined between thresholds and use of terms "increasing", "decreasing", "above" "below" etc may correspond to the natural order between physical values e.g. a cell with a value of 3.1 V is "below" a threshold of 3.2V and a threshold of 3.5 V appears "after" a threshold of 3.2V in the threshold sequence, or may alternatively be defined as any other order including the reverse of the natural order between physical values e.g. a cell with a value of 3.1 V is "above" a threshold of 3.2V and a threshold of 3.5 V appears "before" a threshold of 3.2V in the threshold sequence. When the process of claim 1 is completed, the label buffer is found to store, for each cell, a bin with which that cell is associated.

Further in accordance with certain embodiments of the present invention, the method also comprises selecting an error correction code to be used for encoding the plurality of flash memory cells, the error correction code comprising a concatenation of an inner BCH code and an outer BCH code.

Still further in accordance with certain embodiments of the present invention, the method is performed for a given application having defined requirements as to maximum available memory, maximum available processing time and minimum decoding accuracy pertaining to decoding of contents of the cells, wherein the inner BCH code being short enough to enable soft decoding of content of flash memory cells, thereby to generate soft decoded content, and the outer BCH code being long enough to enable hard decoding of the soft decoded content, the soft decoding followed by the hard decoding yielding a decoded result which conforms to the requirements, the inner BCH code being too short to enable hard decoding which conforms to the requirements, and the outer BCH code being too long to enable soft decoding which conforms to the requirements.

For example, if each codeword includes 255 bits, the outer code may add 8-11 redundancy bits.

Also provided, in accordance with certain embodiments of the present invention, is a method for error-correction encoding and subsequently decoding a plurality of flash memory cells, the method comprising encoding content to be stored in the plurality of flash memory cells using an error correction code comprising a concatenation of an inner BCH code and an outer BCH code, thereby to define encoded content to be stored in the cells, sampling the encoded content thereby to generate codewords of bits, estimating reliability of the sampling including generating a reliability score for each of the bits, soft decoding each of the codewords using the inner BCH code, thereby to generate soft decoded content including at least one preliminarily corrected codeword; and hard decoding the soft decoded content, using the outer BCH code, thereby to generate reconstructed contents of the cells. Typically although not necessarily, encoding and decoding take place in the same device.

Further in accordance with certain embodiments of the present invention, the inner BCH code has a Minimum Distance value of 3.

Still further in accordance with certain embodiments of the present invention, the soft decoding comprises, for each codeword which suffers from an unknown number of errors, determining a reasonable cap, integer max_C, on the unknown number of errors C; computing a syndrome for the codeword; unless the syndrome equals zero, for c=1, . . . max_C, finding at least one set of c bits in the codeword which, when flipped, zero the syndrome, giving a set score to each set of c bits by summing the reliability scores of all bits in the set; and assigning an error-number-score by minimizing over the set scores of all sets of c bits found in the finding step, determining the unknown number of errors C, to be the c with the smallest error-number-score; and for the set of c bits having, among all sets of c bits found for c=C, the smallest set score, flipping all c bits.

Further in accordance with certain embodiments of the present invention, the set finding step comprises searching for at least one bit defining at least one set of c bits, only within a subset of the bits in the codeword which have lower reliability scores than the bits in the codeword which do not belong to the subset. It is appreciated that the larger is the subset, the more reliable, but time-consuming is the soft decoding process and conversely, to the extent the subset is small, the soft decoding process is less reliable but faster.

Still further in accordance with certain embodiments of the present invention, the searching is performed from the bit whose reliability score is smallest and onward to bits whose reliability scores are larger and larger, and wherein the searching is terminated, when a bit is reached whose reliability score exceeds the error number score of a previous c value.

Additionally in accordance with certain embodiments of the present invention, the hard-decoding employs an error locator polynomial and wherein the hard-decoding success indication is determined based on the error locator polynomial without completing the hard decoding.

Further in accordance with certain embodiments of the present invention, the hard-decoding success indication is provided by only partly performing a hard decoding process on the plurality of flash memory cells.

Further in accordance with certain embodiments of the present invention, the hard-decoding success indication comprises a number of errors detected by hard-decoding the inner code without decoding the outer code.

Still further in accordance with certain embodiments of the present invention, the hard-decoding of the outer code employs an error locator polynomial and wherein the hard-decoding success indication is determined based on the error locator polynomial without completing the hard decoding of the outer code.

Additionally in accordance with certain embodiments of the present invention, the hard-decoding success indication is determined following encoding using both of the inner and outer BCH codes, and wherein the soft-decoding comprises soft decoding of the inner code and hard decoding of the outer code.

Further in accordance with certain embodiments of the present invention, the soft decoding comprises using dynamic programming.

Dynamic programming may require relatively large amounts of memory time and/or processing time.

Also provided, in accordance with certain embodiments of the present invention, is a system for error-correction encoding and subsequently decoding a plurality of flash memory cells, the system comprising a concatenated BCH encoder operative to encode content to be stored in the plurality of flash memory cells using an error correction code comprising a concatenation of an inner BCH code and an outer BCH code, thereby to define encoded content to be stored in the cells, a sampler and reliability estimator operative to sample the encoded content thereby to generate codewords of bits and to estimate reliability of the sampling including generating a reliability score for each of the bits, an inner BCH soft decoder operative to soft decode each of the codewords using the inner BCH code, thereby to generate soft decoded content including at least one preliminarily corrected codeword; and an outer BCH hard decoder operative to hard decode the soft decoded content, using the outer BCH code, thereby to generate reconstructed contents of the cells.

Certain embodiments of the present invention seek to provide reading of 'soft' information using log 2(# of bins)+1 buffers.

Certain embodiments of the present invention seek to provide reading of 'soft' information using log 2(# of bins+1) buffers.

Certain embodiments of the present invention seek to provide reading of 'soft' information using log 2(# of bins+1) buffers or log 2(# of bins)+1 buffers in an multi-level cell associated with several pages.

Certain embodiments of the present invention seek to provide reading of 'soft' information using log 2(# of bins+1) buffers or log 2(# of bins)+1 buffers with non-deterministic comparison results.

Certain embodiments of the present invention seek to provide Deciding on Coarse/Fine decoding based on cycling/effecting cycling.

Certain embodiments of the present invention seek to provide Deciding on Coarse/Fine decoding based on partial decoding results (e.g. partial LDPC, our new multi-BCH decoding results, base on ELP polynomial degree).

Certain embodiments of the present invention seek to provide Deciding in Coarse/Fine decoding based on Metrics of coarse reading (such as variances, . . . )

Certain embodiments of the present invention seek to provide a method which uses BCH coding for both soft and hard decoding. The BCH code may be a concatenated BCH code including an Inner code which is a short BCH code and an outer code which is a long BCH code decoded using hard decoding. For soft decoding of the BCH code, "dynamic programming" may be used, or alternatively any other suitable method such as approximation of the maximum likelihood estimator for decoding, containing loops with early terminations.

Certain embodiments of the present invention seek to provide use of BCH decoding in a multistage decoding scheme to obtain an overall short average decoding time, while keeping the number of read operations from the flash close to that of hard decoding.

Certain embodiments of the present invention seek to provide use of intermediate decoding results before deciding whether to proceed to soft decoding, including relying on the number of errors detected by the inner code and/or relying on the degree of the ELP in the decoding procedure of the outer code.

Any suitable processor, display and input means may be used to process, display, store and accept information, including computer programs, in accordance with some or all of the teachings of the present invention, such as but not limited to a conventional personal computer processor, workstation or other programmable device or computer or electronic computing device, either general-purpose or specifically constructed, for processing; a display screen and/or printer and/or speaker for displaying; machine-readable memory such as optical disks, CDROMs, magnetic-optical discs or other discs; RAMs, ROMs, EPROMs, EEPROMs, magnetic or optical or other cards, for storing, and keyboard or mouse for accepting. The term "process" as used above is intended to include any type of computation or manipulation or transformation of data represented as physical, e.g. electronic, phenomena which may occur or reside e.g. within registers and/or memories of a computer.

The above devices may communicate via any conventional wired or wireless digital communication means, e.g. via a wired or cellular telephone network or a computer network such as the Internet.

The apparatus of the present invention may include, according to certain embodiments of the invention, machine readable memory containing or otherwise storing a program of instructions which, when executed by the machine, implements some or all of the apparatus, methods, features and functionalities of the invention shown and described herein. Alternatively or in addition, the apparatus of the present invention may include, according to certain embodiments of the invention, a program as above which may be written in any conventional programming language, and optionally a machine for executing the program such as but not limited to a general purpose computer which may optionally be configured or activated in accordance with the teachings of the present invention.

Any trademark occurring in the text or drawings is the property of its owner and occurs herein merely to explain or illustrate one example of how an embodiment of the invention may be implemented.

Unless specifically stated otherwise, as apparent from the following discussions, it is appreciated that throughout the specification discussions, utilizing terms such as, "processing", "computing", "estimating", "selecting", "ranking", "grading", "calculating", "determining", "generating", "reassessing", "classifying", "generating", "producing", "stereo-matching", "registering", "detecting", "associating", "superimposing", "obtaining" or the like, refer to the action and/or processes of a computer or computing system, or processor or similar electronic computing device, that manipulate and/or transform data represented as physical, such as electronic, quantities within the computing system's registers and/or memories, into other data similarly represented as physical quantities within the computing system's memories, registers or other such information storage, transmission or display devices.

BRIEF DESCRIPTION OF THE DRAWINGS

Certain embodiments of the present invention are illustrated in the following drawings:

FIG. 17 is a table storing thresholds and labels which is useful in certain embodiments of the present invention;

FIG. 27 is an example table for the case of m=5, which is useful in certain embodiments of the present invention;

FIG. 28 is a Reverse syndrome table, which is useful in certain embodiments of the present invention;

DETAILED DESCRIPTION OF CERTAIN EMBODIMENTS

Figure 1:
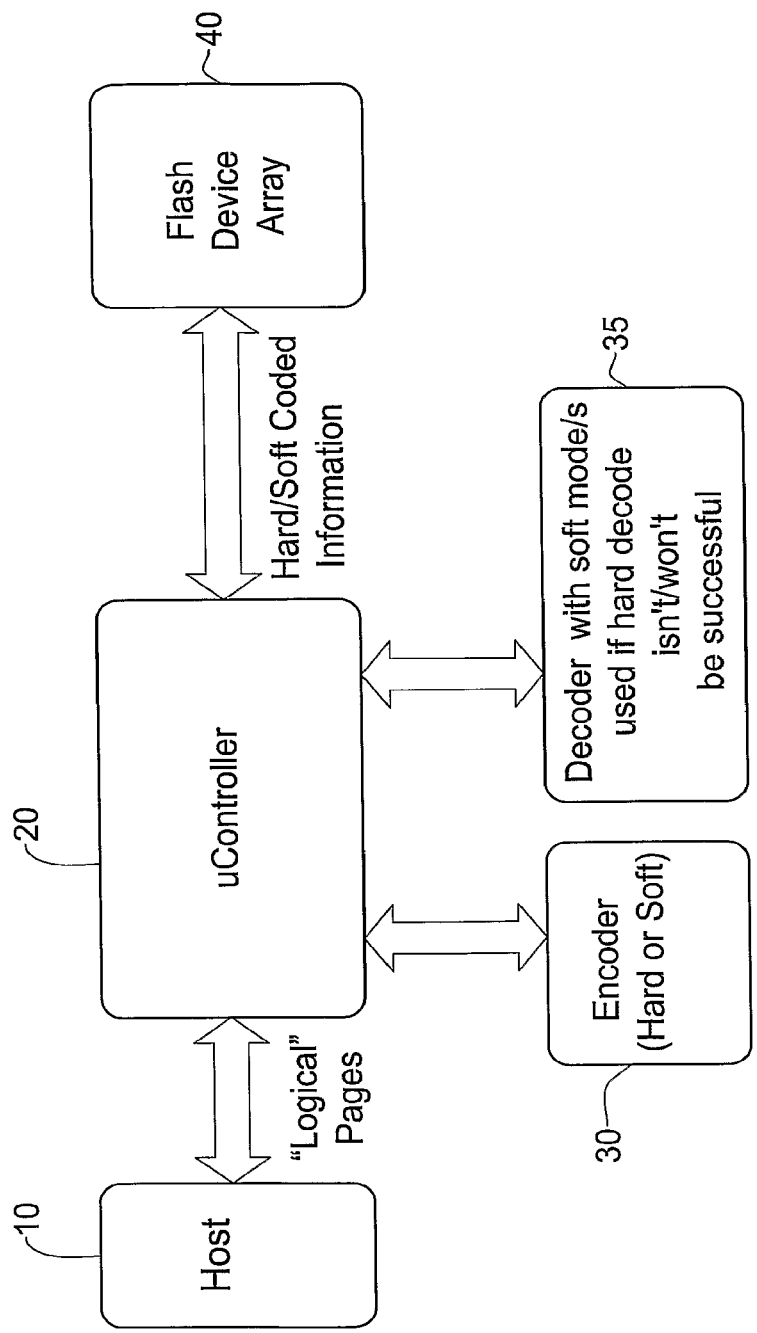
FIG. 1 is a simplified block diagram illustration of a system for two-stage decoding while reading data from a flash memory device, the system being constructed and operative in accordance with certain embodiments of the present invention.

State-of-the-art flash memory devices store information with high density on Flash cells with ever smaller dimensions. In addition, Multi-Level Cells (MLC) store several bits per cell by setting the amount of charge in the cell. The amount of charge is then measured by a detector, as measured by a threshold voltage of the transistor gate denoted by VT. Due to inaccuracies during the programming procedure and charge loss due to time and temperature (also known as retention), the measured levels during a Read operation suffer from detection errors. The small dimensions of the Flash cells result in cells that can store very small amounts of charge, enhancing the effects of inaccuracies due to programming and retention. Thus, new single level cells (SLC) and MLC (two or more bits per cell) devices have significantly increased bit error rate (BER), decreasing the reliability of the device.

Flash devices are organized into (physical) pages. Each page contains a section allocated for data (512 bytes-8 Kbytes) and a small amount of bytes (16-32 bytes for every 512 data bytes) containing redundancy and back pointers. The redundancy bytes are used to store error correcting information, for correcting errors which may have occurred during the page Read. Each Read and Program operation is performed on an entire page. A number of pages are grouped together to form an Erase Block (EB). A page cannot be erased unless the entire erase block which contains it is erased.

An important measure of a Flash device quality is the number of times (Np) it may be reprogrammed and the period that it can store information (usually 10 years) before irrecoverable errors occur. The higher the number of program-erase cycles, the higher the bit error rate (BER). Thus, today's MLC devices can perform around Np=1000 cycles for 10 years retention before the allocation of 16-32 bytes of redundancy per 512 bytes of data bytes becomes insufficient to correct errors. SLC devices usually perform better but obtain a much lower density and hence their prices are much higher. Note that following Np program-erase cycles the device is still operational but the BER is higher. Furthermore, in many devices (e.g. NROM Flash devices), this behavior is predictable and the number of redundancy bytes used to correct these errors does not jump rapidly.

During a Read operation, most devices decide on the programmed level of the Flash cell by comparing it to a number of threshold levels which divide the range of VT values into bins. The programmed level is then defined according to the bin in which the cell's transistor gate threshold voltage (VT) lies. It is well known that in the presence of coded information, reliability may be significantly improved if more refined (more accurate) information on the cell's transistor gate threshold voltage (VT) is extracted. For instance, if the transistor gate threshold voltage (VT) lies near to an edge of the bin, the measurement is less reliable and is more likely to be a result of an error (due to retention). In essence, more refined information is equivalent to dividing the range of transistor gate threshold voltage (VT) values to more bins than there are programmed levels. The information from this more refined binning is termed herein "soft" information as opposed to information obtained from the initial bin selection, according to the number of program levels which latter information is termed herein "hard" information.

Unfortunately, there is conventionally a price to be paid in extracting soft information: device performance may be compromised. To read a device which divides the range of transistor gate threshold voltage (VT) values into 16 bins may take approximately twice as long as dividing it into 8 levels. Certain embodiments of the present invention seek to provide a solution to or reduce the effects of this problem.

Certain embodiments of the present invention seek to provide multi stage decoding with a variable read accuracy at each stage intended to obtain fast read performance while enjoying the benefits of soft information decoding in non-volatile memories where obtaining high accuracy samples incurs a timing penalty. If desired, at each stage more accurate or additional information on the transistor gate threshold voltage (VT) value of each cell is extracted and the decoding method is adapted to handle more accurate information.

Initially, stored bits are typically read by making a conventional hard decision. That is, each bit is given a marker of '0' or '1'. This procedure maintains the high performance of hard decision output but reliability is relatively low. If the codeword is decodable or some other criterion is passed, the codeword is declared successfully decoded. Otherwise, a second, "soft" stage of reading with higher precision is performed (soft) and decoding occurs with soft information. This increases reliability (corrects more errors per page) but degrades the read time and power performance. To accelerate this procedure it may be advisable to perform 'soft' decoding based on intermediate results from the hard decoding procedure, rather than waiting for the output of the decoding process, as described below in detail.

In the embodiment described herein by way of example, 'soft' information, unlike 'hard' input information which simply assigns a '0' or a '1' to the input bits, contains a score in addition to the hard information. The score determines confidence in the hard information e.g. how close the detected bit was to its proper position. For example, in Flash memories the data is stored as charge in a cell. A threshold delineates a "border" between one amount of charge from another. If the detected charge is very close to the threshold, the score (alternatively, reliability) is typically low as a small detection error may push the level from one side of the threshold to the other. On the other hand, if the detected charge is far away from the threshold, the score is typically high as only very large, hence rare, detection errors could push the detected level to the other side of the threshold. Therefore, the log-likelihood ratio log $(P(Y|X=0)/P(Y|X=1))$ is typically associated with the score, where Y is the distance between the detected charge and the thresholds, $P(Y|X=0)$ is the probability of detecting a charge at point Y given that the symbol transmitted agrees with the hard decision, and $P(Y|X=1)$ is the probability of detecting a charge at point Y given that the symbol transmitted disagrees with the hard decision.

FIG. 1 illustrates an example of a system employing multi stage decoding in accordance with an embodiment of the present invention. The system typically comprises a uController 20, a Flash array 40, an Encoder 30, and a Decoder 35 capable of decoding hard and soft information such that, typically, soft decoding occurs only when hard decoding has been unsuccessful and/or is likely to be unsuccessful. The uController 20 reads pages from the Flash Array 40 and sends them for decoding at the Decoder 35. According to certain embodiments of the present invention, the uController 20 may read the same page several times in sequence, that is in several stages. During each stage, the read accuracy for the next stage and whether it will be initiated may be determined e.g. according to some or all of several indicators such as the number of Program/Erase cycles of the Erase Block, the success/failure of decoding and the number of errors detected in the decoding during previous stage as described in detail below. The system is operative in conjunction with a Host 10 which initiates arbitrary requests for reading and writing "logical" pages (or sectors).

uController 20 typically comprises a controller, RAM storage, and ROM storage and handles all requests from the hosts, controlling the Flash device array 40 the encoder 30 and the decoder 35. For example, the ucontroller 20 is able to read and program pages from and to the Flash array 40, to send and read pages to be encoded and decoded, and to define whether hard or soft decoding is to be employed. The uController 20 typically initiates all stages and decides how many stages are to be employed, e.g. how many read operations from the Flash Array 40 are to be performed for a given page. The uController 20 typically uses information extracted from the Flash array 20 and/or indications from the Decoder 35 to evaluate whether an additional decoding stage is to be employed or not and/or an acceptable level of accuracy is obtained.

In SD card and USB drive applications, the main task of the conventional uController is to translate read/write commands sent by the host to read page, program page and block erase commands on the Flash device through a standard interface such as a NAND Flash interface. During conventional program and read page operations the data is conventionally encoded and decoded using a standard error correction code using hard information. In contrast, according to certain embodiments of the present invention, these procedures are replaced and mixed decoding (hard and soft, e.g. depending on need) is provided.

The Encoder 30 and Decoder 35 are controlled by the uController 20. The Encoder 30 receives commands to encode data sent by uController 20. The encoder 30 may be a hard encoder, or a soft encoder, or may have 2 selectable modes of operation: hard and soft. The Decoder 35 also receives commands, from the uController 20, to decode information from the Flash Array 40. Decoder 35 decodes information using either soft information or hard information. Many encoding schemes and decoding schemes are known in the literature. According to certain embodiments of the present invention, the decoder 35 outputs an indicator indicating whether the decoding process was or is likely to be successful and, optionally, some additional qualitative information e.g. as described below.

The Flash Device Array 40 may comprise multiple Flash devices or a single Flash device and is typically mapped as a single large contiguous address space of pages. The array 40 accepts commands to program and read pages and to erase Erase Blocks which typically store several consecutive pages. Furthermore, this unit is operative to selectably perform several types of read operations, depending on the decoding stage.

The various Read operations may have the same read accuracy (same amount of bins) or a different read accuracy. The difference between read operations performed at different stages may be in the values of and/or number of the threshold voltages used to determine the charge value residing in each cell. The uController 20 may combine Read results resulting from two or more stages, to obtain a higher accuracy (a more dense division into bins) than that obtained by any of the read operations in isolation.

The specific system illustrated in FIG. 1 is not intended to be limiting. For example, the encoder 30 and/or decoder 35 may lie in between the uController 20 and the Flash Device Array 40 such that the data from and to the Flash array 40 passes directly through the Encoder 30 and/or Decoder 35 and not via the uController 20.

In the described embodiments of the present invention, the use of the terms flash memory, flash memory device, flash memory apparatus, solid state disk, memory device etc. is non-limiting (also referred to in general as "storage apparatus"). In certain embodiments of the present invention, the elements associated with the storage apparatus as well as the sequence of operations carried, are integral to the storage apparatus. In certain other embodiments of the present invention, at least some of the elements associated with the storage apparatus and at least some of the related operations are external to the flash, the solid state disk etc. For example, some of the operations performed by uController 20 of FIG. 1 may be carried by the central processing unit of the host 10, without limiting the scope of the present invention. For example, the decision to take a second stage of reading (e.g. soft reading) may be taken within the Host and sent to the uController for execution. For convenience only, the following description of certain embodiments of the present invention refers mainly to the term flash memory or solid state disk, however those versed in the art will readily appreciate that the embodiments that are described with reference to flash memory or solid state disk are likewise applicable mutatis mutandis to any storage apparatus which includes at least one memory portion affected by multi-stage reading.

Figure 11:
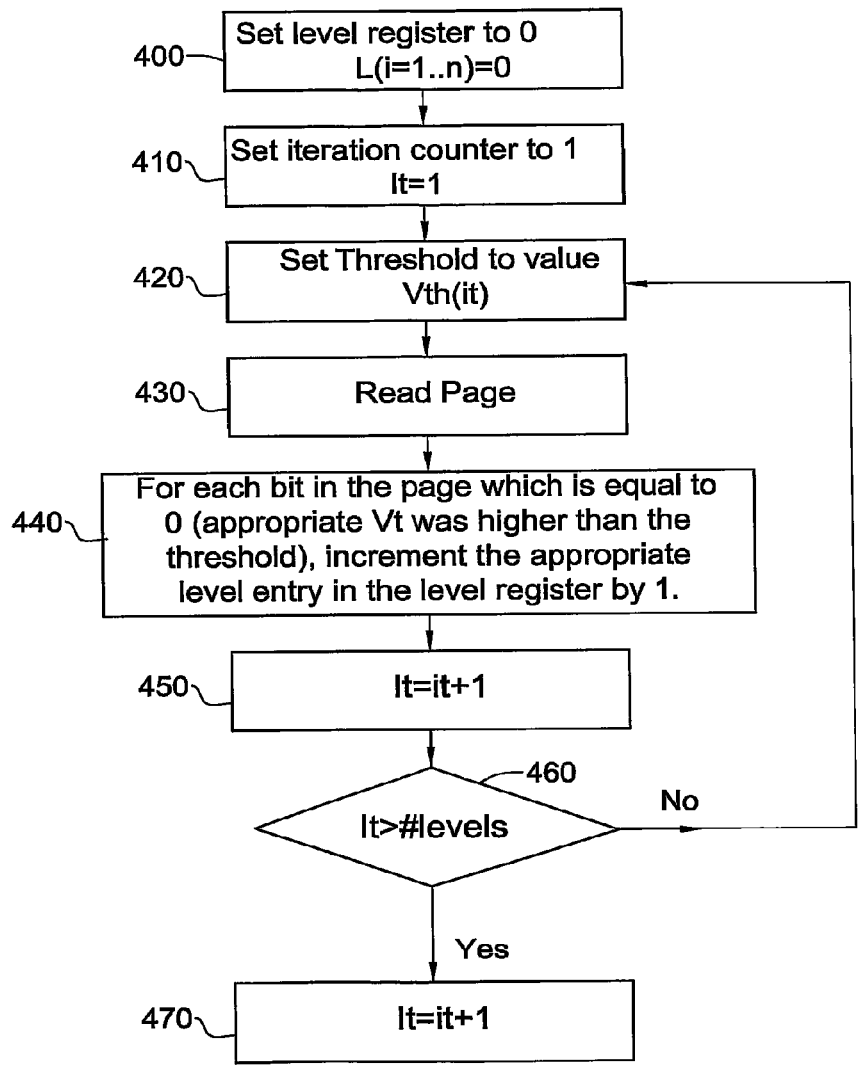
FIG. 11 is a simplified flowchart illustration of a method for reading finer information from a Flash device operative in accordance with certain embodiments of the present invention.

Conventional Flash devices typically do not accommodate reading of soft information (or distinguishing between more than two voltage levels representing two programming levels). To overcome this problem, several read "passes" are typically performed, changing the threshold levels, in number and/or in value, between one read and the next. One method for reading finer information from the Flash device is described below with reference to FIG. 11. Assuming it is desired to divide the readout into K bins, K−1 threshold points $Vth(i=1 \ldots K-1)$, ordered from lowest to highest, are defined. A bin is associated with each cell in the Flash page; initially that bin is assumed to be the zero bin. The following process is then performed iteratively:

1. Set the threshold to $Vth(it)$ where (it) is the iteration number $(it=1, \ldots, K-1)$.
2. Perform a binary read operation using this threshold value.
3. Each bit corresponds to one of the cells in the page. If a certain bit=0 the appropriate bin level is increased by 1.

The end result is that one of the K levels is associated with each cell. It is appreciated that since reading more levels is time consuming, using the above process takes K−1 times as long as does a binary read.

Several examples of alternative decoding schemes which may be used to implement the Decoder 35 are now described. The following examples refer to binary codes, which are codes based on two possible program levels for each cell, whereas in fact there may be more than two programming levels per Flash cell. However, there is no loss of generality, since bits may be allocated to a program level e.g. using conventional Gray coding, described e.g. in Reference [9]. Thus, given hard information, the levels may be mapped back into bits. The Gray coding ensures that errors between two adjacent levels cause only one bit to be in error.

As described above, suitable output indications are used to determine whether to go beyond an initial hard read of the data to be decoded, as shown below e.g. in FIGS. 8 and 9, step 102; in FIG. 9 steps 302; and in FIG. 10 step 207. Output indications which are suitable for various types of error correction codes are now described.

LDPC codes are well known in the literature e.g. as described in references [7] and [8]. These codes perform extremely well with soft information for which they offer a relatively efficient method of decoding. These codes are linear and may be defined by their check matrix. The check matrix is typically denoted by H and comprises a k×n matrix containing binary symbols. The codeword is denoted by c and is a column vector of length n of ones and zeros. The code is defined by the set of all codewords such that Hc=0 where the vector multiplication is performed in modulo 2. In general, LDPC codes are known to have a relatively low number of ones in the check matrix, allowing these codes to be efficiently decoded using iterative decoding methods e.g. as described in references [7] [8], using both hard and soft inputs. If the bit error rate (BER) in the hard information is above or near to a certain threshold, the probability of decoding error using hard information is high. However, if soft information is supplied, the decoding error probability may be significantly reduced. Hence, multi-stage decoding as described herein is particularly useful for LDPC codes since the decoding method may accept both hard and soft inputs.

Suitable output indications for deciding whether the BER is above or below a certain threshold are now described. In LDPC codes, each row of the matrix H constitutes a check equation. For every codeword, the exclusive-or of the symbols with indices corresponding to ones in the check equation is typically 0, however, if an error occurred in one of those symbols, the check equation fails and its exclusive-or is 1 instead of 0. In general, the more errors occur in a codeword, the more check equations fail. Thus, according to one embodiment of the present invention, the total number of check equations which did not agree in H (as obtained from hard information), being a good indicator of bit error rate, may be used to decide whether soft information is to be employed or not. A numerical example is now described:

Denoting the number of ones (alternatively, row weight) in a check equation (i.e. the number of ones in the relevant row in the check matrix H) by L and Using the symbol p to denote the probability of error in reading a bit using hard information, the probability of a check matrix failing is:

$$\frac{1-(1-2p)^L}{2}.$$

Figure 2:
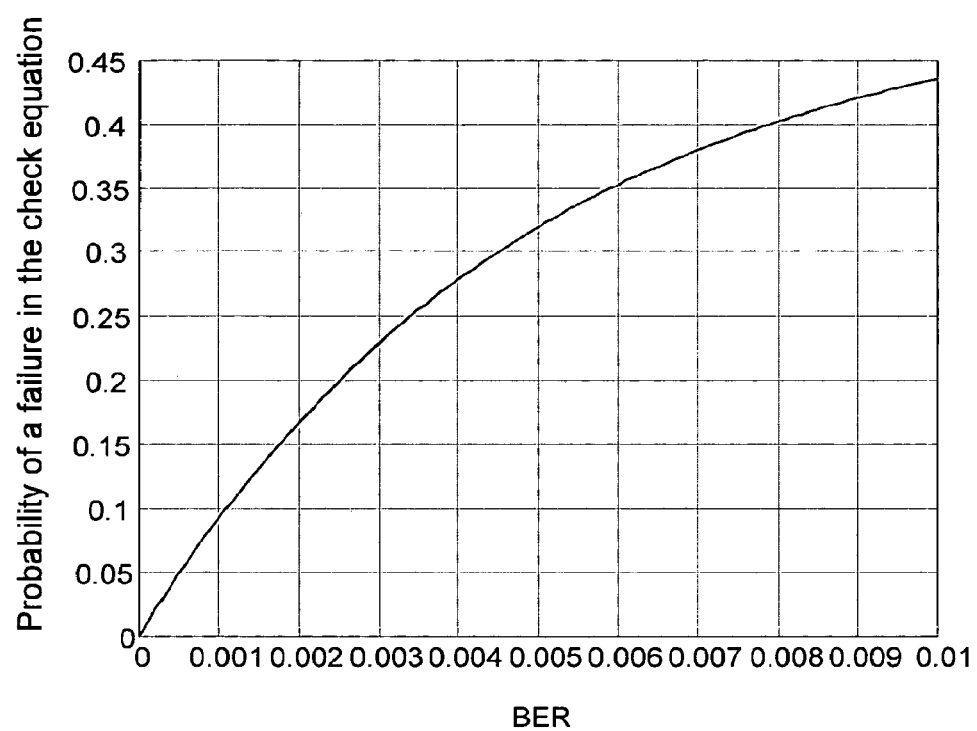
FIG. 2 is a graph showing the probability of failure in a check equation of weight 101 vs. the bit error rate, useful in implementing certain embodiments of the present invention.

FIG. 2 shows how this probability changes as a function of p for the case of L=101. To compute the average number of failed check equations in the matrix H, define the polynomial $$\lambda(X) = \sum_{i=0}^{\rho} \lambda_i X^i$$

where $\lambda_i$ is the fractions of rows in H with weight i and $\rho$ is the highest row weight. The average number of failed check equations is then given by $$\frac{K}{2}(1-\lambda(1-2p))$$

where K is the number of rows in H.

Therefore, the number of failed rows may be taken as an indicator of p, the probability of error in reading a bit using hard information. For example if hard decisions are used, LDPC code is not capable of decoding if p<2e-3. According to an embodiment of the present invention, this incapability is detected by checking the number of failed check matrices. According to certain embodiments of the present invention, if this number corresponds to p>1 e-3, a second stage is initiated with an additional, soft read. The additional read may use a higher number of read bins and/or different threshold levels such that, in combination with the information yielded by the previous read, more refined information is available. Thus it is possible to use, e.g. the information in FIG. 2, to build a predefined table associating the LDPC decoding capability with p and the accuracy of the information available during decoding.

According to certain embodiments of the present invention, an indication for failed decoding during the first stage may comprise failure of the LDPC method to converge following a given number of iterations. As already mentioned, the most common decoding method for LDPC codes is iterative. Following each iteration comes a check of whether some of the check equations failed. If all check equations agree, a successful decoding process is declared; otherwise, if after a certain number of iterations (say 100) the decoding process fails, a decoding error is conventionally declared. In accordance with certain embodiments of the present invention, occurrence of this "decoding error" may be used to initiate an additional read stage by the uController 20, such that the decoding error no longer means an actual failure to decode; instead, according to certain embodiments of the invention, it is taken to be a call for one or more further read stages.

According to certain embodiments of the present invention, a further indication for failed first stage decoding may be obtained by adding cyclic redundancy check (CRC) to the data. That is, on top of the data some of the redundancy bytes are allocated for CRC and both data and CRC are encoded using the LDPC code, which makes use of the remaining redundancy bytes. Several standard CRC computation methods may be used to compute additional 32 bits or 64 bits or 128 bits based on the data to be decoded. Following decoding, the CRC is computed again based on the decoded data and is compared against the decoded CRC. If the comparison fails, a decoding error is declared, this being still another indication for failed first stage decoding.

The indications described above may be used in isolation or in any combination, to initiate additional decoding stages as described in detail herein.

Algebraic codes such as RS and BCH codes are described in references [5] and [10] and are common in today's storage systems as they offer good results in the case of high rates (the ratio between the data length and the codeword length) with hard decisions. However, the same codes do not perform as well nor as efficiently, under soft decoding. Nonetheless, for very high rate codes, soft decoding of RS and BCH codes may be considered; several options exist, some sub-optimal, e.g. as described in references [11], [12] and [13]. When algebraic codes are used, some or all of several optional indications for unsuccessful decoding during the hard information stage may be employed. One such indication is based on comparing the number of roots detected during the Chien search (in both RS and BCH codes) with the degree of the error locator polynomial. Another indication is whether or not the syndrome is equal to zero following decoding. A third indication may be obtained using CRC as in the case of LDPC codes.

Another coding scheme which is common in communication systems is a concatenation of an inner convolutional code with an outer algebraic code. Convolutional codes are limited to lower rates than those achievable using LDPC and algebraic codes but have the advantage, relative to algebraic codes, that they can be naturally decoded with soft information. Convolutional codes perform less well than LDPC codes do, but can be implemented more efficiently. Examples of certain types of convolutional codes are described in reference [4].

According to an embodiment of the present invention, indications that the hard read is insufficient may be obtained during decoding using convolutional code. A common process for decoding convolutional codes is the Viterbi-algorithm which at each stage gives a score for the top candidates for the decoded word. These scores indicate how close the top candidate is to one of the codewords. If, following decoding, the best candidate has a score lower than a certain threshold, the uController can decide that the decoded word is unreliable and a second stage should be initiated. According to certain embodiments of the present invention, a more refined indication is obtained by giving scores to certain sections of the codeword. Thus, the uController might initiate a second stage not to the entire page but only to those sections that received low scores. This might reduce the amount of time required for the second stage read.

According to an embodiment of the present invention, an indication that the hard stage is insufficient may be given during the algebraic decoding stage which is performed using hard decisions.

According to an embodiment of the present invention, the indication as to whether or not to proceed with a soft reading stage, or another soft reading stage, may also be based entirely or partially on indications of the state of "health" of the flash device. For example, the uController unit 20 may derive such indications directly or indirectly from information stored on the Flash Device Array 40, such as but not limited to: the number of Program/Erase cycles which an Erase Block has undergone, the time that has elapsed from programming of a page until when it was finally read, and the variance and average of the distribution of the cells threshold voltage level distribution for any program level.

Figure 3A:
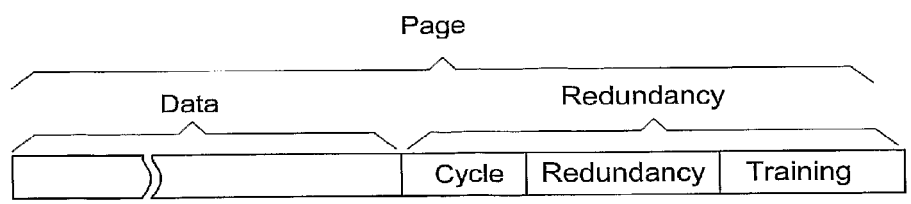
FIG. 3A is a simplified diagram of cycle count and training data located in a page constructed in accordance with certain embodiments of the present invention.

For example, FIG. 3A shows how the cycle count (number of program/erase cycles) is stored together with the data for each page. A training sequence also may be stored per page which allows distributions of the voltage thresholds of the cells to be evaluated. Some methods for selecting a training sequence as a function of the distributions are known in the art, e.g. as described in reference [14] and the publications referred to therein. Passage of time may be determined from standard variation and mean parameters extracted during the training phase to evaluate the time or distributions during a read operation by comparing those parameters to those obtained during tests in the lab on sample devices.

Figure 3B:
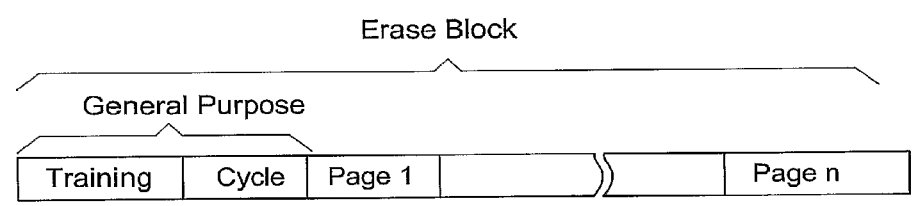
FIG. 3B is a simplified diagram of cycle count and training data located in an erase block constructed in accordance with certain embodiments of the present invention.

Another example of information stored on the flash device array which may be used as an indication of whether an additional reading stage should be performed, is shown in FIG. 3B. The embodiment of FIG. 3B makes use of the fact that all pages in a given Erase Block have undergone the same program/Erase cycles. Hence, the cycle count is stored only once for the entire block. Additionally, a training sequence may appear only once per the entire Erase block. During a system initialization, the training sequences of all blocks may be read and the time from the last Erase operation of the block until the system initialization, termed herein a "time stamp", may be learned. When programming a new page, this "time stamp" is stored as part of the page instead of storing the entire training sequence, thereby saving space. As the distribution may be approximated from the time stamp, indeed the time stamp may be used to replace the training sequence which earlier appeared per page.

Figure 4:
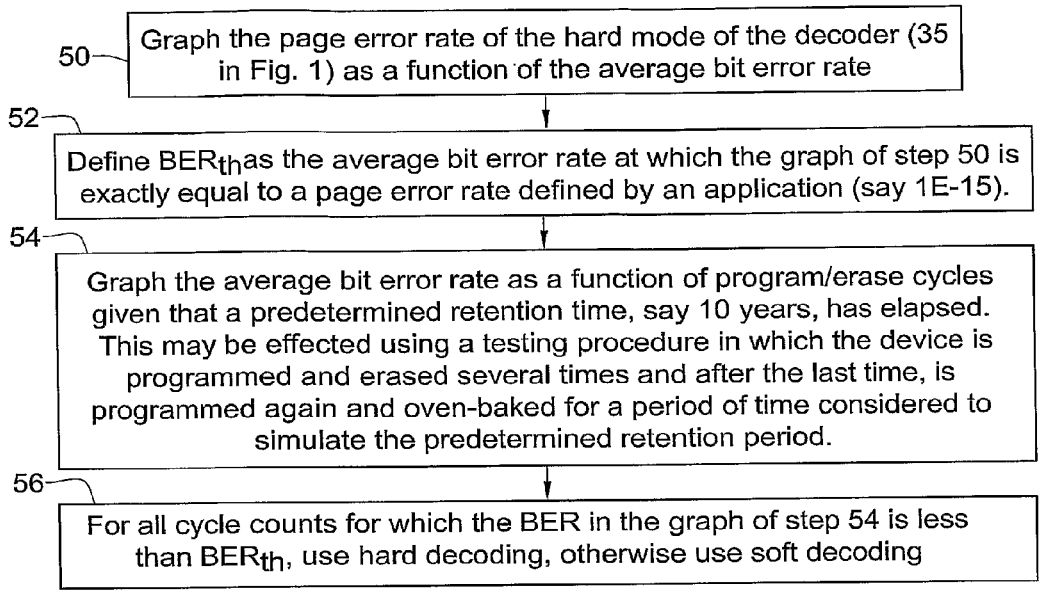
FIGS. 4 and 5 are simplified flowchart illustrations of methods useful in implementing certain embodiments of the present invention.

In order to determine a cut-off point for a cycle counter, allowing the cycle counter to serve as an indication of whether only hard decoding is to be used, or whether another stage of soft decoding is to be used, the method of FIG. 4 may be employed. The method of FIG. 4 typically comprises some or all of the following steps suitably ordered e.g. as shown:

Step 50: Graph the page error rate of the hard mode of the decoder (35 in FIG. 1) as a function of the average bit error rate.

Step 52: Define BERth as the average bit error rate at which the graph of step 50 is exactly equal to a page error rate defined by an application (say 1E-15).

Step 54: Graph the average bit error rate as a function of program/erase cycles given that a predetermined retention time, say 10 years, has elapsed. This may be effected using a testing process in which the device is programmed and erased several times and after the last time, is programmed again and oven-baked for a period of time considered to simulate the predetermined retention period.

Step 56: For all cycle counts for which the BER in the graph of step 54 is less than BERth, use hard decoding, otherwise use soft decoding.

The uController 20 of FIG. 1 may read the cycle count field for the Erase Block (or page) and determine the read accuracy to be employed, using the above 4-step method to select either "hard" read (faster read operation) or "soft" read (slower read operation) i.e. the threshold for the selection is predetermined according to experiments, comprising the above 4-step method, performed during the engineering stage. The cycle counter of each erase block may be stored in the flash memory array 40 either in reliable cells or using a separate code. For example, one way of storing this information more reliably is to store only one bit of the information per cell, since a small number of bits per cell guarantees a substantially lower bit error rate.

The cycle count at each time an erase block is programmed, is larger than the count was the last time the erase block was programmed. However, the significance of the cycle count for the purposes of the present invention may vary with circumstance. Flash devices tend to perform better, (as if the number of cycles decreased), the longer the time since the last programming cycle and their bit error rate improves accordingly following retention. For example, a Flash memory device which had 1000 program/erase cycles within a period of one week, may suffer a significantly degraded BER following retention. However, a Flash device that underwent 999 program/Erase cycles and a year later underwent its 1000th cycle, may be found to suffer from a far less degraded BER following the same amount of retention.

The time passage from the previous EB erase can be estimated through the cycle counts and the number of errors which occurred during the latest read operation of the oldest page in the erase block. According to certain embodiments of the present invention, termed herein "weighted cycle count indicator" embodiments, the cycle count (Np) may be set to a lower value if the number of errors which occurred during the latest read operation of the oldest page in the erase block was large, so as to enable a higher rate of encoding and a more compact storage.

As described above, a training sequence, optionally in conjunction with a cycle count, may be used to determine the distribution of the threshold voltage levels. Given this distribution it is possible to determine a suitable accuracy for the read operation. The accuracy is dependent on the standard variations of the distributions and a table mapping the standard variation to the accuracy may be given.

Figure 5:
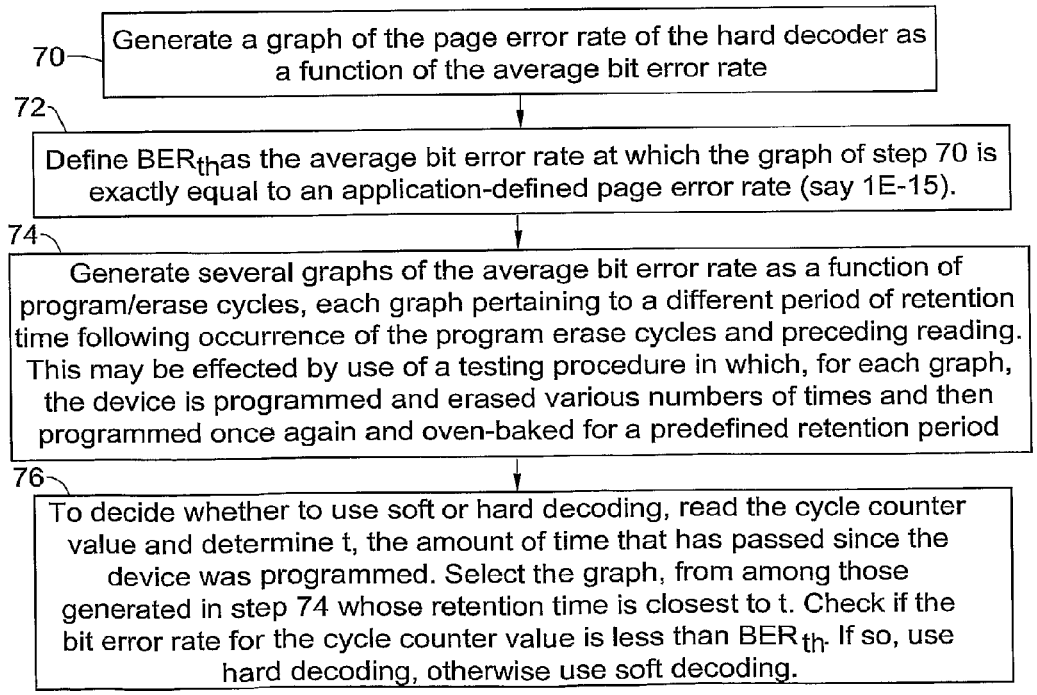

One suitable decision criterion for whether to use soft or hard coding, as a function of cycle count and time elapsed between programming and reading, may be generated according to the method of FIG. 5. The method of FIG. 5 typically comprises some or all of the following steps suitably ordered e.g. as shown:

Step 70: Generate a graph of the page error rate of the hard decoder as a function of the average bit error rate.

Step 72: Define BERth as the average bit error rate at which the graph of step 70 is exactly equal to an application-defined page error rate (say 1E-15).

Step 74: Generate several graphs of the average bit error rate as a function of program/erase cycles, each graph pertaining to a different period of retention time following occurrence of the program erase cycles and preceding reading. This may be effected by use of a testing process in which, for each graph, the device is programmed and erased various numbers of times and then programmed once again and oven-baked for a predefined retention period.

Step 76: To decide whether to use soft or hard decoding, read the cycle counter value and determine t, the amount of time that has passed since the device was programmed. Select the graph, from among those generated in step 74 whose retention time is closest to t. Check if the bit error rate for the cycle counter value is less than BERth. If so, hard decoding should be used, otherwise soft decoding should be used.

If the distribution is known, the BER (bit error rate) can be determined and the decision on whether to use soft or hard decoding may be made by comparing the bit error rate to BERth. If the bit error rate is less than BERth, hard decoding should be used, otherwise soft decoding should be used.

Figure 6A:
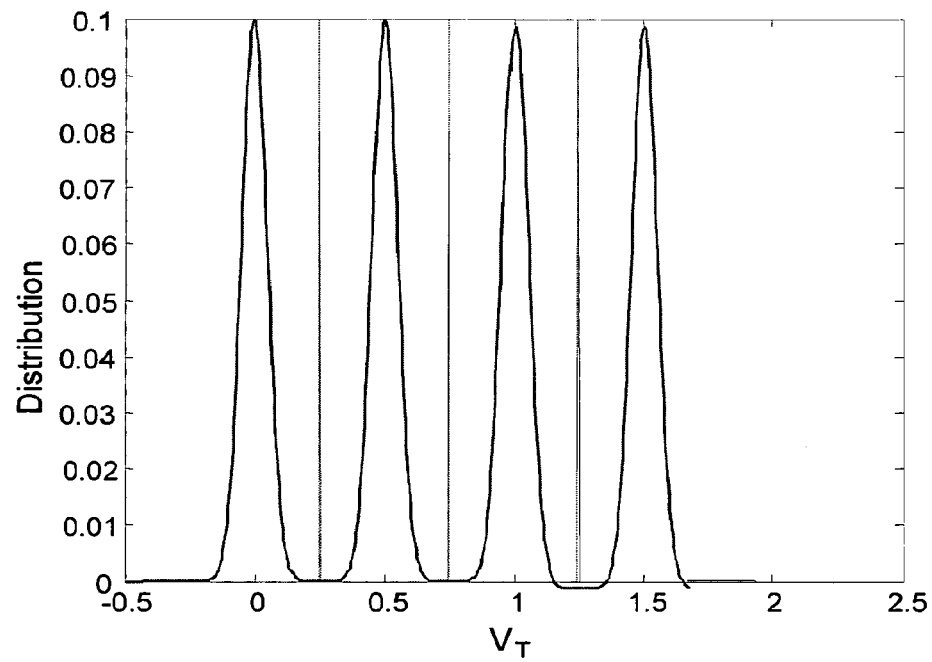
FIG. 6A is a graph of Read 1 (hard) decision levels for hard information, the graph being constructed in accordance with certain embodiments of the present invention.
Figure 6B:
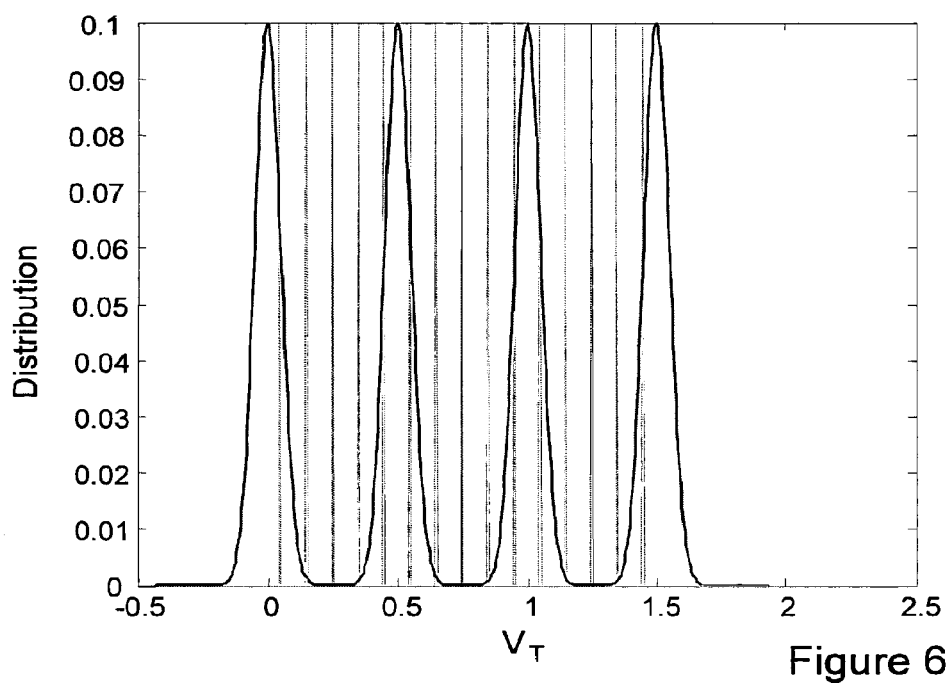
FIG. 6B is a graph of Read 2B (soft=Read 2A+Read 1) decision levels for soft information, the graph being constructed in accordance with certain embodiments of the present invention.

As a first example consider a flash device which stores 2 bits per cell, i.e., which has 4 program levels as shown in FIGS. 6A and 6B. Define the Read operations which the Flash array may perform, such as for example the following 3 types of Read operations:

a. Read 1: a read operation which corresponds to hard decisions. The vertical lines in FIG. 6A denote the decision levels selected for the Read 1 operation.

b. Read 2A: a read operation with 12 threshold levels whose locations are shown in FIG. 6B as dotted lines. Read 1+Read 2A together divide the total voltage range into 16 bins.

c. Read 2B: a read operation with 15 threshold levels corresponding to the solid and dotted vertical lines in FIG. 6B. Read 2A and 2B have, respectively, four and five times the number of threshold levels that Read 1 has. Therefore, a conventional implementation of these reads would take four and five times as long, respectively.

Figure 7:
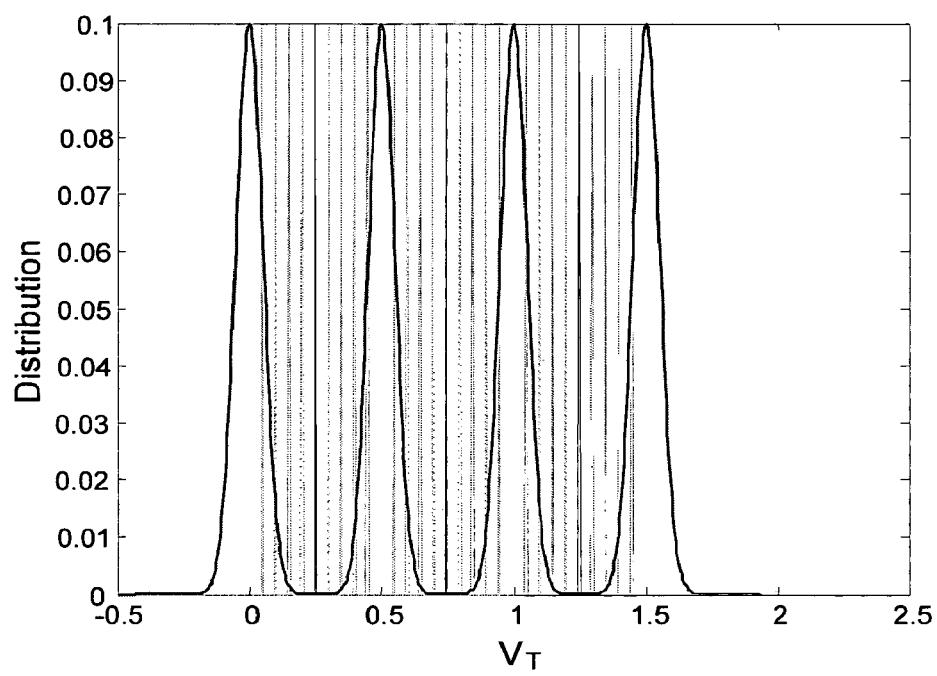
FIG. 7 is a graph of Read 3B (soft=Read 3A+Read 2A+Read1) decision levels for soft information, the graph being constructed in accordance with certain embodiments of the present invention.

As a second example, consider the 3 read stages of FIG. 7 comprising a hard read stage with 4 bins, a fine read stage with 16 bins and an ultra-fine or finer read stage with 28 bins. This may be effected by adding an additional read operation Read 3A which uses additional 12 additional thresholds. Therefore, the Read 3A operation in combination with the previous reads (Read 1, Read 2A and Read 2B, totaling 15 thresholds) define 27 thresholds which divide the signal into the desired 28 bins.

Due to retention, the centers of the distributions of the program levels might shift to the left. The threshold levels may be moved appropriately to accommodate this.

Figure 8:
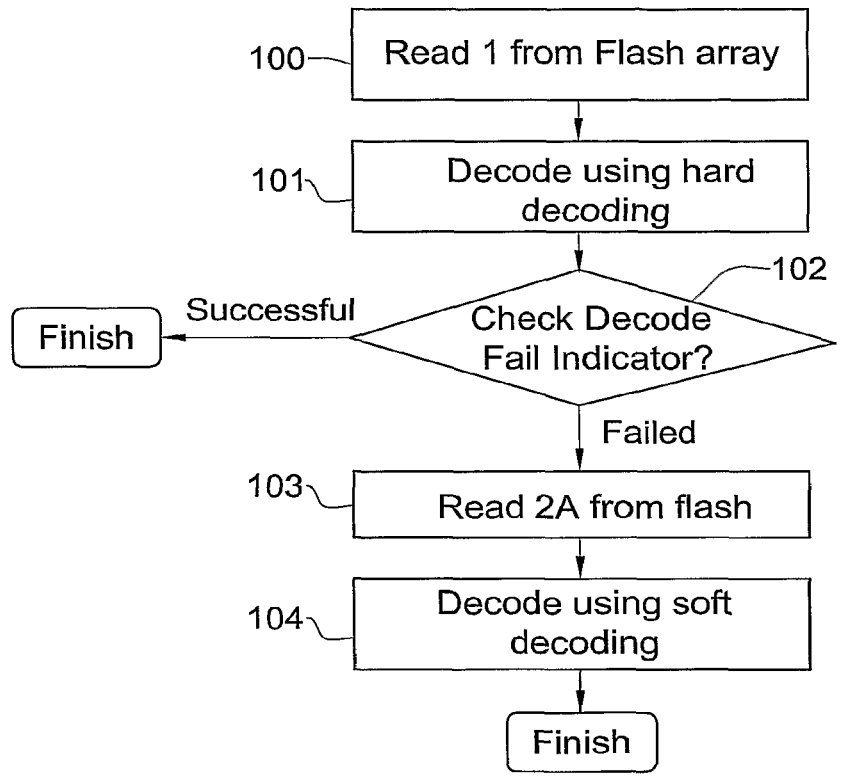
FIG. 8 is a simplified flowchart illustration of a decoding method provided in accordance with an embodiment of the present invention.
Figure 10:
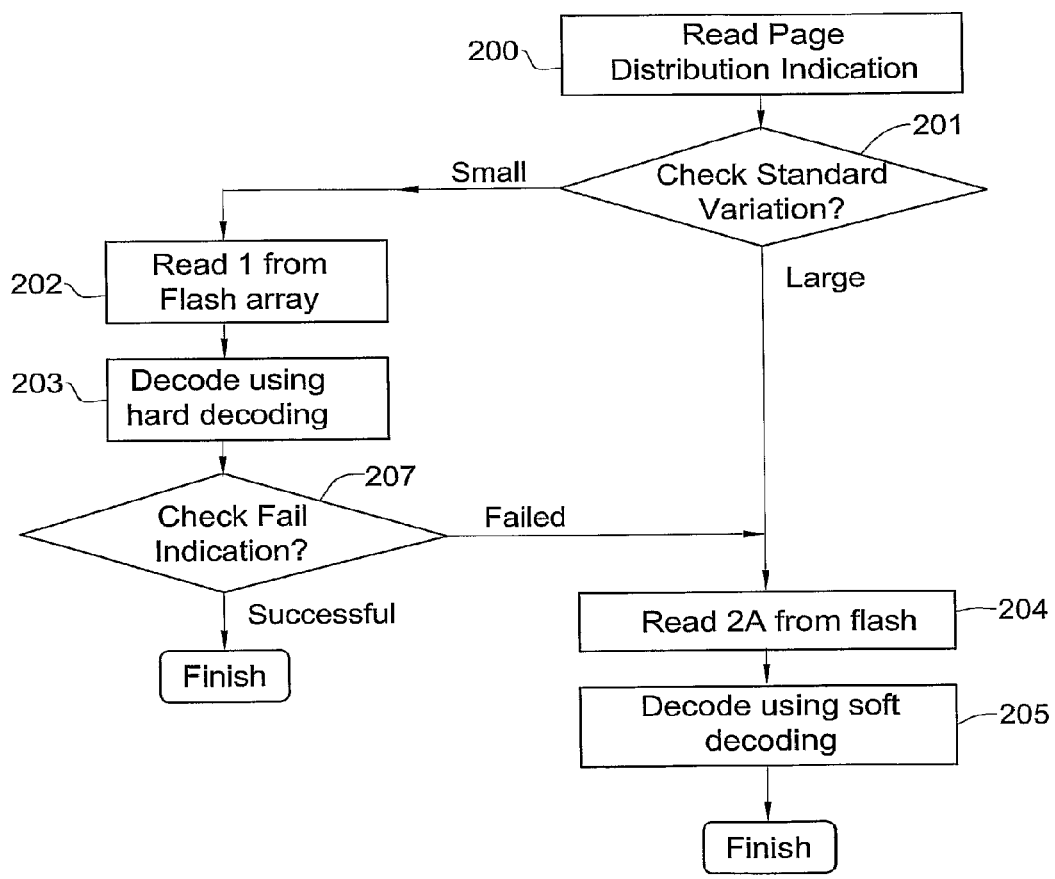
FIG. 10 is a simplified flowchart illustration of an example of a method for performing multi-stage read under the "maintain-performance-when-young, reliability-when-old" strategy, all in accordance with certain embodiments of the present invention.

The uController 20 instructs the decoder 35 differently under the "nearly-hard" or "maintain-performance-when-young, reliability-when-old" strategies described above, e.g. as illustrated in FIGS. 8 and 10 respectively.

FIG. 8 is a simplified flowchart illustration of a multi-stage read method, typically implemented in the form of instructions issued by uController 20 to decoder 35, operative in accordance with the "nearly-hard" strategy and assuming 2 read stages are used. According to this strategy the Read operation always terminates with a conventional hard decision read, so the method of FIG. 8 begins with a Read 1 operation (100). This may be followed by an attempt to decode using the hard decision decoder (101) and a subsequent success check (102), although alternatively or in addition, if LDPC is used, an indication of expected success may be available in the first iteration. In the event of success, the operation is complete. If not, proceed with a Read 2A operation (103) and add the threshold levels to those used in Read 1 so as to divide the entire range into 16 bins. Decode using soft information (104) and finish.

Figure 9:
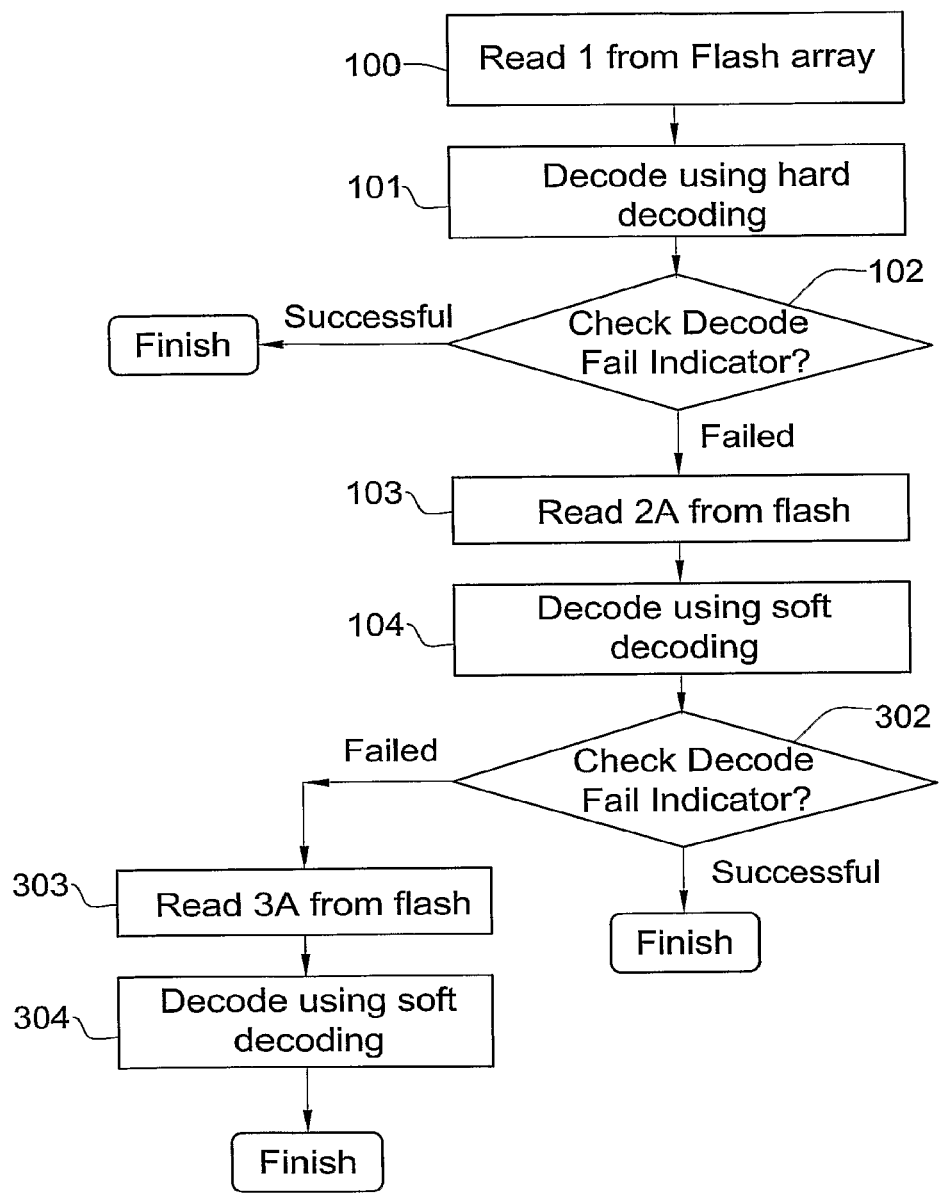
FIG. 9 is a simplified flowchart illustration of instructions which may be issued by uController 20 to decoder 35 under the "nearly-hard" strategy assuming 3 read stages are used rather than 2 as in FIG. 8.

FIG. 9 is a simplified flowchart illustration of instructions issued by uController 20 to decoder 35 under the "nearly-hard" strategy and assuming 3 read stages are used rather than 2 as in FIG. 8.

FIG. 10 is an example of a method for performing multi-stage read under the "maintain-performance-when-young, reliability-when-old" strategy. The method begins with recovering some information on threshold voltage distributions in block 200, e.g. via the training sequence and/or cycle count indicators, as described above. This is followed by a check as to whether the STD is large or small (201). If large, proceed with a Read 2B operation (204) and soft decoding (205). Otherwise, perform a Read 1 operation (hard decision) and hard decoding. If the hard decoding fails (207), perform soft decoding as in FIG. 7.

Considerations for designing a code according to the "nearly-hard" strategy are now described, based on the following definitions:

1. FERreq=The application-specific frame error rate: an upper bound on the probability of wrongly decoding a page (FER=frame error rate).

2. PFloss=The average performance loss: the average time loss during a page read due to the fact that more levels are being read.

Assuming an error correction coding scheme with a given amount of redundancy which can be used for both hard and soft information, an evaluation may be made as to how large the lobes of the charge level distributions can be such that the code remains operative. Assuming the distance between the lobes is d and the standard variation of the distribution of the lobes is $\sigma$, this may be done by finding the smallest d/$\sigma$ satisfying that:

a. the code still works
b. the performance loss is no larger than PFloss and
c. the page error rates are smaller than FERreq.

Figure 13:
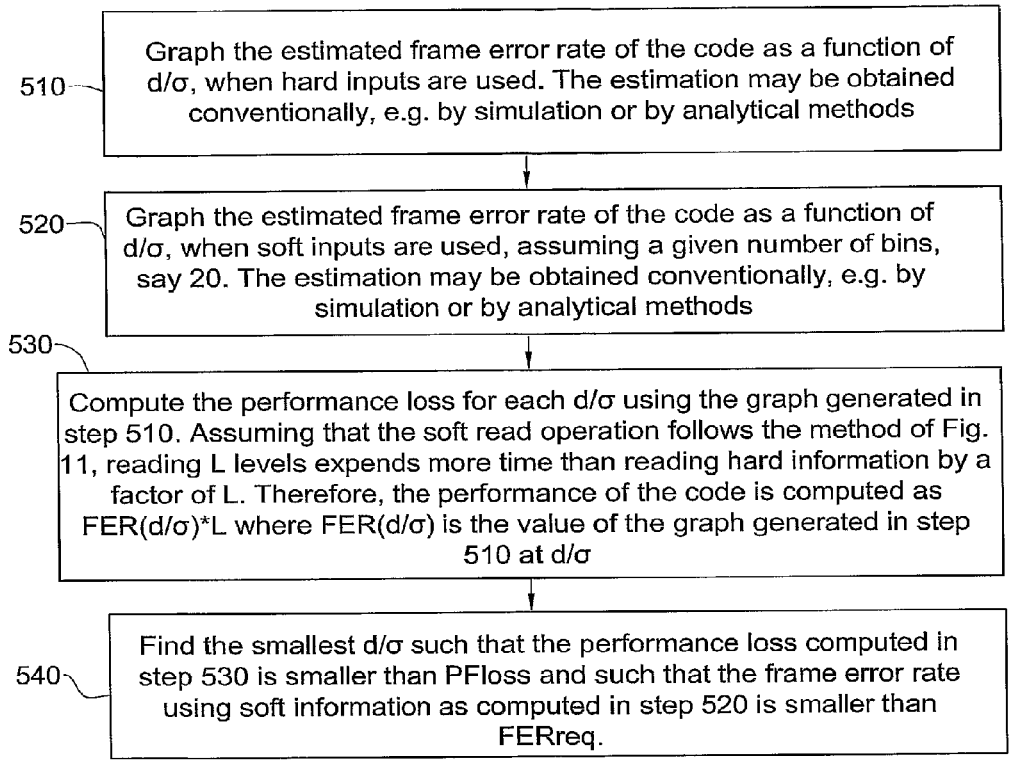
FIG. 13 is a simplified flowchart illustration of a method useful in implementing certain embodiments of the present invention.

To find the smallest d/$\sigma$ satisfying a-c the method of FIG. 13 may be employed. The method of FIG. 13 typically comprises some or all of the following steps suitably ordered e.g. as shown:

Step 510: Graph the estimated frame error rate of the code as a function of d/σ, when hard inputs are used. The estimation may be obtained conventionally, e.g. by simulation or by analytical methods.

Step 520: Graph the estimated frame error rate of the code as a function of d/σ, when soft inputs are used, assuming a given number of bins, say 20. The estimation may be obtained conventionally, e.g. by simulation or by analytical methods.

Step 530: Compute the performance loss for each Nu using the graph generated in step 510. Assuming that the soft read operation follows the method of FIG. 11, reading L levels expends more time than reading hard information by a factor of L. Therefore, the performance of the code is computed as FER(d/σ)*L where FER(d/σ) is the value of the graph generated in step 510 at d/σ.

Step 540: Find the smallest d/σ such that the performance loss computed in step 530 is smaller than PFloss and such that the frame error rate using soft information as computed in step 520 is smaller than FERreq.

Figure 12:
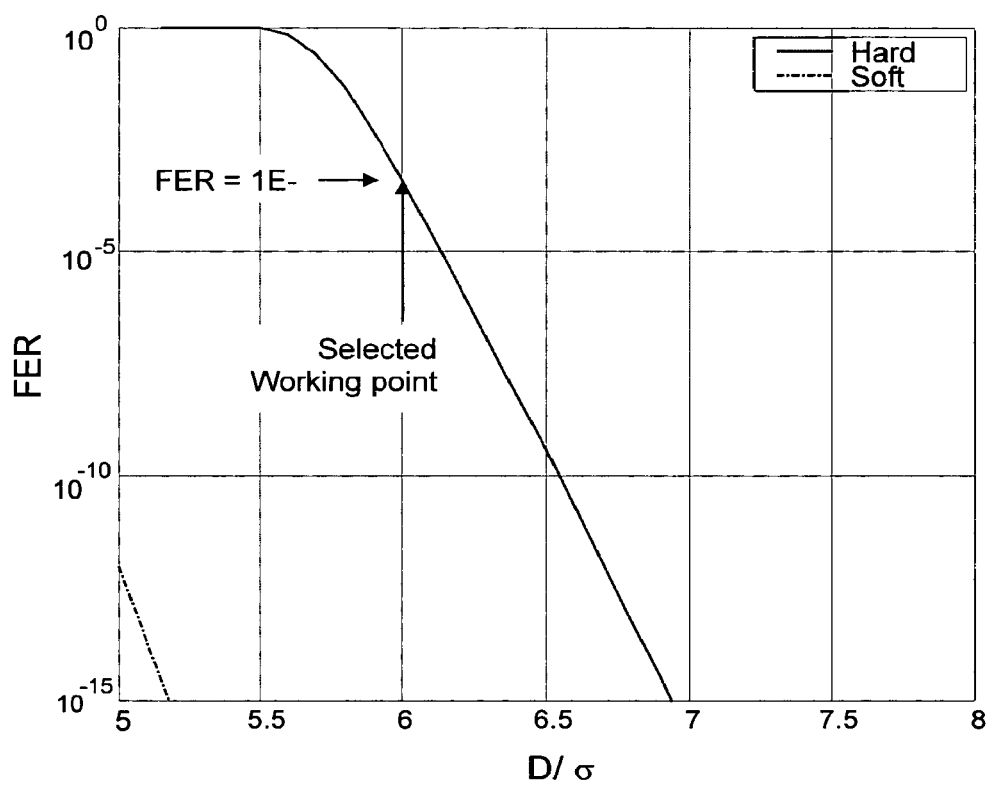
FIG. 12 is an example graph showing punctured convolution code performance estimation with an outer BCH code (4 errors, rate=7/8, constraint length=9) over a block of 512+5 spare bytes based on the distance spectra given for one of the codes in reference [3], useful in implementing the "nearly hard" strategy according to certain embodiments of the present invention.

As an example, the graphs of steps 510 and 520 are illustrated in FIG. 12 for a concatenated code of a punctured convolution code of rate 7/8 with a BCH code that can correct 4 errors over a page of 512+5 (spare) bytes. The number of levels is assumed to be 50 and then the performance loss is less than 5% and the FERreq=1E-15. As is appreciated from the graph, choosing d/σ=6 yields an approximate FER of 1E-3 using hard information and hence a 5% performance loss whereas using soft information easily yields page error rates of less than FERreq. If only hard decoding were to be employed, the value of d/σ would be 7.

In order to design a code which operates at a given d/σ and functions at a given performance, loss and frame error rate codes with increasing redundancies can be designed until a code is obtained which satisfies all of the above conditions.

A method for Coarse/Fine decoding based on Intermediate hard decoding results is now described with reference to FIG. 14. In this embodiment, the decision to perform "soft" decoding is based on partial results of the hard decoding instead of the complete results of the hard decoding which yields a pass/fail result. 3 different examples for partial results are now described:

1) If LDPC as is being used as a code, partial results may be obtained during the first iteration of the LDPC which gives us the number of parity check equations which do not agree. A threshold may be set such that if the number of equations that disagree exceeds this threshold, it is decided that the probability of hard decoding failure is high and turn to perform "soft" decoding. In the event that the number of bad parity equations is below the thresholds, LDPC iterations continued until a "hard"-decoded codeword is obtained.

2) If concatenated BCH codes are considered, including a short inner code concatenated with a long outer code, partial decoding results may be obtained from the inner codes from which the number of errors corrected by the inner codes may be counted. A threshold may be defined such that if the number of errors corrected by the inner BCH codes is higher than this threshold, it is declared that there is a high probability of failure in hard decoding and outer code decoding is discontinued; instead decode proceeds using reliability information and "soft" decoding.

3) A third option comprises performing part of the BCH code decoding e.g., in the case of concatenated codes, part of the outer code decoding. The conventional BCH decoding procedure has 3 stages: Syndrome computation, Error locator polynomial (ELP) computation and Chien search. If the BCH code is designed to correct a significant amount of error (say more than 30), any error sequences which are beyond the error correcting capability of the code are bound to yield high order ELPs. Therefore, a cap, or upper threshold may be put on the order of the ELP and it may be decided that if the order of the ELP is above that cap, "soft decoding" will be employed. A similar method may be used with Reed-Solomon codes as opposed to BCH codes.

Figure 14:
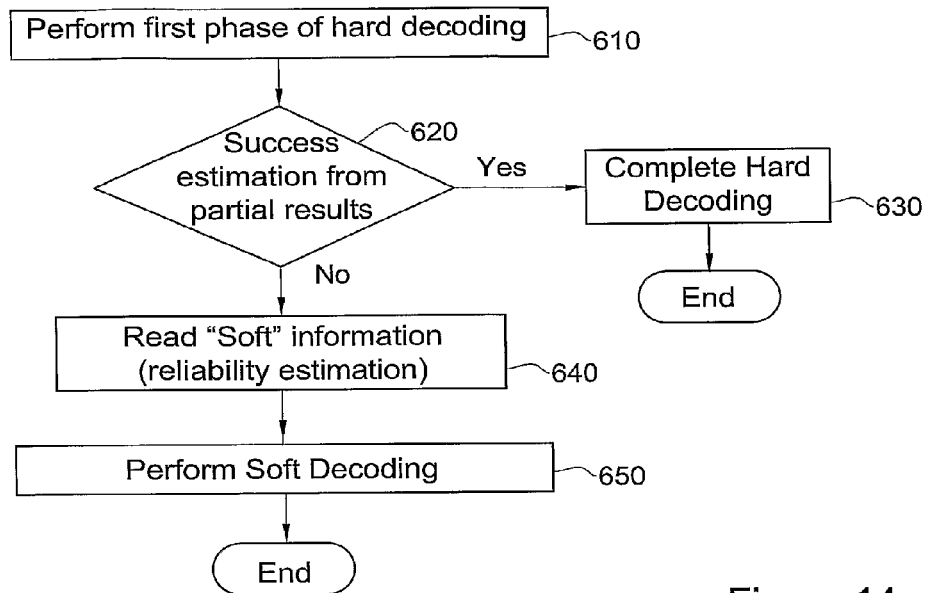
FIG. 14 is a simplified flowchart illustration of Coarse/Fine decoding based on partial results from hard decoding, operative in accordance with certain embodiments of the present invention.

The method of FIG. 14 may be modified by additionally performing "soft" decoding using reliability information if failure to decode is present after completing the decoding process.

In step 610, typically, a Hard reading of a Flash page (i.e. only bit values of 0 or 1 are returned) is performed, followed by a portion of the total hard decoding task, e.g. decoding of only some of the total amount of coded data, which portion generates partial results. In step 620 at least one metric is generated from the partial results of the portion of hard decoding performed in step 610 in order to evaluate the chances of a successful completion of the hard decoding. Suitable metrics are described above for 3 different cases. If a predetermined success criterion is achieved, e.g. if the at least one metric is above a certain threshold, the method proceeds with step 640. If not, hard decoding is completed (step 630). In step 640 the page is read using a finer resolution and on top of the hard results, a reliability measure is obtained. Step 640 is followed by step 650 which comprises soft decoding.

Figure 15:
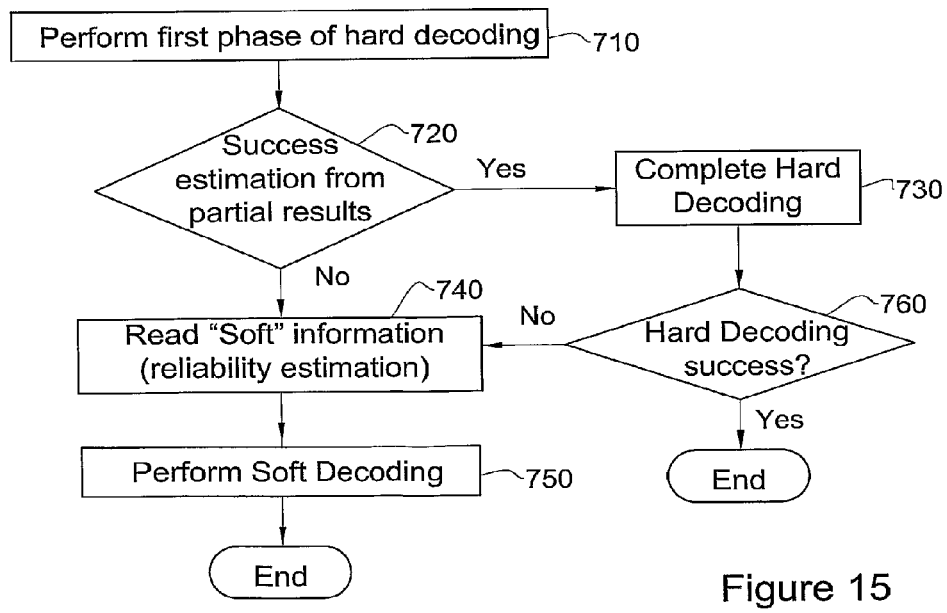
FIG. 15 is a simplified flowchart illustration of Coarse/Fine decoding based on partial results and hard decoding success/failure, operative in accordance with certain embodiments of the present invention.

FIG. 15 is a simplified flowchart illustration of a method for Coarse/Fine decoding based on partial results and hard decoding success/failure, operative in accordance with certain embodiments of the present invention. The method of FIG. 15 is similar to the method of FIG. 14 other than step 760 which checks whether the hard decoding, predicted to be successful, has indeed been completed successfully. If not, soft reading and decoding are performed, as in steps 640 and 650 in FIG. 14.

Figure 16:
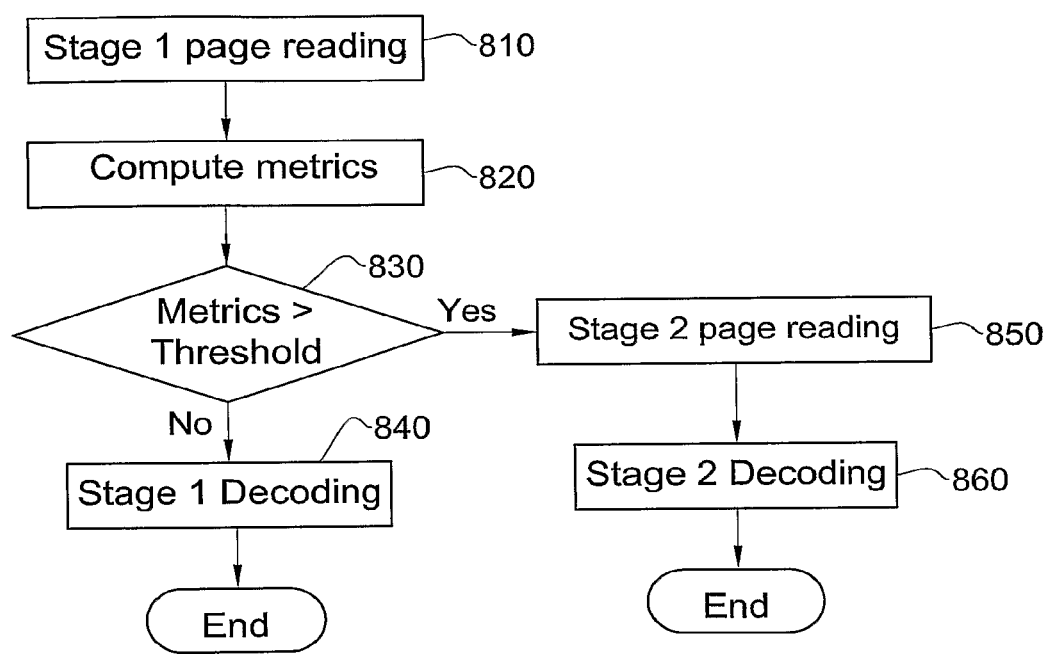
FIG. 16 is a simplified flowchart illustration of Coarse/Fine decoding based on metric from measurements, operative in accordance with certain embodiments of the present invention.

Methods for Coarse/Fine decoding based on metrics of measurement are now described with reference to FIG. 16. In certain applications, analog values of the cells in a page may be read using varying degrees of accuracy. More accurate reading of the page incurs longer reading times and is therefore less desirable. However, less accurate measurement may yield smaller decoding success probabilities. The method of FIG. 16 is useful for deciding whether to perform coarse or fine reading and decoding.

The method typically begins with stage 1 reading (step 810) which comprises coarser hence faster reading. Step 820 is a metric evaluation step. For example, variance of one of the lobes may be evaluated (step 820). Say each cell is programmed to one of 8 levels. When performing stage 1 reading the possible cell values are divided into bins. The bins which surround the highest lobe are identified. This is done by starting from the highest bin and counting the number of elements added for each bin added, successively taking lower and lower bins until the number of cells expected at the highest lobe is roughly obtained. Once the appropriate bins have been obtained, the variance or STD may be estimated.

According to certain embodiments, an average or central value of a highest lobe in a probability density function graph of logical values read from flash memory may be found, by defining mock thresholds between maximal values identified for a new flash memory device and minimal values identified for an extremely run down (high retention, high cycle count) flash memory device. To do this, a new flash memory device may be taken up at a set up stage, and a large number of cells therein, perhaps one erase-sector full, may be programmed to their highest levels. The erase sector is read, using suitable thresholds whose intervals define a suitable resolution, to determine the location of the top edge of the highest (rightmost) lobe. An extremely run-down flash memory device is then taken up, also at the set up stage, and a large number of cells therein, perhaps one erase-sector full, may be programmed to their highest levels. The erase sector is read, using suitable thresholds whose intervals define a suitable resolution, to determine the location of the bottom edge of the lowest (leftmost) lobe. It can then be assumed to be the case, that any flash memory device's highest lobe falls within the window between the known bottom edge of the lowest lobe of the run-down flash memory, and the known top edge of the highest lobe of the new flash memory. This is helpful, for example, when it is desired to define mock reading thresholds to identify the location of a highest lobe of a probability density function of an individual flash memory device, wherein the mock reading thresholds are to span all possible locations of the highest lobe. This can be done by distributing mock reading thresholds throughout the entire window described above.

Once the variance has been found, it may be compared to a given threshold (step 830). If the variance is too high it may be concluded that all the lobes suffer from this variance and decoding is not likely to succeed with the current coarse reading resolution and that a higher resolution reading is in order (step 850). Alternatively, the average of the highest lobe may be computed and compared to the average one would obtain just after programming. A threshold value may be set for the difference between the two averages (current average and the one just following programming) such that if the difference is larger than a given threshold, the device is deemed to have aged considerably and therefore its distributions are likely to be very wide and require higher precision reading (step 850).

In summary, six alternative coarse/fine reading methods are described herein, with reference to FIGS. 8,9, 10, 14, 15 and 16 respectively. The method of FIG. 10 relies on standard variation indications obtained from page distribution indication which are typically pre-measured e.g. before page reading begins. The method of FIG. 16 uses metrics computed from the flash page reading its own measurements, using a suitable process such as Read 1, Read 2A or read 3A, to decide whether to employ Soft decoding or hard decoding. These metrics might for example include standard variations computed from flash page reading. The method of FIG. 14 is a partial/conditional hard decoding method which can be used instead of completely executing hard decoding processes e.g. those of FIG. 8, step 101; FIG. 9, step 101; and FIG. 10, step 203. In the method of FIG. 14, partial hard decoding (step 610) is effected. Hard decoding is then completed (step 630) if (step 620) it is likely to be successful. Otherwise (steps 640, 650), soft decoding may be used.

The method of FIG. 15 is another partial/conditional hard decoding method which can be used instead of completely executing hard decoding processes e.g. those of FIG. 8, step 101; FIG. 9, step 101; and FIG. 10, step 203. In the method of FIG. 15, partial hard decoding (step 710) is effected. Hard decoding is then completed if (step 720) it is likely to be successful but may be used only if indeed (step 760) it can be demonstrated retroactively to have been successful. Otherwise (steps 740, 750), soft decoding may be used.

Figure 32:
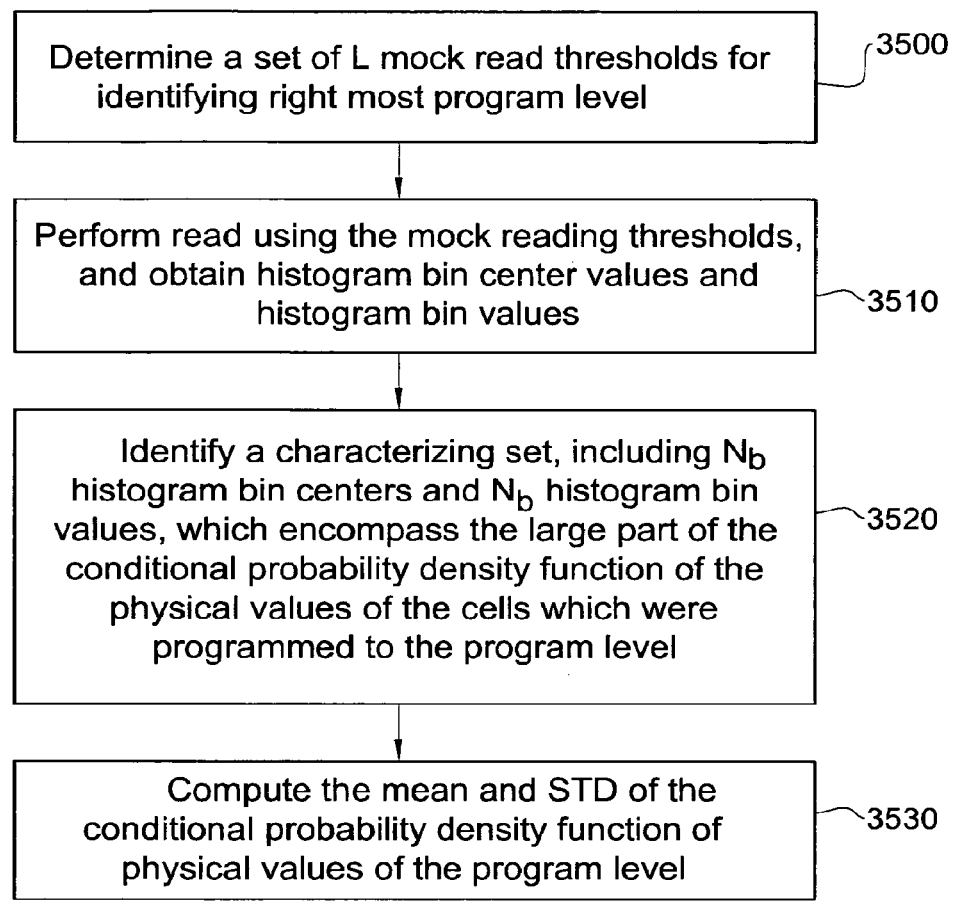
FIG. 32 is a simplified flowchart illustration of a method for computing a mean and standard deviation of a conditional probability density function of physical values of cells programmed to a rightmost program level, the method being operative in accordance with certain embodiments of the present invention.
Figure 33:
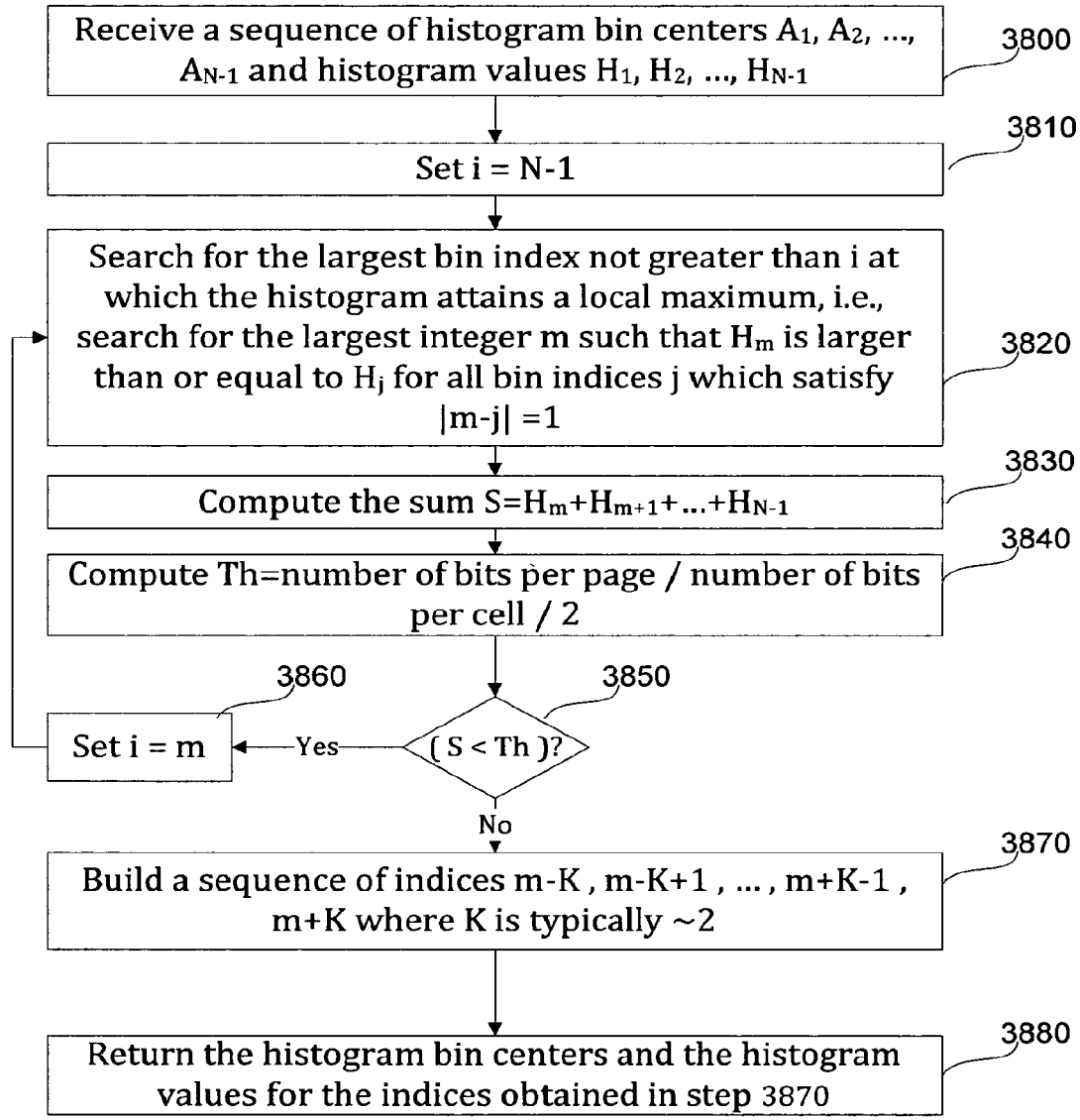
FIG. 33 is a simplified flowchart illustration of a method for identifying a characterizing set of histogram bin centers and corresponding histogram bin values, which encompass the large part of a conditional probability density function of physical values of flash memory cells which were programmed to a particular program level, the method being operative in accordance with certain embodiments of the present invention.
Figure 34:
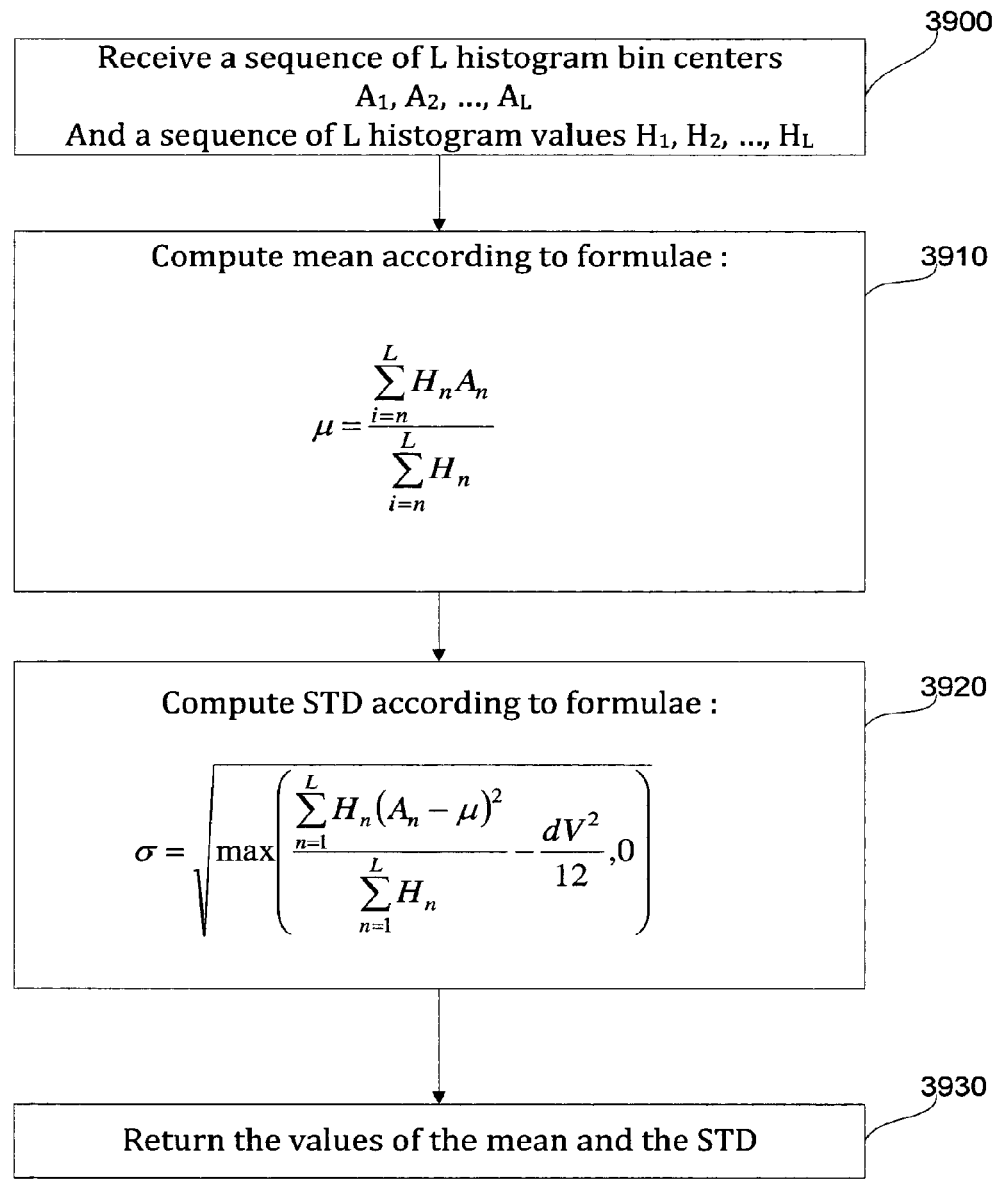
FIG. 34 is a simplified flowchart illustration of a method for computing the mean and standard deviation of the condition probability density function of physical values of a particular program level, the method being operative in accordance with certain embodiments of the present invention.

To estimate the mean and standard deviation of the highest program level, the methods illustrated in FIGS. 32-34 may be used. First, a subset of histogram values is identified, which corresponds to the highest program level. This is done by searching for the first bin from the right at which a local maximum is attained. Regardless of the state of the flash device in question, the first significant maximum from the right always correspond to the highest program level, e.g. as shown in FIG. 32 at step 3520 and in FIG. 33.

Once the maximizing bin is identified, several bins may be taken from either side of that bin and accounted for as belonging to cells in the highest program level. Denote by m* the first bin index from the right at which the histogram posses a local maximum. Then, e.g. as shown in FIG. 5 at step 3530 and in FIG. 34, the mean and standard deviation of the highest program level can be estimated as follows:

$$\mu = \frac{\sum_{k=m^*-N_B}^{m^*+N_B} H(k)A(k)}{\sum_{k=m^*-N_B}^{m^*+N_B} H(k)}$$

$$\sigma = \sqrt{\max\left(\frac{\sum_{k=m^*-N_B}^{m^*+N_B} H(k)(A(k)-\mu)^2}{\sum_{k=m^*-N_B}^{m^*+N_B} H(k)} - \frac{dV^z}{12}, 0\right)}$$

where $N_B$ is chosen on the one hand to guarantee that all the distribution mass of the highest program level is accounted for, and on the other hand to prevent penetration of cells from lower program levels into the computation. The term $$\frac{dV^z}{12}$$

accounts for the quantization noise stemming from the sampling of the histogram.

The method of FIG. 16 is also applicable to applications in which the coarse read operation is a hard read operation. A hard read is equivalent to having a single threshold distinguishing between any two lobes. If these thresholds are set to work with programming levels just following programming, one of the thresholds may be employed to count the number of cells below and above this threshold. Following some time the distribution both shifts and becomes wider. This would cause the number of cells below the threshold to increase. This indication may be employed to decide that retention had affected the cells and the distributions have widened and therefore, finer resolution reading is to be employed.

A soft reading method, for acquiring "soft" measurements, is now described with reference to FIG. 20. In NAND Flash memory arrays an entire page of cells (say 32K cells) is compared at once against a variable threshold. This is done by setting the floating gate to the variable threshold level, applying a voltage on the bit-line and checking whether a current flows through the string (or whether the current is above a predefined threshold). However, this only yields a binary result for each cell. To obtain "Soft" measurements, this process may be repeated several times, each time with a different variable level. For example, if it is desired to obtain 5-bit of "soft" measurements, this process may be repeated 32 times.

In general, to obtain the 5-bits of "soft" measurements the array may first be read 31 times and the information stored in 31 memory buffers (each buffer has the same size as a page). Then soft information may be extracted from the data in the 31 buffers. An alternative method which employs less memory and less buffers (5 or 6 buffers for 5-bits "soft" information) is now described.

One application involves "soft" measurement extraction which is performed on an external controller chip and the NAND flash memory only performs the variable level (binary) comparisons. The result of the binary comparison is then sent to the controller (say, serially, byte by byte). In some implementations the controller may set the compared threshold level by setting some internal register in the NAND memory array chip or by setting an external Digital to Analog Converter (DAC). The controller then generates compare commands and page read commands to obtain the final "soft" information.

Figure 18A:
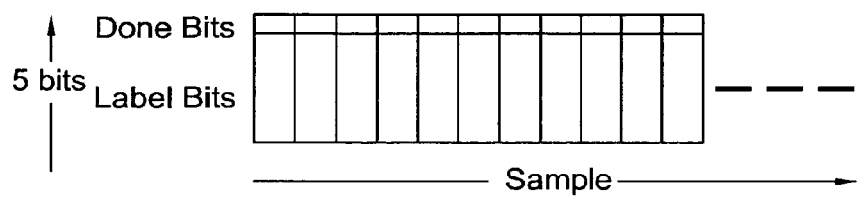
FIG. 18A is a diagram of Labels and Done bits buffers which are useful in certain embodiments of the present invention.
Figure 18B:
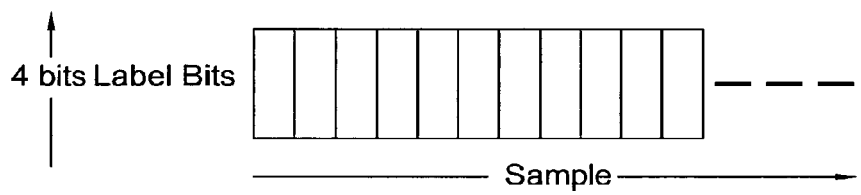
FIG. 18B is a diagram of Labels buffers which are useful in certain embodiments of the present invention.

The goal is to assign each cell to a bin defined by the voltage span between two threshold levels. Each bin is identified by a label. According to the method of FIG. 20 the memory may be sampled using only the buffers used for the labels and an additional done bit buffer. An example of this type of memory organization appears in FIG. 18A. FIG. 18B is a diagram of Labels buffers without the "done bit" buffer which are useful in certain embodiments of the present invention.

In Step 1200, thresholds defining the bins are obtained and sorted from lowest to highest. Also obtained are the labels corresponding to each bin, from the lowest bin up to the highest bin. If the thresholds may be sorted to begin with the sorting step is not needed. In Step 1204 the done bit buffer is initialized so as to identify that none of the cells have yet been assigned to a bin. Steps 1206 to 1224 are then repeated for each of the possible thresholds from the lowest to the highest.

Steps 1210 till 1220 are then performed for each of the cells in a page. One operation per cell is assumed to simplify this example, however, in fact, these steps may be parallelized, performed on 8 cells simultaneously. Such parallelization may be more suitable for state-of-the-art NAND flash interfaces which output the read page result as a serial sequence of bytes. Thus, a compare result would be read as a sequence of bytes. It is assumed that the comparison result of a cell is '0' if the gating threshold of the cell is higher than the threshold being compared and '1' if it is lower. Using that notation, if the comparison result for a cell is a '1', the final label associated with it cannot yet be determined. If it is a zero and the done bit is not yet set, the corresponding cell is assigned the label corresponding to the bin defined by the space between the precious threshold and the current one (step 1216). The end result is that the first comparison change from "1" to "0" is always detected.

Figure 20:
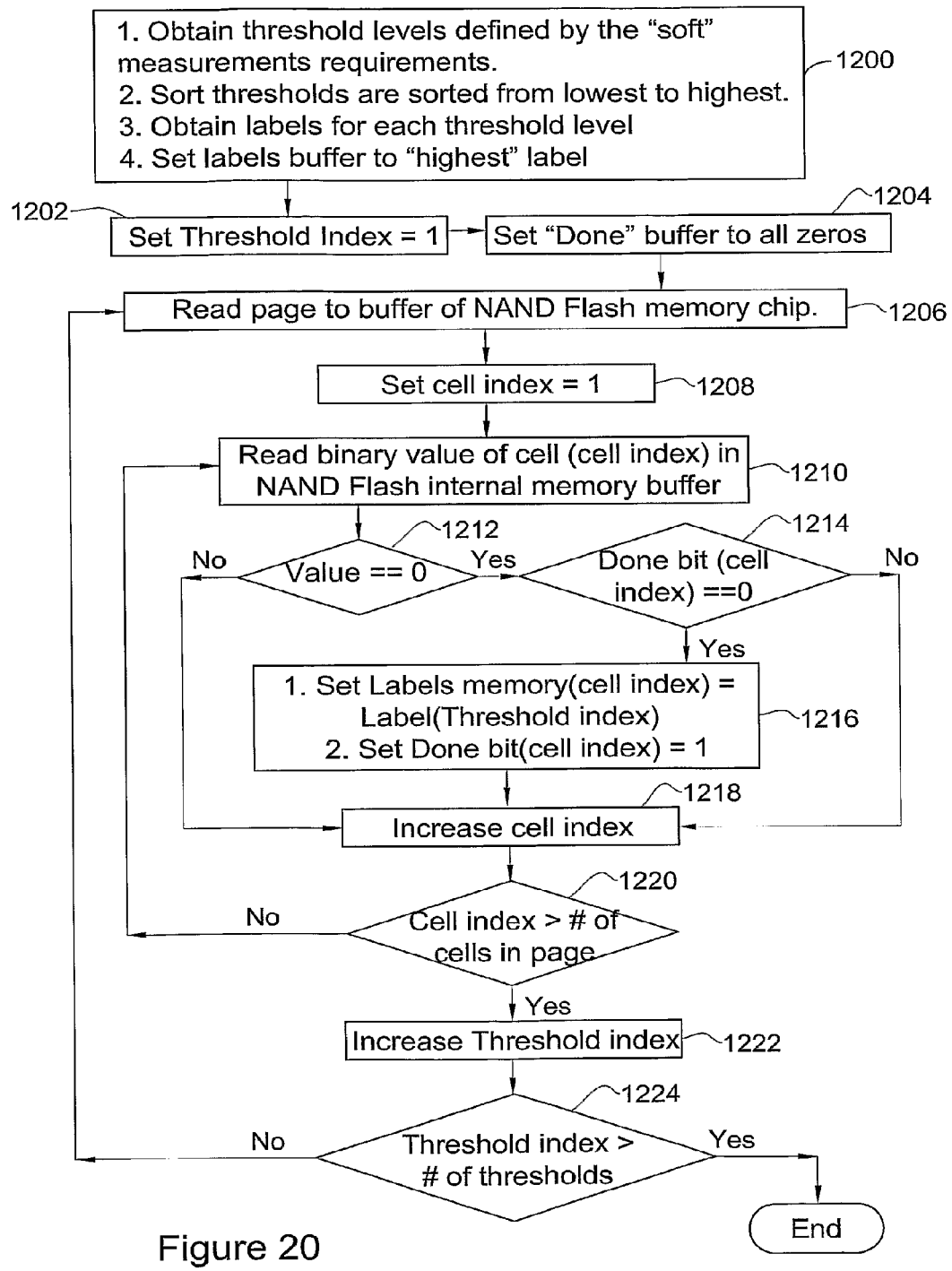
FIG. 20 is a simplified flowchart illustration of a method for Soft sampling using done bits, operative in accordance with certain embodiments of the present invention.

The method of FIG. 20 may be modified to work with several different scenarios. For example, the process may start from the highest threshold down to the lowest threshold. In that case the comparison in step 1212 would be to '1' instead of '0'. In another implementation, the done bit initialization step (1204) may be skipped by adding an initialization per cell which occurs only during the first threshold iteration.

Figure 21:
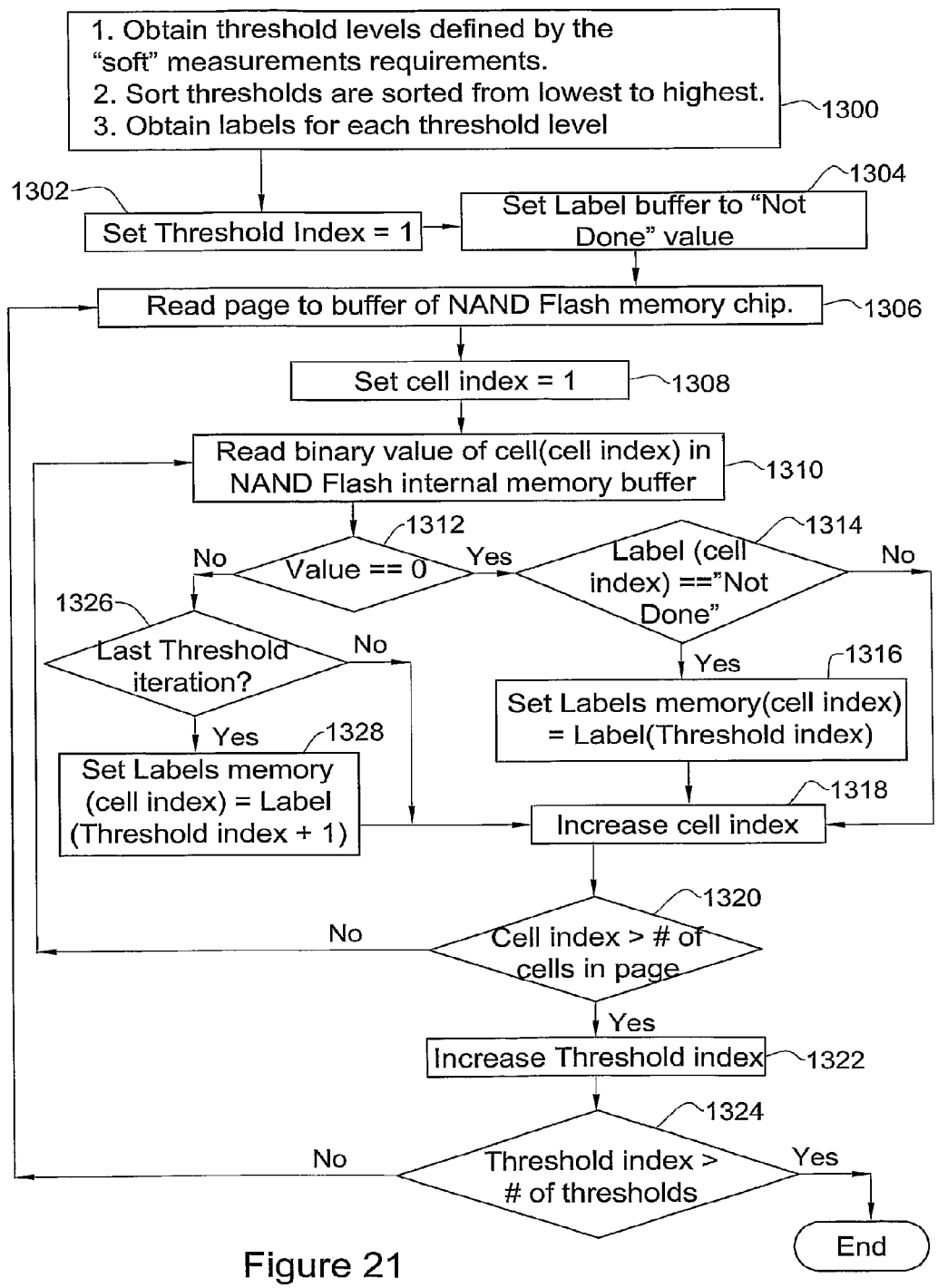
FIG. 21 is a simplified flowchart illustration of a method for Soft Decoding without a Done bit, operative in accordance with certain embodiments of the present invention.

Alternatively, the done bit buffer may be omitted as shown in the method of FIG. 21. In the method of FIG. 21, one of the labels is replaced with a label signifying "Not Done". The check of the not done bits is replaced with a check of a "Not Done" label. The case where all comparisons resulted in a "1" is labeled; during the last iteration the labels are set to the label signifying the highest bin.

Figure 22:
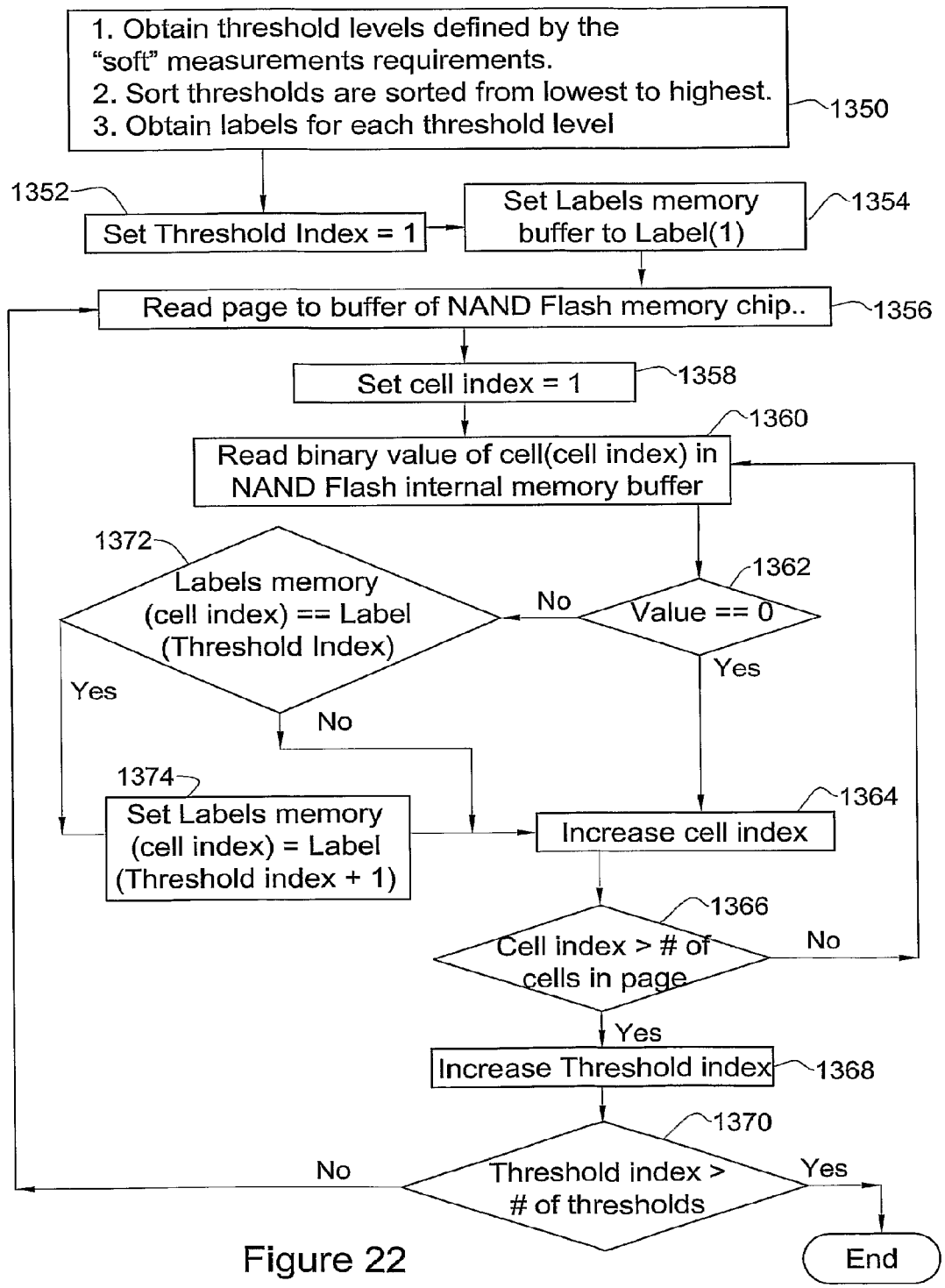
FIG. 22 is a simplified flowchart illustration of a method for soft sampling without a done bit and without using one of the labels for "Not Done", operative in accordance with certain embodiments of the present invention.

Yet another alternative method is that illustrated in FIG. 22 which does not use the Done bits buffer and does not even sacrifice one of the labels for the sake of defining a "not done" state. Instead, the memory label buffer is always set to that defined by the next threshold, as long as the comparison yields a "1" (below threshold) and as long as the previous value corresponded to the label of the current threshold. The end result is detection of a first change from a "1" to "0". When step 1372 is absent, a new method results which implements detection of the last change of "1" to "0".

Figure 19:
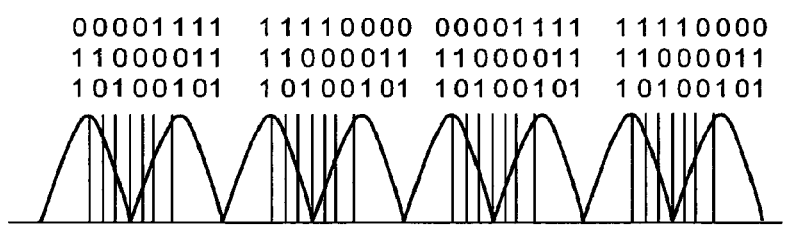
FIG. 19 is a diagram of Label assignment for the LSB page in a multi-level cell case, where each cell assigned to 3 different pages, all in accordance with certain embodiments of the present invention.

The above 'soft' reading may also be applied for the case where each cell is a multi-level cell and each physical row of cells contains two or more pages stored as least significant bits (LSB), most significant bits (MSB) and so on. Several bins are assigned the same labels as shown in FIG. 19. To clarify, FIG. 17 illustrates an example of a possible table of labels, corresponding to the thresholds. From the table of FIG. 17 it is apparent that only three bits may be employed to identify each label. 28 thresholds are employed. Using the method of FIG. 20, only 4 buffers may be employed, since each buffer is a bit wide. Furthermore, it is apparent from the choice of labels in the table of FIG. 17 that the first bit of each label identifies the 'hard' value of the bit.

It may be the case that a comparison result is not a deterministic one. That is, due to noise at the sense amplifiers of the NAND arrays, if the compared threshold voltage is close to that of the cell itself, the result may toggle between '0' and '1' following repeated comparisons with the same threshold. Therefore, if there is a sequence of threshold comparisons where the thresholds are close to one another, during a sequence of comparisons from the lowest to the highest threshold, the comparison results of some of the cells may change twice from a '1' to '0'. It may not be desirable to use the label allocated for either the first or second change; instead, it may be desirable to allocate a label defined by the average of those bin locations as shown in the method of FIGS. 23A-23B.

Figure 23A:
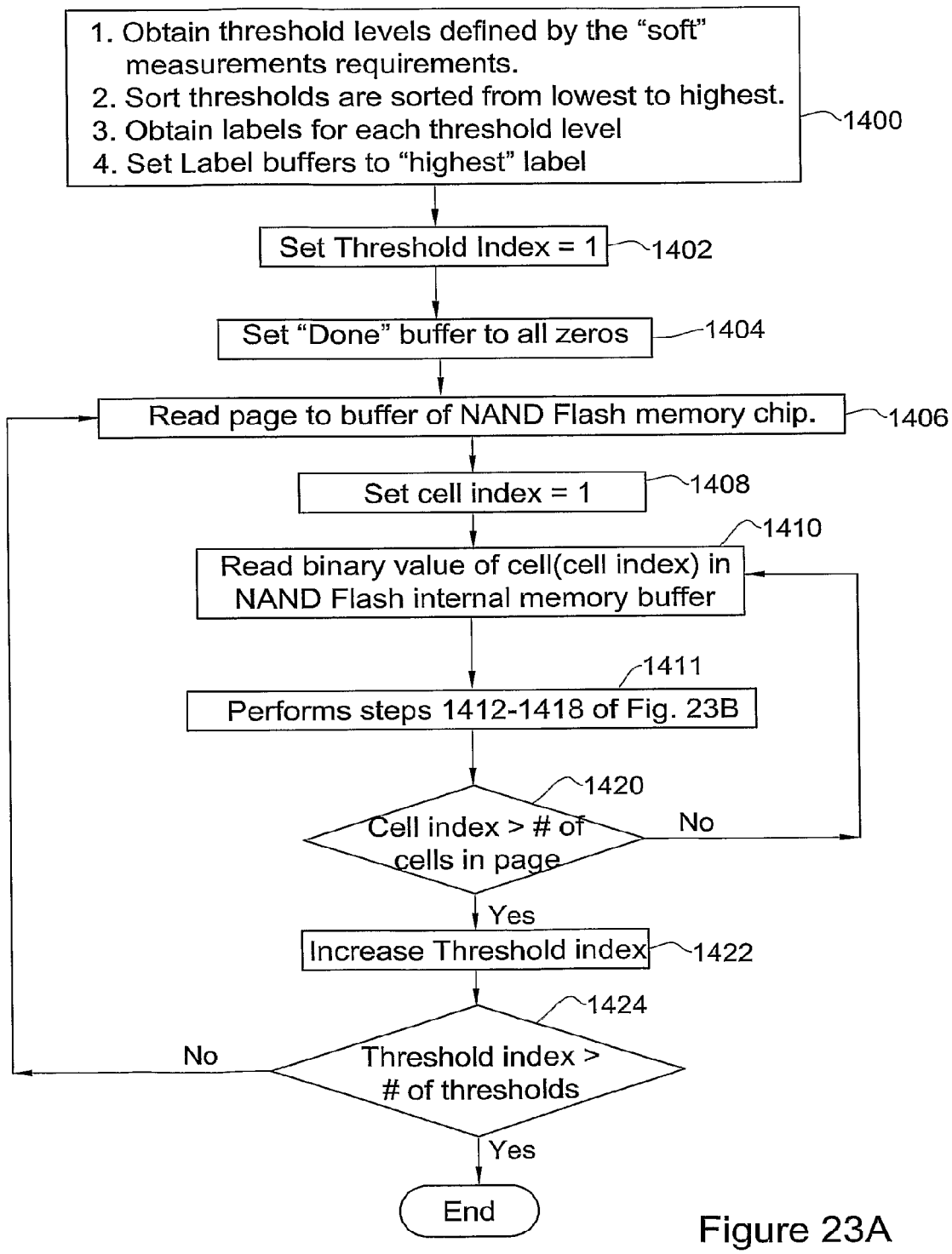
FIGS. 23A-23B, taken together, form a simplified flowchart illustration of Soft sampling with multi comparison result changes, operative in accordance with certain embodiments of the present invention.
Figure 23B:
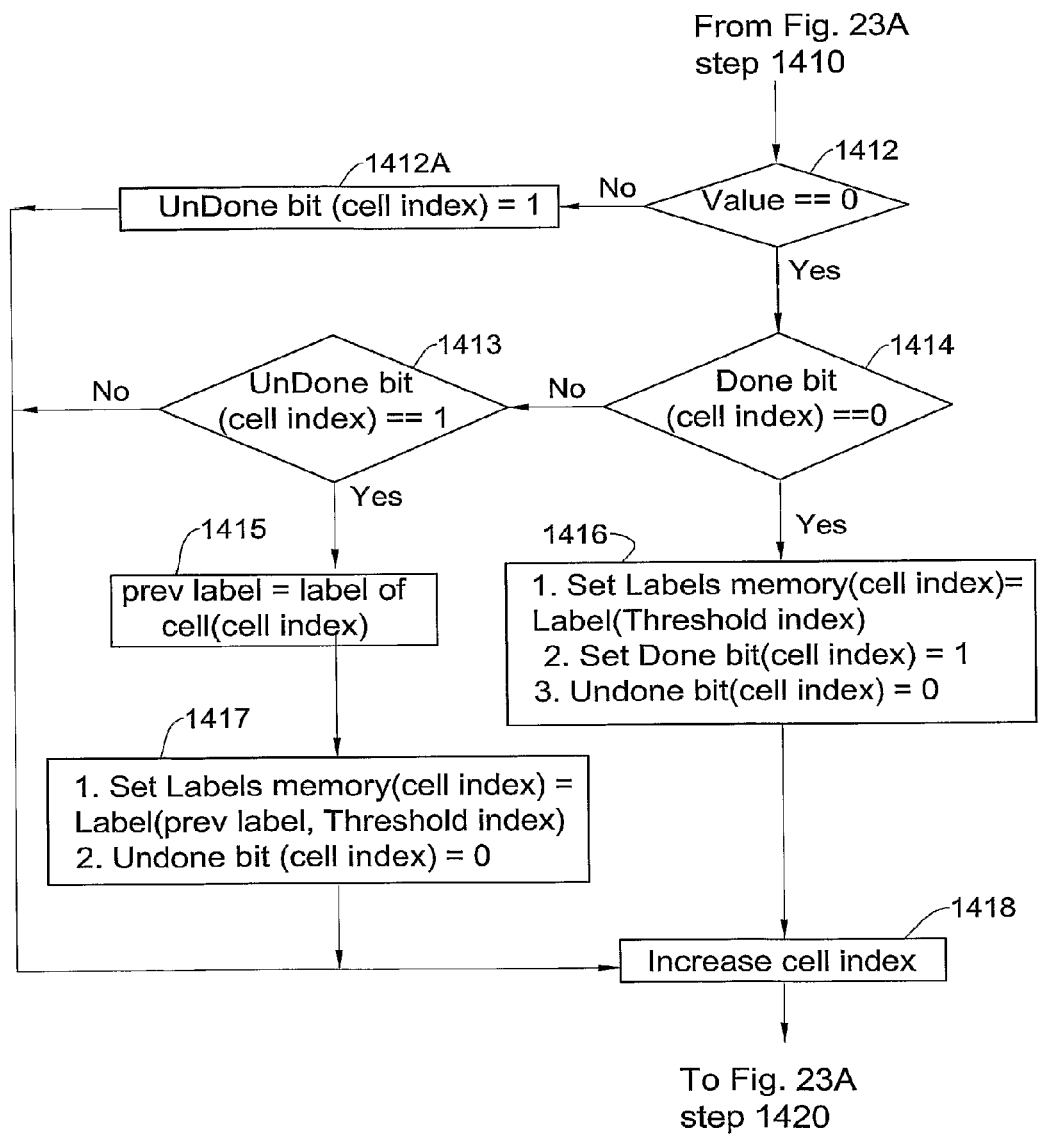

The method of FIGS. 23A-23B is also characterized by use of an un-done buffer which identifies whether a change from a 1 to a 0 has been observed; and/or a secondary label table, on-top of that described above, which typically includes several sub-tables, each associated with a different label. Thus, if the done bit is already set, and the undone bit identifies a second change from a 1 to 0, the secondary table can be used to decide on the value of the label allocated to the cell, depending on the label currently associated with the cell. By setting the label table accordingly, a label which identifies the middle ground between the two bins may be associated with the 1 to 0 change.

Intermediate decoding results may be obtained for a Fine decoding stage.

A multi-stage decoding scheme for Flash memories using BCH codes is now described with reference to FIGS. 24A-28.

A coding and decoding system is now described which is capable of performing both hard and soft decoding. The system is characterized in that both encoding and decoding are performed with relatively little complexity and are easily realized on a small silicon die.

Figure 24A:
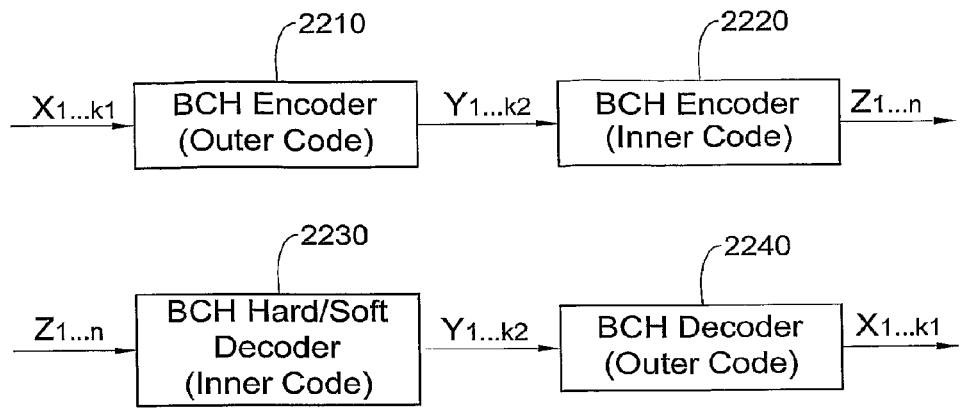
FIG. 24A is a simplified functional block diagram of a Multi-Stage Encoder/Decoder which is useful in certain embodiments of the present invention.

The Code structure of the system is first described. The code typically comprises a concatenation of two BCH codes, e.g. as described in the above-referenced Blahut publication and as shown in FIG. 24A. In the example embodiment described herein, the inner BCH encoder 2230 has a minimum distance of 3. That is, during 'hard' decoding up to one error in each of the inner code's packets can be corrected. The inner code can also be decoded with soft information as described hereinbelow. The outer code 3210 typically comprises a BCH code capable of correcting several errors and therefore has a larger redundancy.

Figure 24B:
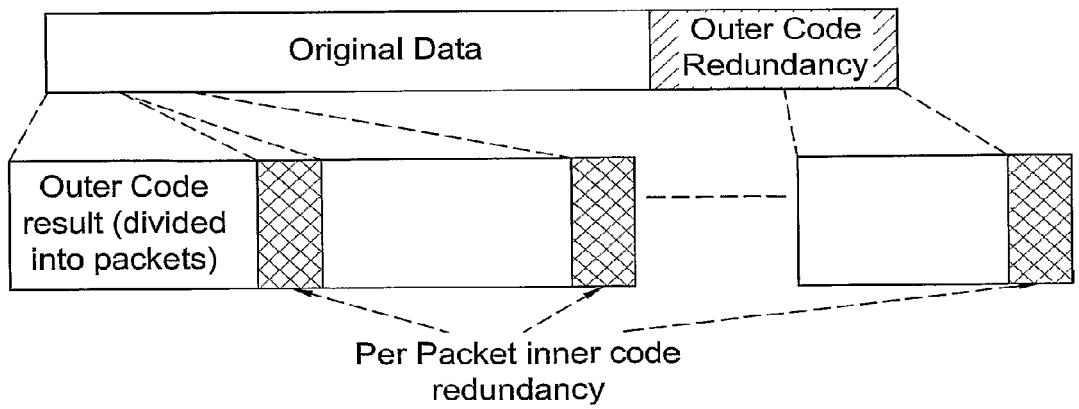
FIG. 24B is a diagram of a Code word structure for the encoder/decoder of FIG. 24A.

The encoding process typically comprises the following steps:

a. The data, containing k1 bits, is encoded using the outer encoder 2210. The outer encoder 2210 appends redundancy bits to the data, as shown in FIG. 24B, thus producing a codeword of overall (together with the data bits) k2 bits.

b. The k2 bits produced by the Outer encoder 2210 are partitioned into short packets (say V bits each). Each packet is appended with a short redundancy by the BCH encoder. Thus, the inner encoder produces Y bits from every V bits, as shown in FIG. 24B. After concatenating all the packets together, the result is a codeword of an overall of n bits. k1, k2, V, Y and n are all integers; k2>k1; Y>V.

The decoding process typically comprises some or all of the following steps, suitably ordered e.g. as shown:

c. The codeword is fragmented into packets. Each packet is decoded using the inner BCH decoder (using 'hard' decoding). Thus, for each packet, the decoder produces V corrected bits.

d. The corrected packets are concatenated (only the V bits, without the inner code redundancy) and decoded using the outer code which produces k1 bits of data.

e. Determine whether or not the decoding is successful. This may be detected if a CRC check on the data fails or may be detected by the outer decoder 2210.

f. If step (e) finds that the decoding is successful, the decoding process ends here. Otherwise, continue with steps (g)-(i). Alternatively, check intermediate results such as whether the inner code corrected a large number of errors (above a certain threshold). If this is the case, the method may not decode the outer code at all before performing soft decoding. Alternatively or in addition, the degree of the error locator polynomial (ELP) may be checked during decoding of the outer code. If the degree is too high, soft decoding may be performed without first effecting a Chien search.

g. The data is reread with higher accuracy, i.e. soft information is read.

h. The soft information is fragmented into packets. Each packet is decoded using the inner BCH decoder 2230 using 'soft' decoding. Thus, for each packet, the decoder produces V corrected bits.

i. Steps (e) and (f) are repeated with the newly decoded packets.

Example:
1) The codeword length: n=17406.
2) Data length: k1=16416 (2048+4 bytes where the extra 4 bytes may be used for a CRC check).
3) The outer code is a (17091, 16416, 91) BCH designed over the finite field $GF(2^{15})$. The code is capable of correcting 45 errors and appends 45*15 bits of redundancy to the 16416 bits of data.
4) The Inner code is an (511,501,3) BCH code that appends 9 bits of redundancy to every 1013 bits of data. The code is capable of correcting 1 error. Therefore, the output of the Outer code is partitioned into packets of 501 bits (the last packet is 228 bits which is zero padded with 0 bits to obtain 501 bits). Then, each packet is appended with 9 bits and the coded packets are all concatenated together to form the codeword of length 17406 bits.

Soft decoding of the inner code is now described. As the inner code has relatively a short redundancy (in the example above it is only 9 bits) and the 'hard' correction capability is limited (one error), there exist efficient methods for performing soft decoding for this BCH code. For example, Maximum Likelihood decoding may be performed by using a Viterbi-like algorithm e.g. as described in the above-referenced Wolf publication. Sub-optimal decoding can achieve almost optimal performance in this case. Examples of sub-optimal decoding appear in the above-referenced Chase publication.

An example of sub-optimal 'soft' decoding of the inner code is now described. The decoding procedure relies on the fact that the code has a short redundancy and therefore, can only correct a limited number of errors using 'soft' decoding. Thus, it is possible to use suitable methods of enumeration, to find a sequence of errors which is most likely. One such method is illustrated in FIGS. 25A-25B.

Figure 25A:
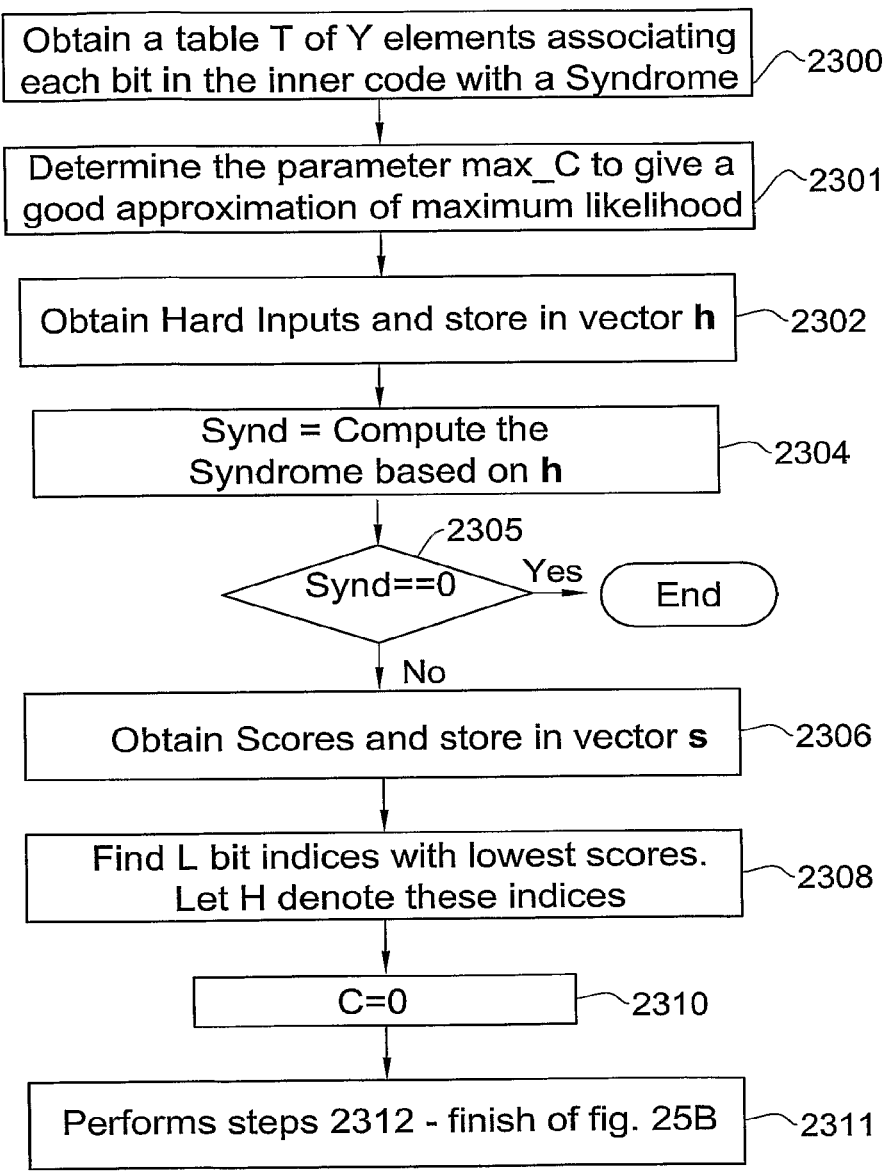
FIGS. 25A-25B, taken together, form a simplified flowchart illustration of approximated soft decoding, operative in accordance with certain embodiments of the present invention.
Figure 25B:
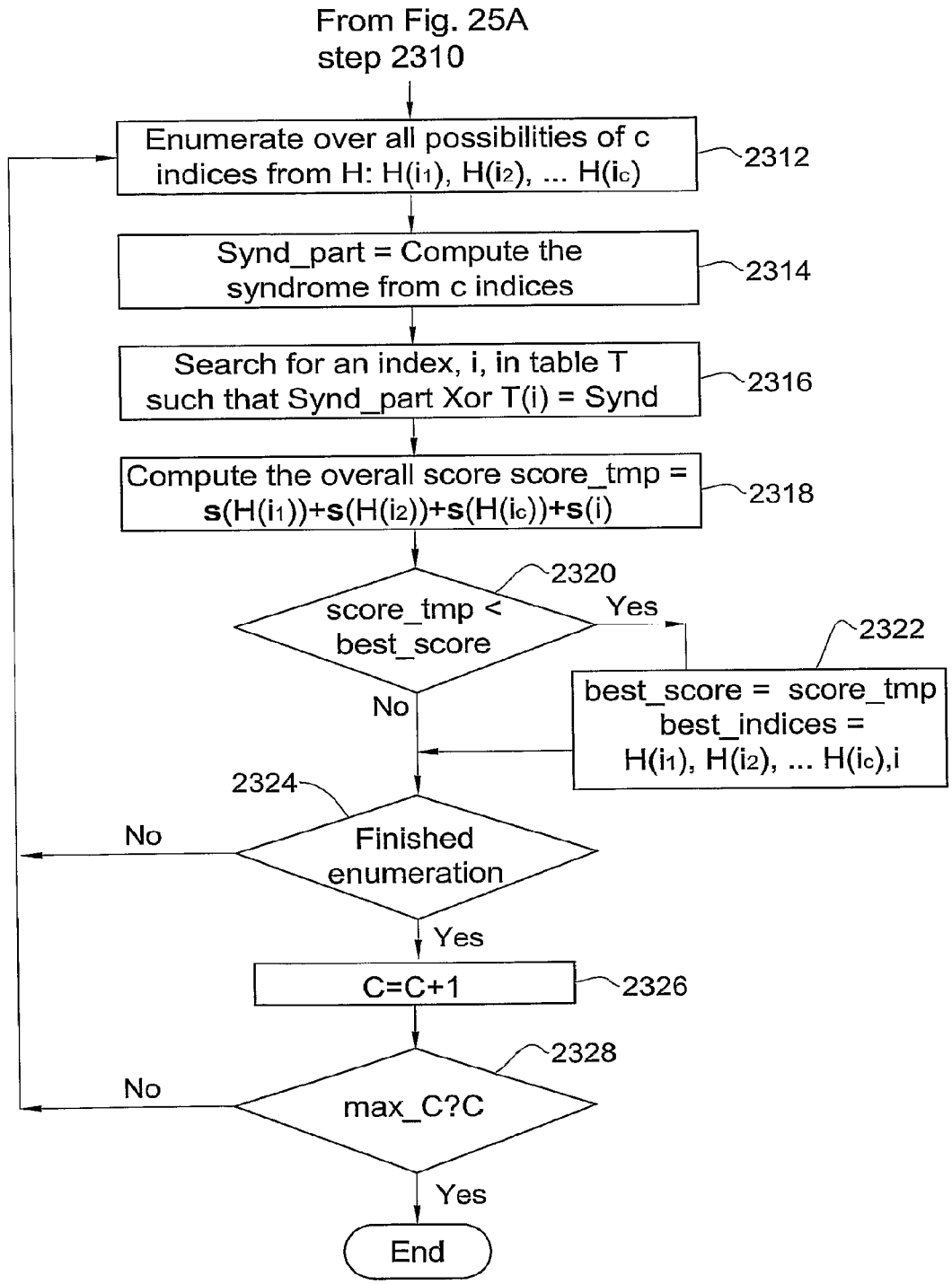

In step 2300 in FIG. 25A, a table, e.g. as shown in FIG. 27, is created which associates any bit of the codeword of the inner code with a syndrome letter. Let $\alpha$ be primitive value in $GF(2^m)$. The associated syndrome is defined by $\alpha^{Y-i-1}$ and the codeword length, Y, is smaller than or equal to $2^m-1$. Next, compute the syndrome, e.g. conventionally as defined by $Synd=\Sigma_{i=0}^{Y-1} h(i) a^{Y-1-i}$. All computations are made over the field $GF(2^m)$ and h(i) signifies the i'th bit in h. The following steps in FIGS. 25A-25B show how the enumeration is localized to the most likely candidates (the L indices with the smallest scores).

FIG. 27 is an example of a table associating each bit index of an inner codeword with a syndrome as is seen in the first and last columns of the table. This table refers to a BCH code over the filed $GF(2^5)$ where the primitive polynomial is $X^5+X^2+1$ and the primitive element is $\alpha$=b00010.

Referring again to FIG. 25A, in step 2401, a parameter max_C is obtained which determines the number of overall iterations. This parameter is determined during simulations to minimize this parameter and still obtain a result similar to that of a Maximum Likelihood decoder. Another parameter is L. This parameter determines the size of the group of indexes which is to be searched for errors. This parameter is optimized in a similar manner.

Hard data is obtained from the Flash device (step 2402) and stored in a vector h e.g. as shown in FIG. 27, in an example which pertains to a case in which the inner codeword is 2^5−1 long. The syndrome is computed as described above in step 2404. If the syndrome is 0, it is concluded that there was no error and the method terminates exit (step 2405). If the syndrome is not 0, the scores of each detected bit are obtained (step 2406). A numerical example of the result of this step is illustrated in the table of FIG. 27 which includes the scores for an exemplar where the inner codeword is 2^5−1 bits long.

Figure 26A:
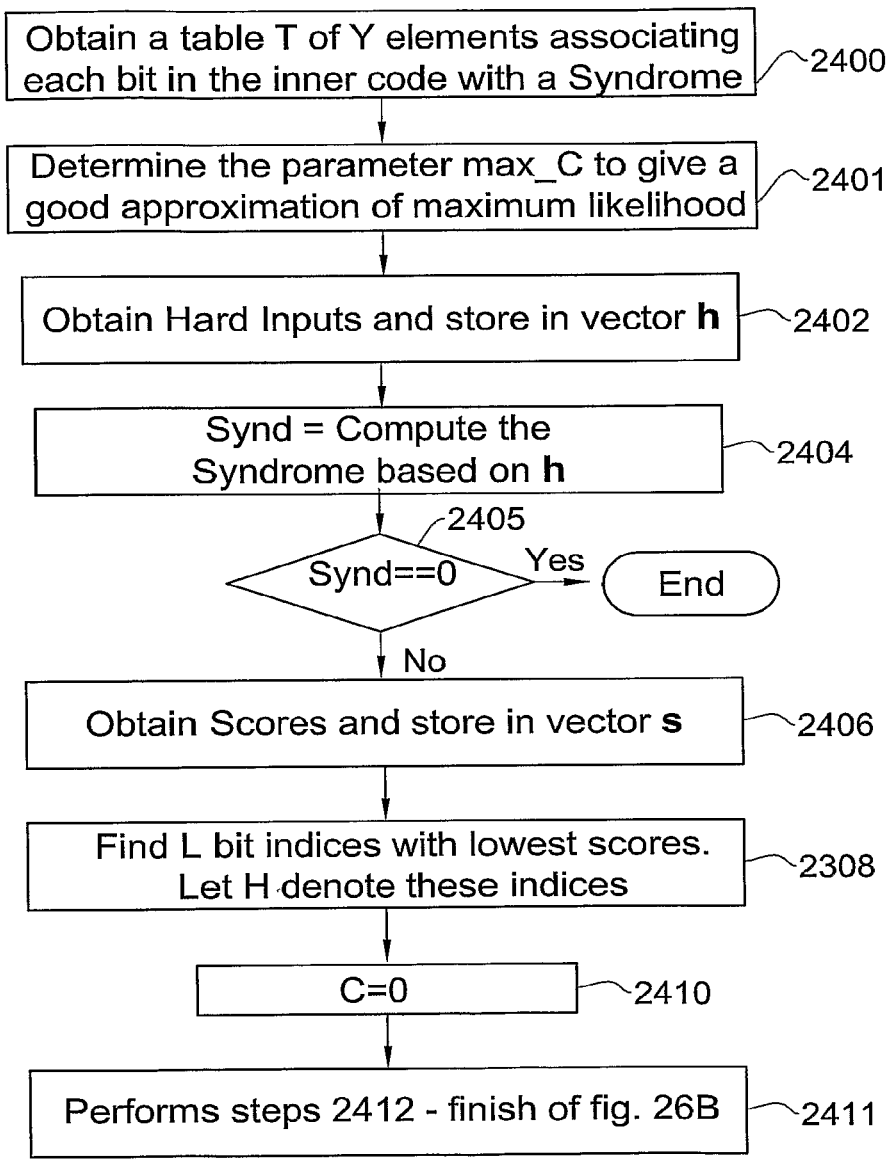
FIGS. 26A-26B, taken together, form a simplified flowchart illustration of a soft decoding procedure with early termination of loop, operative in accordance with certain embodiments of the present invention.
Figure 26B:
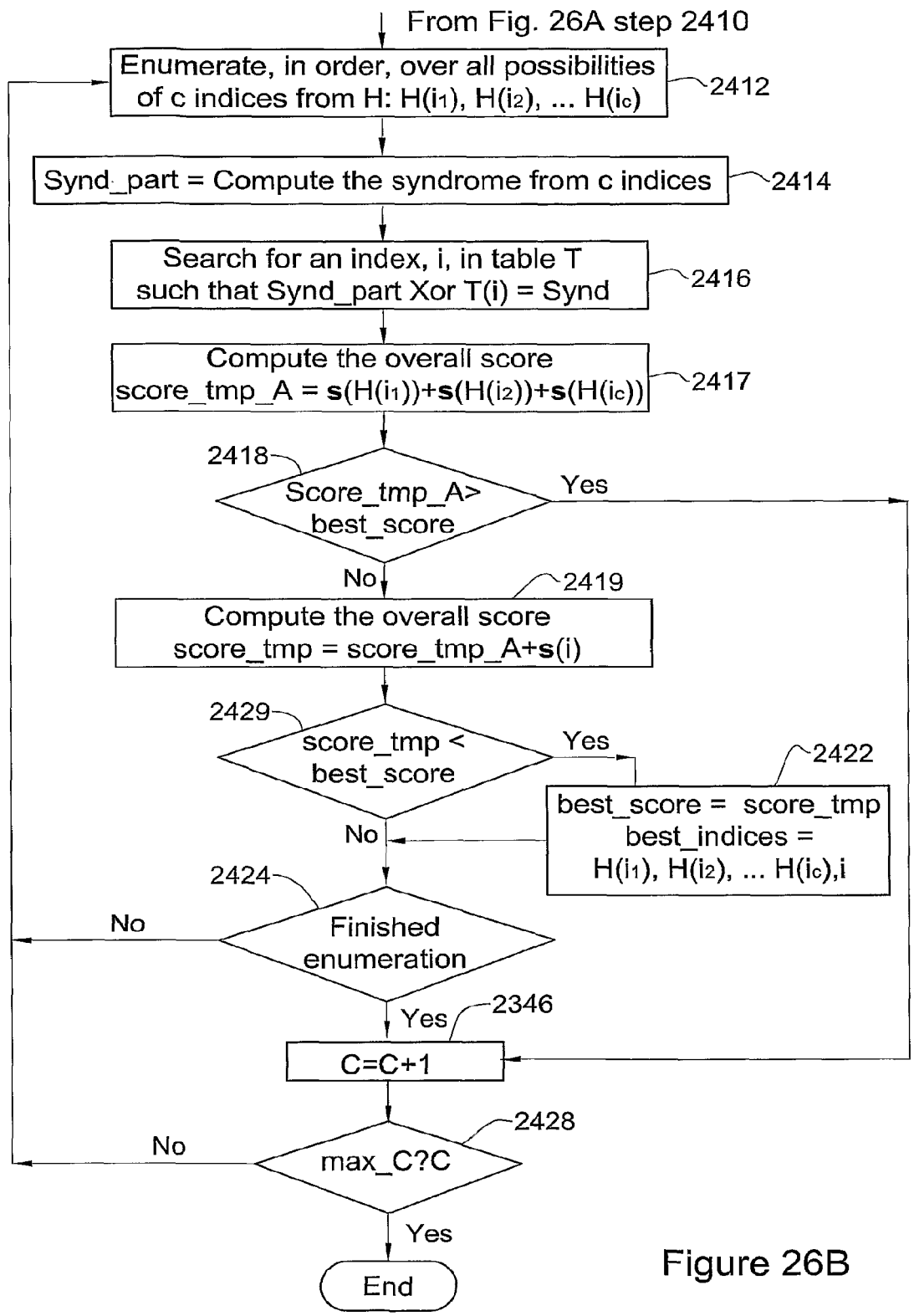

For this exemplar, the syndrome computation will yield Synd=b00011. In step 2408 the L bit indexes with the smallest score are obtained. An example is shown for the exemplar in FIG. 27 and for the case where the L=5, H (the set of L indexes with the lowest scores) would be H={4, 10, 15, 20, 24} and their corresponding scores are {20, 2, 1, 30, 40}. Steps 2412-2428 of FIG. 26B are then repeated max_C times where max_C is the maximum number of errors that may be detected and C+1 is the current number of errors being searched for. In the example of FIG. 27 it is assumed that max_C=2.

In step 2412 of FIG. 26B, a set of C indexes are generated from the set H and their respective syndrome is computed. For the case where C=0, this step does not take effect. For the case of C=1 and for the case of L=5 and the exemplar of FIG. 27 there are 5 iterations with indexes chosen as 4, 10, 15, 20 and 24 (based on H). In step 2414, the effect on the syndrome is calculated for each of these cases giving by way of example the following respective results: b01011, b11000, b11011, b00111 and b10100. In step 2416, an additional bit index is calculated that yields an overall syndrome of 0. This computation can be made via an inverse syndrome table such as the one shown in FIG. 28 where the index to the table is calculated as Synd Xor Synd_part. In the example shown herein the first iteration yields the following result Synd Xor Syndpart=b00011, yielding the error index 13. The second iteration (C=1) yields the following 5 results Synd Xor Synd_part=b01000, b11011, b11000, b00100 and b10111 which in turn yield the following indexes for the pair error locations ({4,28}, {10,15}, {15,10}, {20,29} and {24,5}).

In step 2417, the score of each possible error sequence is calculated. For example, for the first iteration (C=0) the score is 50. For the second iteration, the scores of each of the found pairs are given by 70, 3, 3, 80 and 90 respectively. The value of the smallest score and the appropriate error sequence is stored in steps 2420 and 2422. By the end of the C iterations, it is possible to give a good estimate of the most probable error sequence and following the termination of this procedure the bits corresponding to this error sequence are flipped. For example, in the exemplar of FIG. 27, the most probable error sequence is the pair {10,15} as indeed is the case.

The procedure described in FIGS. 25A-25B can be modified by allowing an early termination of the loop defined by steps 2412-2424, as shown in FIG. 26B. This is done by sorting the indexes of the L lowest scores according to the scores starting from the lowest up to the largest. The inner enumeration performed by steps 2412-2424 is effected on sequences of C error indexes such that the sum of scores of the c elements (i.e. score_tmp_A=$s(H(i_1))+s(H(i_2))+s(H(i_c))$) rises as the enumeration progresses. Then, if it is detected that the best score so far is smaller than the sum of scores of c elements (step 2418), enumeration is terminated and c is then increased, or the search terminated.

The term "soft decoding" as used herein is intended to include a process which receives input from a precursor "sampling" process in which physical values residing in flash memory cells are sampled, and the reliability with which each cell is sampled is estimated, generating a reliability score for each cell. In soft decoding, a decision is made, based on the sampled data and reliability scores generated in the sampling process, as to which bits contain errors. Each such erroneous bit is flipped, thereby to generate correctly reconstructed data. It is appreciated that either the soft decoding method of FIGS. 25A-25B, or the soft decoding method of FIGS. 26A-26B, may serve as a method of operation for the inner code block 2230 of FIG. 24A.

The term "concatenation" of codes is used herein to refer to outer and inner codes, the latter of which is used to encode the output of the other. The outer code encodes data for storage in flash memory, generating first redundancy bits, and the inner code encodes the data and its first redundancy bits, generating second redundancy bits. When decoding, the inner code's decoder is used first, followed by the outer code's decoder.

One implementation of the soft decoding functionality in block 2230 of FIG. 24A is now described in detail, with reference, again, to FIGS. 25A-25B. It is appreciated that decoding block 2240 of FIG. 24A may comprise a conventional BCH decoder. Typically, a reasonable cap, max_C, is determined on the unknown number of errors C in each codeword generated by the sampling process preceding the soft decoding process, e.g. by setting max_C to the number of errors per codeword that would tend to occur if a conventional maximum likelihood method were to be used for decoding. Max_C is typically an integer such as for example 5.

Figure 3B:
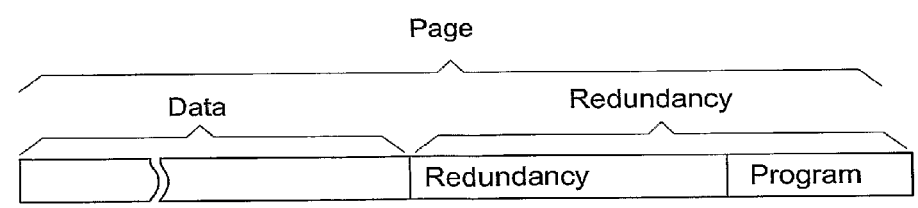

A syndrome is computed per codeword; it is appreciated that each physical page in flash memory typically includes many codewords such as 32 or 128 codewords. If the syndrome is 0, the method of FIG. 3 is finished because this indicates that there are no errors in the codeword. If the syndrome is not zero, the number of errors in the codeword can be anywhere from 1 to the reasonable maximum number of errors namely max_C. Typically, a table T of Y elements is obtained, associating each bit of a codeword generated by the inner code from clear content, with a syndrome.

If the number of errors in the codeword is 1, then at least some of the bits in the codeword may be processed to find those bits which when individually flipped, cause the codeword to yield a syndrome of 0. Either all of the bits may be processed to find such bits, or alternatively, in an effort to achieve processing speed with a certain decrement in accuracy or reliability, only those bits in the codeword having low reliability scores, which are most likely to contain errors, may be processed to find such bits.

Each such bit is given a score which equals that bit's reliability score. The possibility that there is one error, is assigned an error-number-score corresponding to that bit which, if flipped, resets with word's syndrome.

If the number of errors in the codeword is 2, then at least some of the bits in the codeword may be processed to find those pairs of bits which, when both are flipped, cause the codeword to yield a syndrome of 0. Either all of the bits may be processed to find such bit pairs, or alternatively, in an effort to achieve processing speed with a certain decrement in accuracy or reliability, only those bits in the codeword having low reliability scores, which are most likely to contain errors, may be processed to find such bit pairs. The low reliability scoring bits may be the b bits in the codeword whose reliability scores are lowest i.e. the lowest b bits in the codeword if the bits are ranking in ascending order of their reliability scores. The parameter b is selected to be relatively large if it is desired to maintain accuracy at the expense of speed and relatively low if it is desired to sacrifice accuracy for speed. For example, if the codeword includes 255 bits, b may be 30 or 100, yielding a speed advantage in the former instance and an accuracy advantage in the latter instance.

Each such bit pair is given a score which equals the sum of the reliability scores of the two bits in the bit pair. The possibility that there are two errors in the codeword, is assigned an error-number-score which is the smallest bit pair score from among all bit pairs found. Therefore a bit pair whose score is smallest is deemed to be the erroneous bit pair if indeed the number of errors in the codeword is 2.

The above process may be repeated for the possibilities that the number of errors in the codeword is 3, 4, and so forth respectively, all the way to C_max which in the example followed herein is 5. For this last case, then, the procedure may be: If the number of errors in the codeword is 5, then at least some of the bits in the codeword may be processed to find those sets of 5 bits which, when all are flipped, cause the codeword to yield a syndrome of 0. Either all of the bits may be processed to find such bit sets, or alternatively, in an effort to achieve processing speed with a certain decrement in accuracy or reliability, only those bits in the codeword having low reliability scores, which are most likely to contain errors, may be processed to find such bit sets (bit quintuples).

Each such bit set is given a score which equals the sum of the 5 reliability scores of the 5 bits in the bit set respectively. The possibility that there are five errors in the codeword, is assigned an error-number-score which is the smallest bit set score from among all bit quintuples found. Therefore a bit set whose score is smallest is deemed to be the erroneous bit set if indeed the number of errors in the codeword is 5.

The issue of whether the number of errors in the codeword is 1 or 2 or . . . or C_max, is now resolved. Typically, the number of errors is assumed to be the possibility whose error-number-score is lowest, over all possibilities. For example, if C_max is 5 and the error-number-scores of the following numbers of errors: 1, 2, 3, 4 and 5, for a particular codeword, are 9, 8, 10, 20 and 30 respectively, then the number of errors in the codeword may be assumed to be 8 because the error-number-score for the "2 errors" possibility is 8, lower than the error-number-scores assuming that the number of errors is 1, 3, 4 or 5, namely 9, 10, 20 and 30 respectively. The locations of the errors is assumed to be the bits in the bit-set which yielded the lowest error-number-score. These bits are flipped to correct the error. In the above example, the location of the 2 errors which are assumed to have occurred in the codeword, are taken to be the 2 bits in the bit-pair which yielded a bit set score of 8; these 2 bits are flipped.

More generally, it is appreciated that the soft decoding process may comprise the following steps:

a. determining a reasonable cap, integer max_C, on the unknown number of errors C.
b. computing a syndrome for the codeword;
c. unless the syndrome equals zero in which case the process is terminated, perform the following steps i-iii for c=1, . . . max_C:
 i. finding at least one set of c bits in the codeword which, when flipped, zero the syndrome;
 ii. giving a set score to each set of c bits by summing the reliability scores of all bits in the set; and
 iii. assigning an error-number-score by minimizing over the set scores of all sets of c bits found in the finding step;
d. determining the unknown number of errors C, to be the c yielding the smallest error-number-score;
e. for the set of c bits having, among all sets of c bits found for c=C, the smallest set score, flip all c bits.

Figure 29:
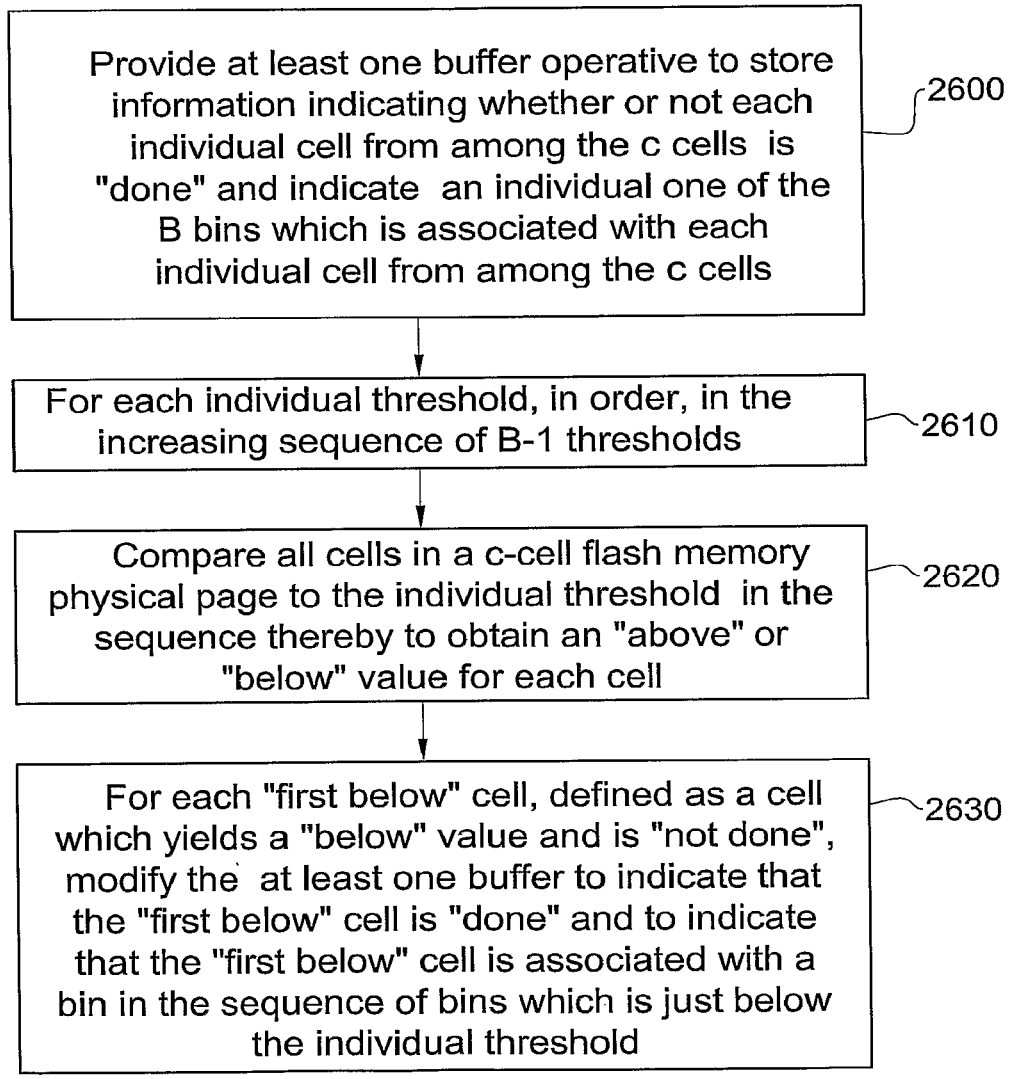
FIG. 29 is a simplified flowchart illustration of a method for reading Flash memory apparatus having c cells using an increasing sequence of thresholds defining a sequence of bins, operative in accordance with certain embodiments of the present invention.

FIG. 29 is a simplified flowchart illustration of a method for reading Flash memory apparatus having c cells using an increasing sequence of thresholds defining a sequence of bins, operative in accordance with certain embodiments of the present invention. The method of FIG. 29 typically comprises some or all of the following steps, suitably ordered e.g. as shown:

Step 2600: provide at least one buffer operative to store information indicating whether or not each individual cell from among the c cells is "done" and indicate an individual one of the B bins which is associated with each individual cell from among the c cells.

Step 2610: for each individual threshold, in order, in the increasing sequence of B−1 thresholds:

Step 2620: compare all cells in a c-cell flash memory physical page to the individual threshold in the sequence thereby to obtain an "above" or "below" value for each cell Step 2630: for each "first below" cell, defined as a cell which yields a "below" value and is "not done", modify the at least one buffer to indicate that the "first below" cell is "done" and to indicate that the "first below" cell is associated with a bin in the sequence of bins which is just below the individual threshold.

Figure 30:
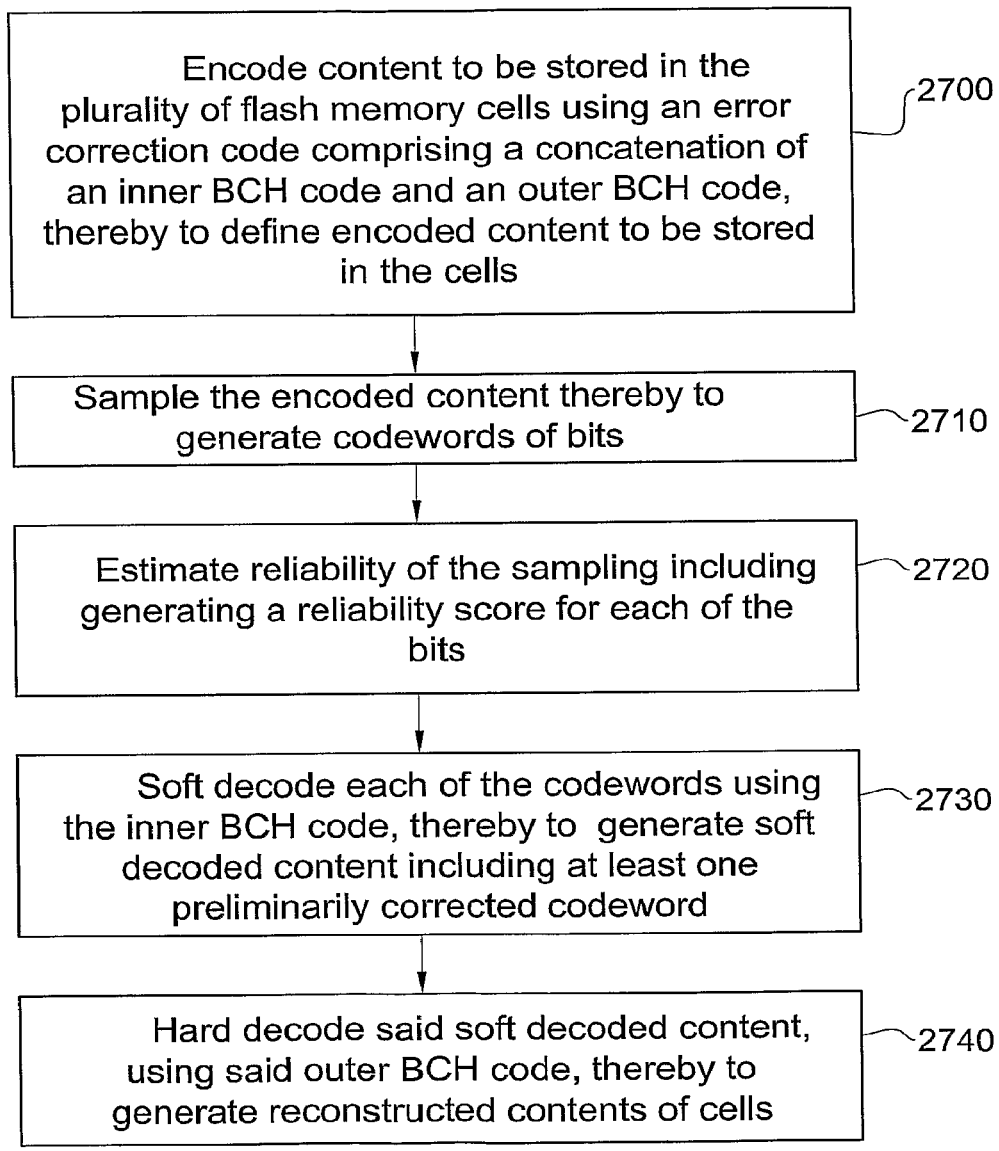
FIG. 30 is a simplified flowchart illustration of a method for error-correction encoding and subsequently decoding a plurality of flash memory cells, operative in accordance with certain embodiments of the present invention.

FIG. 30 is a simplified flowchart illustration of a method for error-correction encoding and subsequently decoding a plurality of flash memory cells, operative in accordance with certain embodiments of the present invention. The method of FIG. 30 typically comprises some or all of the following steps, suitably ordered e.g. as shown:

Step 2700: encode content to be stored in the plurality of flash memory cells using an error correction code comprising a concatenation of an inner BCH code and an outer BCH code, thereby to define encoded content to be stored in the cells;

Step 2710: sample the encoded content thereby to generate codewords of bits.

Step 2720: estimate reliability of the sampling including generating a reliability score for each of the bits.

Step 2730: soft decode each of the codewords using the inner BCH code, thereby to generate soft decoded content including at least one preliminarily corrected codeword Step 2740: hard decode said soft decoded content, using said outer BCH code, thereby to generate reconstructed contents of cells.

Figure 31:
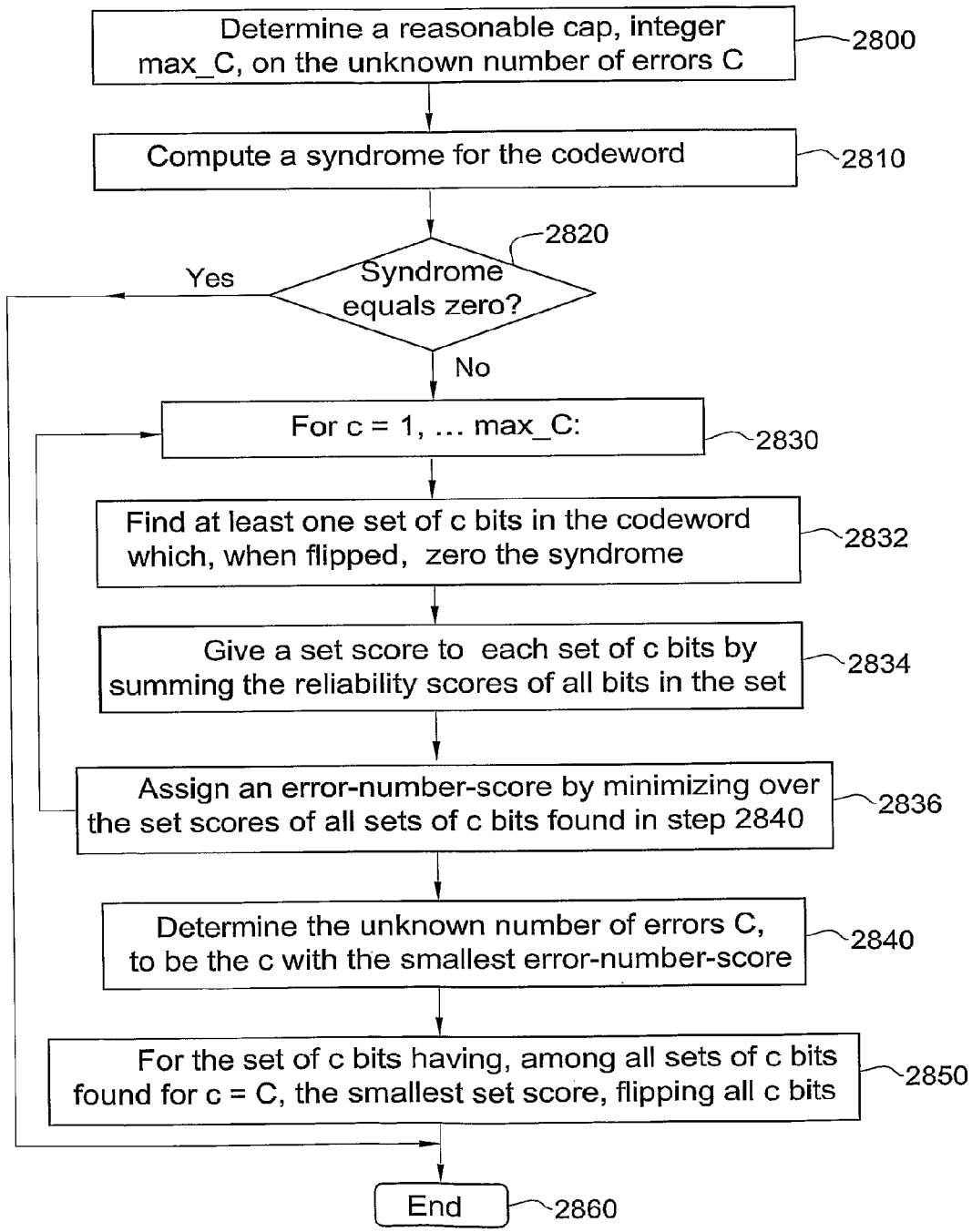
FIG. 31 is a simplified flowchart illustration of a method for performing the soft-decoding step 2730 of FIG. 30, which is operative in accordance with certain embodiments of the present invention.

FIG. 31 is a simplified flowchart illustration of a method for performing the soft-decoding step 2730 of FIG. 30, which is operative in accordance with certain embodiments of the present invention. The method of FIG. 31 typically comprises some or all of the following steps, suitably ordered e.g. as shown:

Step 2800: determine a reasonable cap, integer max_C, on the unknown number of errors C;
Step 2810: compute a syndrome for the codeword;
Step 2820: Decision: syndrome equals zero?
Step 2830: for c=1, . . . max_C:
 Step 2832: find at least one set of c bits in the codeword which, when flipped, zero the syndrome
 Step 2834: give a set score to each set of c bits by summing the reliability scores of all bits in the set
 Step 2836: assign an error-number-score by minimizing over the set scores of all sets of c bits found in step 2840
Step 2840: determine the unknown number of errors C, to be the c with the smallest error-number-score
Step 2850: for the set of c bits having, among all sets of c bits found for c=C, the smallest set score, flipping all c bits.

Generally, according to certain embodiments of the present invention, a decision to perform soft decoding need not only depend on actual or predicted unsuccessful termination of hard decoding. Alternatively or in addition, a decision to perform soft decoding may occur as a function of other partial hard decoding results such as but not limited to the following:

A) Soft decoding may be performed if it is found that there are many errors in the inner codes which build up a page. If the number of errors exceeds a certain predetermined threshold, decoding of the outer code may be skipped and the method may proceed directly to soft decoding.

B) Outer code decoding typically comprises 3 stages: Syndrome computation, error locator polynomial (ELP) computation and Chien search. However, if the second stage produces an error locator polynomial whose degree exceeds a certain predetermined threshold value, Chien search may be skipped and instead, the method may proceed directly to soft decoding.

It is appreciated that step 100 in FIGS. 8 and 9 comprises a hard read process and may employ the method of FIG. 21. Step 103 both in FIGS. 8 and 9 comprises a soft read process and may employ the method of FIG. 22. Step 204 in FIG. 10 comprises a soft read process and may employ the method of FIG. 22. Step 202 in FIG. 10 comprises a hard read process and may employ the method of FIG. 21. Step 610 in FIG. 14 comprises a hard read process followed by a portion of the total hard decoding task. Step 640 in FIG. 14 comprises a soft read process. Step 710 in FIG. 15 comprises a hard read process followed by a portion of the total hard decoding task. Step 740 in FIG. 15 comprises a soft read process. Step 810 in FIG. 16 comprises a hard read process and may employ the method of FIG. 21. Step 840 in FIG. 16 comprises Hard decoding or Soft decoding using available metrics, according to available read accuracy. Step 850 in FIG. 16 comprises a soft read process. Step 860 in FIG. 16 comprises soft decoding. It is also appreciated that the terms "Read1", "Read 2A" and "Read 3A" are used herein generally to indicate, respectively, a hard read operation, a first soft read operation, and a second soft read operation whose thresholds are finer than the first soft read operation. Finally, it is appreciated that the method of FIG. 21 can be used for any suitable set of reading thresholds, hence for any or all of Read1, Read 2A and Read 3A. The same is true for the method of FIG. 22, and for the method of FIG. 23.

It is appreciated that software components of the present invention including programs and data may, if desired, be implemented in ROM (read only memory) form including CD-ROMs, EPROMs and EEPROMs, or may be stored in any other suitable computer-readable medium such as but not limited to disks of various kinds, cards of various kinds and RAMs. Components described herein as software may, alternatively, be implemented wholly or partly in hardware, if desired, using conventional techniques.

Included in the scope of the present invention, inter alia, are electromagnetic signals carrying computer-readable instructions for performing any or all of the steps of any of the methods shown and described herein, in any suitable order; machine-readable instructions for performing any or all of the steps of any of the methods shown and described herein, in any suitable order; program storage devices readable by machine, tangibly embodying a program of instructions executable by the machine to perform any or all of the steps of any of the methods shown and described herein, in any suitable order; a computer program product comprising a computer useable medium having computer readable program code having embodied therein, and/or including computer readable program code for performing, any or all of the steps of any of the methods shown and described herein, in any suitable order; any technical effects brought about by any or all of the steps of any of the methods shown and described herein, when performed in any suitable order; any suitable apparatus or device or combination of such, programmed to perform, alone or in combination, any or all of the steps of any of the methods shown and described herein, in any suitable order; information storage devices or physical records, such as disks or hard drives, causing a computer or other device to be configured so as to carry out any or all of the steps of any of the methods shown and described herein, in any suitable order; a program pre-stored e.g. in memory or on an information network such as the Internet, before or after being downloaded, which embodies any or all of the steps of any of the methods shown and described herein, in any suitable order, and the method of uploading or downloading such, and a system including server's and/or client's for using such; and hardware which performs any or all of the steps of any of the methods shown and described herein, in any suitable order, either alone or in conjunction with software.

Certain operations are described herein as occurring in the microcontroller internal to a flash memory device. Such description is intended to include operations which may be performed by hardware which may be associated with the microcontroller such as peripheral hardware on a chip on which the microcontroller may reside. It is also appreciated that some or all of these operations, in any embodiment, may alternatively be performed by the external, host-flash memory device interface controller including operations which may be performed by hardware which may be associated with the interface controller such as peripheral hardware on a chip on which the interface controller may reside. Finally it is appreciated that the internal and external controllers may each physically reside on a single hardware device, or alternatively on several operatively associated hardware devices.

Any data described as being stored at a specific location in memory may alternatively be stored elsewhere, in conjunction with an indication of the location in memory with which the data is associated. For example, instead of storing page- or erase-sector-specific information within a specific page or erase sector, the same may be stored within the flash memory device's internal microcontroller or within a microcontroller interfacing between the flash memory device and the host, and an indication may be stored of the specific page or erase sector associated with the cells.

It is appreciated that the teachings of the present invention can, for example, be implemented by suitably modifying, or interfacing externally with, a flash controlling apparatus. The flash controlling apparatus controls a flash memory array and may comprise either a controller external to the flash array or a microcontroller on-board the flash array or otherwise incorporated therewithin. Examples of flash memory arrays include Samsung's K9XXG08UXM series, Hynix's HY27UK08BGFM Series, Micron's MT29F64G08TAAWP or other arrays such as but not limited to NOR or phase change memory. Examples of controllers which are external to the flash array they control include STMicroelectrocincs's ST7265x microcontroller family, STMicroelectrocincs's ST72681 microcontroller, and SMSC's USB97C242, Trasp an Technologies' TS-4811, Chip sbank CBM2090/CBM1190. Examples of commercial IP software for Flash file systems are: Denali's Spectra™ NAND Flash File System, Aarsan's NAND Flash Controller IP Core and Arasan's NAND Flash File System. It is appreciated that the flash controller apparatus need not be NAND-type and can alternatively, for example, be NOR-type or phase change memory-type.

A Flash controlling apparatus, whether external or internal to the controlled flash array, typically includes the following components: a Memory Management/File system, a NAND interface (or other flash memory array interface), a Host Interface (USB, SD or other), error correction circuitry (ECC) typically comprising an Encoder and matching decoder, and a control system managing all of the above.

The present invention may for example interface with or modify, as per any of the embodiments described herein, one, some or all of the above components and particularly the ECC and NAND interface components. The NAND interface component, or a functional unit interacting therewith, is, according to certain embodiments of the present invention, operative to read both soft and hard information.

Features of the present invention which are described in the context of separate embodiments may also be provided in combination in a single embodiment. Conversely, features of the invention, including method steps, which are described for brevity in the context of a single embodiment or in a certain order may be provided separately or in any suitable subcombination or in a different order. "e.g." is used herein in the sense of a specific example which is not intended to be limiting.

The scope of the present invention includes but is not limited to the embodiments specifically claimed below:

We claim:

1. A method for decoding a plurality of flash memory cells which are error-correction-coded, the method comprising: providing a hard-decoding success indication indicating whether or not hard-decoding is at least likely to be successful; and soft-decoding the plurality of flash memory cells at a first resolution only if the hard-decoding success indication indicates that the hard-decoding is not at least likely to be successful; wherein said hard-decoding success indication comprises an a priori indication of whether or not hard-decoding yet to be performed, is at least likely to be successful; wherein said a priori indication is based on at least one indication of the quality of the flash memory cells; wherein said indication of the quality of the flash memory cells is based at least partly on a comparison of at least a statistic representing the current state of a sample of said plurality of flash memory cells with a reliably stored indication of a previous state of said sample.

2. The method according to claim 1 wherein said statistic comprises an indication of the distribution width of the current physical values of said sample and said indication of a previous state comprises an indication of the distribution width of previous physical values of said sample.

3. The method according to claim 1 wherein said statistic comprises a mean of the current physical values of said sample and said indication of a previous state comprises a mean of previous physical values of said sample.

4. A method for reading Flash memory apparatus having c cells using an increasing sequence of B−1 thresholds defining a sequence of B bins, the method comprising: providing at least one buffer operative to store information indicating whether or not each individual cell from among the c cells is "done" and indicating an individual one of said B bins which is associated with each individual cell from among said c cells; and for each individual threshold, in order, in the increasing sequence of B−1 thresholds: comparing all cells in a c-cell flash memory physical page to said individual threshold in said sequence thereby to obtain an "above" or "below" value for each said cell; and for each "first below" cell, defined as a cell which yields a "below" value and is "not done", modifying said at least one buffer to indicate that said "first below" cell is "done" and to indicate that said "first below" cell is associated with a bin in said sequence of bins which is just below said individual threshold.

5. The method according to claim 4 wherein said at least one buffer comprises a label buffer array storing c labels, each label indicating an individual state from among B+1 states which is associated with an individual cell from among said c cells, the B+1 states including B states indicating that said individual cell is "done" and respectively indicating an individual one of said B bins which is associated with said individual cell and a (B+1)th state indicating that said individual cell is "not done", said label buffer array being initialized to the (B+1)th state.

6. The method according to claim 5 wherein said modifying comprises: for each "first below" cell which yields a "below" value and has a "not done" value in the "done" buffer, modifying said "done" buffer to indicate that said "first below" cell is "done" and modifying said label buffer array to indicate that said "first below" cell is associated with a bin in said sequence of bins which is just below said individual threshold.

7. The method according to claim 6 and also comprising modifying said label buffer array to indicate that all remaining cells, if any, therewithin, are associated with the last bin in said sequence of bins, said remaining cells being defined as cells which do not yield a "below" value when the last threshold in said increasing sequence of B−1 thresholds is used in said comparing.

8. The method according to claim 5 wherein said modifying comprises: for each "first below" cell, defined as a cell which yields a "below" value and is "not done", modifying said at least one buffer to indicate an ID of the bin in said sequence of bins which is just below said individual threshold.

9. The method according to claim 4 wherein said at least one buffer comprises: a "done" buffer storing c "done" bits indicating whether an individual cell c is "done" or "not done", said buffer initially being set entirely to "not done".

10. The method according to claim 9 wherein said at least one buffer also comprises a label buffer array storing c N-bit labels, each label indicating an individual one of said B bins which is associated with an individual cell from among said c cells, said label buffer array being initialized to values which differ from all labels of the first B−1 bins in said sequence of bins.

11. The method according to claim 10 wherein said modifying comprises: for each "first below" cell which yields a "below" value and has a "not done" value in the "done" buffer, modifying said "done" buffer to indicate that said "first below" cell is "done"; and modifying said label buffer array to indicate that said "first below" cell is associated with a bin in said sequence of bins which is just below said individual threshold.

12. The method according to claim 4 wherein each of said cells stores L bits comprising one bit each from L logical pages (L>1).

13. A system for reading Flash memory apparatus having c cells using an increasing sequence of B−1 thresholds defining a sequence of B bins, the system comprising: at least one buffer operative to store information indicating whether or not each individual cell from among the c cells is "done" and indicating an individual one of said B bins which is associated with each individual cell from among said c cells; and "first below" cell based buffer updating apparatus operative, for each individual threshold, in order, in the increasing sequence of B−1 thresholds, to compare all cells in a c-cell flash memory physical page to said individual threshold in said sequence thereby to obtain an "above" or "below" value for each said cell; and for each "first below" cell, defined as a cell which yields a "below" value and is "not done", to modify said at least one buffer to indicate that said "first below" cell is "done" and to indicate that said "first below" cell is associated with a bin in said sequence of bins which is just below said individual threshold.

14. The system according to claim 13 wherein said at least one buffer comprises a label buffer array storing c labels, each label indicating an individual state from among B+1 states which is associated with an individual cell from among said c cells, the B+1 states including B states indicating that said individual cell is "done" and respectively indicating an individual one of said B bins which is associated with said individual cell and a (B+1)th state indicating that said individual cell is "not done", said label buffer array being initialized to the (B+1)th state.

15. The system according to claim 13 wherein said at least one buffer comprises: a "done" buffer storing c "done" bits indicating whether an individual cell c is "done" or "not done", said buffer initially being set entirely to "not done"; and a label buffer array storing c N-bit labels, each label indicating an individual one of said B bins which is associated with an individual cell from among said c cells, said label buffer array being initialized to values which differ from all labels of the first B−1 bins in said sequence of bins.

16. A method for error-correction encoding and subsequently decoding a plurality of flash memory cells, the method comprising: encoding content to be stored in the plurality of flash memory cells using an error correction code comprising a concatenation of an inner BCH code and an outer BCH code, thereby to define encoded content to be stored in the cells; sampling said encoded content thereby to generate codewords of bits; estimating reliability of said sampling including generating a reliability score for each of said bits; soft decoding each of said codewords using said inner BCH code, thereby to generate soft decoded content including at least one preliminarily corrected codeword; and hard decoding said soft decoded content, using said outer BCH code, thereby to generate reconstructed contents of said cells.

17. The method according to claim 16 wherein said inner BCH code has a Minimum Distance value of 3.

18. The method according to claim 16 wherein said soft decoding comprises, for each codeword which suffers from an unknown number of errors: determining a reasonable cap, integer max_C, on the unknown number of errors C; computing a syndrome for the codeword; unless the syndrome equals zero, for c=1, . . . max_C: finding at least one set of c bits in the codeword which, when flipped, zero the syndrome; giving a set score to each set of c bits by summing the reliability scores of all bits in said set; and assigning an error-number-score by minimizing over the set scores of all sets of c bits found in said finding step; determining said unknown number of errors C, to be the c with the smallest error-number-score; and for the set of c bits having, among all sets of c bits found for c=C, the smallest set score, flipping all c bits.

19. The method according to claim 18 wherein said set finding step comprises searching for at least one bit defining at least one set of c bits, only within a subset of the bits in said codeword which have lower reliability scores than the bits in said codeword which do not belong to said subset.

20. The method according to claim 19 wherein said searching is performed from the bit whose reliability score is smallest and onward to bits whose reliability scores are larger and larger, and wherein said searching is terminated, when a bit is reached whose reliability score exceeds the error number score of a previous c value.

* * * * *